United States Patent
Garmong

(10) Patent No.: US 7,385,147 B2
(45) Date of Patent: Jun. 10, 2008

(54) ARTICULATED MAST

(75) Inventor: Victor H. Garmong, Kennerdell, PA (US)

(73) Assignee: Pioneer Energy Products, LLC, Franklin, PA (US)

( * ) Notice: Subject to any disclaimer, the term of this patent is extended or adjusted under 35 U.S.C. 154(b) by 304 days.

(21) Appl. No.: 10/699,998

(22) Filed: Nov. 3, 2003

(65) Prior Publication Data

US 2007/0002547 A1    Jan. 4, 2007

Related U.S. Application Data

(63) Continuation-in-part of application No. 10/098,006, filed on Mar. 13, 2002, now Pat. No. 7,046,521.

(51) Int. Cl.
 *H01R 4/00* (2006.01)
 *H01Q 1/08* (2006.01)
(52) U.S. Cl. ..................... 174/364; 174/380; 343/881; 343/888
(58) Field of Classification Search ................ 343/874, 343/875, 882, 881, 888; 174/364, 380; 361/816, 818, 800
See application file for complete search history.

(56) References Cited

U.S. PATENT DOCUMENTS

| | | | |
|---|---|---|---|
| 3,440,659 A | 4/1969 | Kreitzberg | |
| 3,873,135 A | 3/1975 | Kreitzberg | |
| 4,460,895 A * | 7/1984 | Bert et al. | 343/713 |
| 4,651,099 A | 3/1987 | Vinegar et al. | |
| 4,709,120 A | 11/1987 | Pearson | |
| 4,755,630 A | 7/1988 | Smith et al. | |
| 4,806,703 A | 2/1989 | Sims | |
| 5,235,133 A | 8/1993 | Roth et al. | |
| 5,315,794 A | 5/1994 | Pearson | |
| 5,401,901 A | 3/1995 | Gerry et al. | |
| 5,452,550 A | 9/1995 | Vanesky et al. | |
| 5,487,247 A | 1/1996 | Pigg | |
| 5,522,194 A | 6/1996 | Graulich | |
| 5,545,844 A | 8/1996 | Plummer, III et al. | |
| 5,560,150 A | 10/1996 | Pearson | |
| 5,603,196 A | 2/1997 | Sohlstrom | |
| 5,749,178 A | 5/1998 | Garmong | |

(Continued)

FOREIGN PATENT DOCUMENTS

WO    WO 01/77538 A1    10/2001

OTHER PUBLICATIONS

"EMI, RFI, Lightning Protection", Brochure, Pepro.

(Continued)

*Primary Examiner*—Hung V Ngo
(74) *Attorney, Agent, or Firm*—Kirkpatrick & Lockhart Preston Gates Ellis LLP

(57) ABSTRACT

Apparatus for housing electrically powered components to protect such components from damage and interference caused by lightning strikes and other externally generated magnetic fields. On embodiment includes a shielded enclosure mounted on an electrically groundable platform mounted on legs. An extendable and retractable mast is disclosed and may be supported on the platform and electrically grounded thereto. In another embodiment, the platform is portable and the shielded enclosures may be mounted to the electrically groundable platform by shock absorbers and be electrically grounded thereto. Adjustable outriggers may also be mounted to the platform.

78 Claims, 44 Drawing Sheets

U.S. PATENT DOCUMENTS

| | | | |
|---|---|---|---|
| 5,966,104 A * | 10/1999 | Massey et al. | 343/915 |
| 6,204,824 B1 * | 3/2001 | Davi et al. | 343/803 |
| 6,320,123 B1 | 11/2001 | Reimers | |
| 7,046,521 B2 | 5/2006 | Garmong | |
| 2003/0146181 A1 * | 8/2003 | Taylor et al. | 212/299 |
| 2006/0021784 A1 | 2/2006 | Garmong | |

OTHER PUBLICATIONS

"Lightning/EMP", Catalog, PolyPhaser Corp., Oct. 20, 1995.
"Striking News", Newsletter, PolyPhaser Corp.,Nov. 1995.
"What is Shielding", portion of booklet, Westinghouse Electric Co.
"Uni-Kit 2", brochure, PolyPhaser Corp.
PolyPhaser Earthed Entrance Panels; brochure, Polyphaser Corp.
"Structoglas", brochure, Sequentia Inc., Feb. 1995.
"N Connectors", Installation Instructions, Andrew Corp., 2000.
"Alloy Data", brochure, Carpenter Technology,1996.
U.S. Appl. No. 10/098,006, Garmong.
5 pages of Uni-screw Brochure , published by BRTW5 British Technology Worldwide, Berkshire, United Kingdom, Publication date believed to be before Mar. 13, 2002.

* cited by examiner

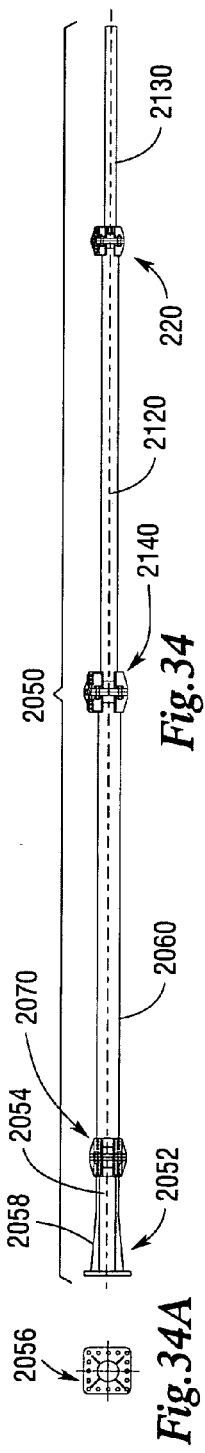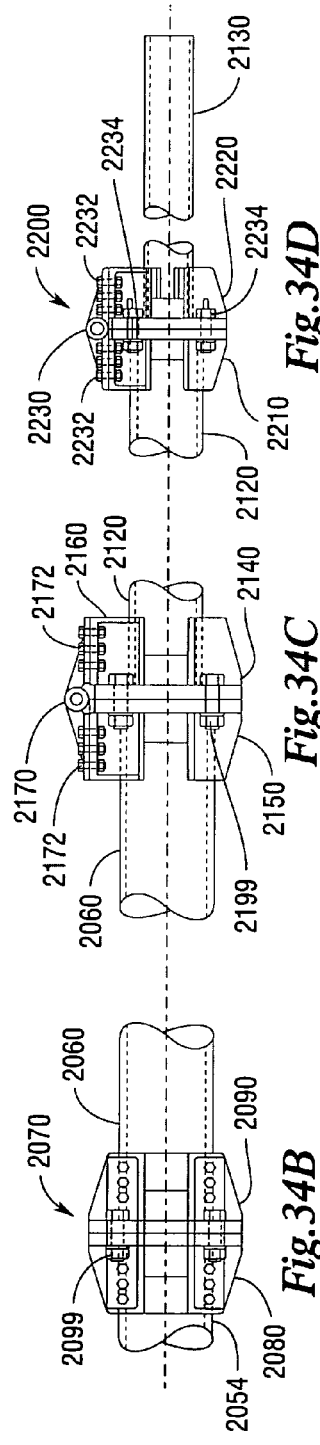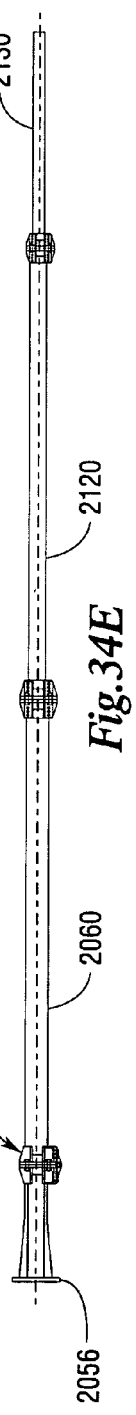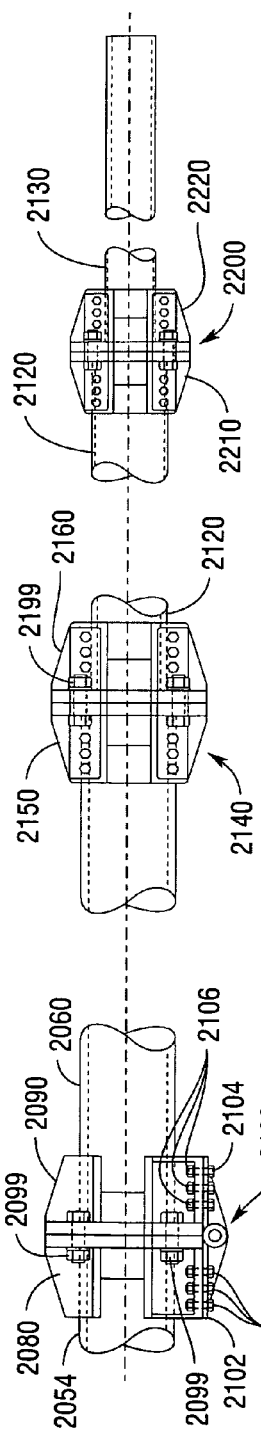

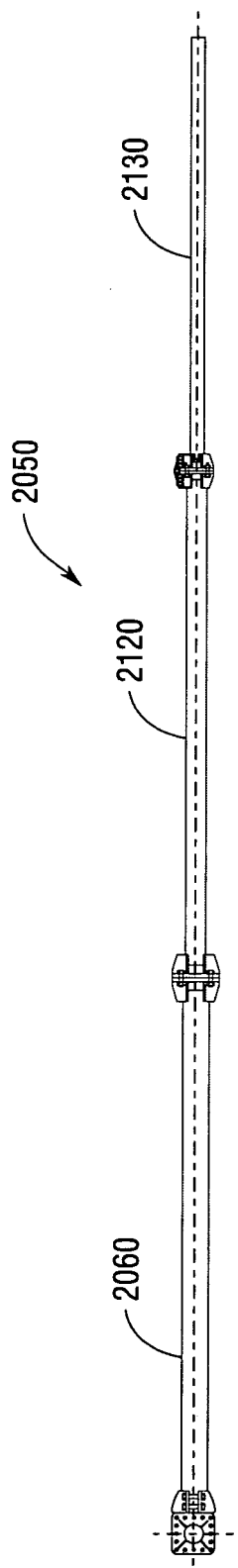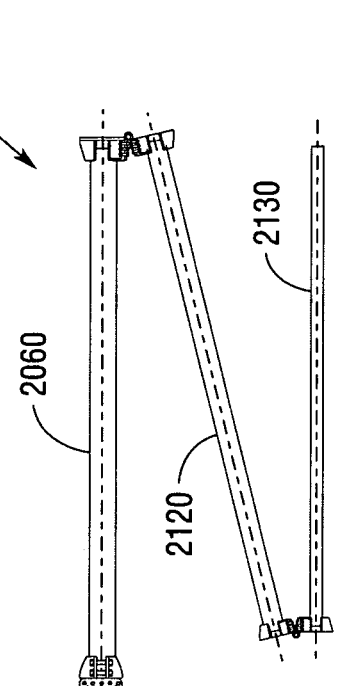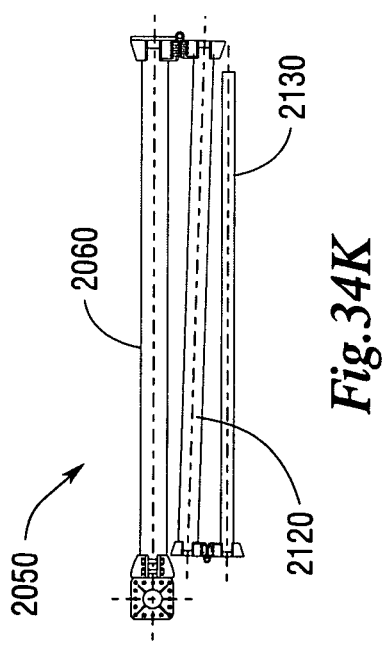
Fig.34I
Fig.34J
Fig.34K

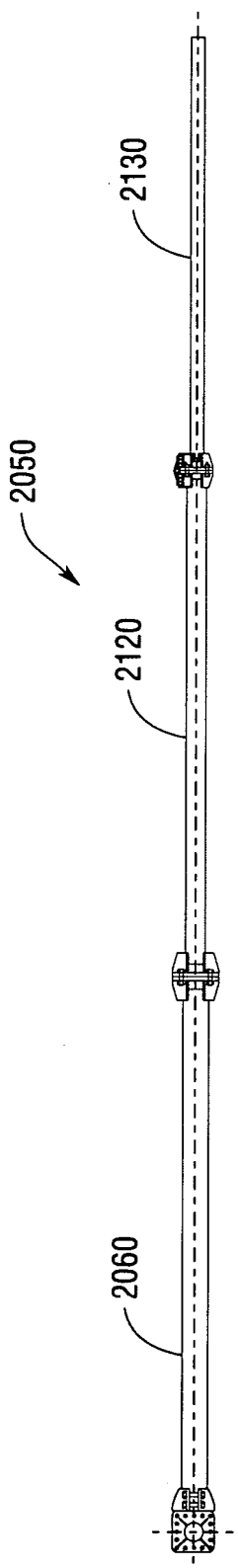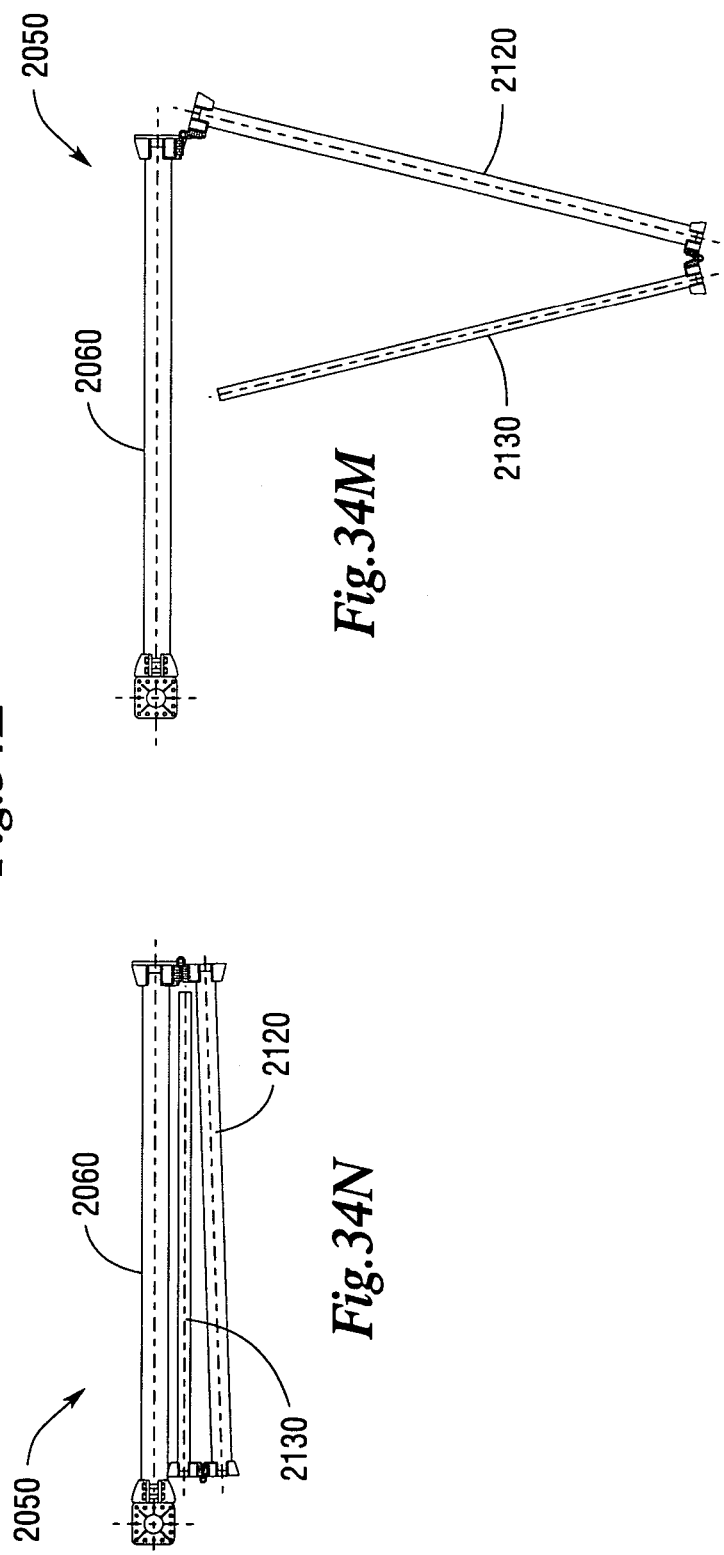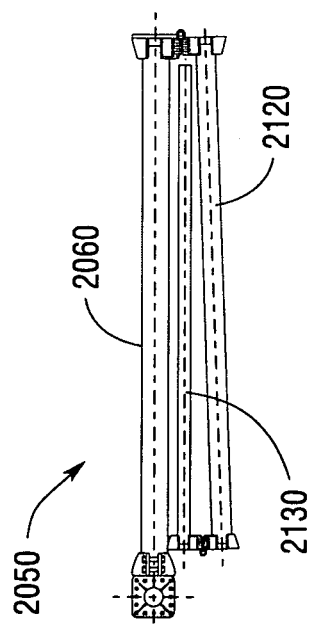

ARTICULATED MAST

CROSS-REFERENCE TO RELATED APPLICATIONS

The subject application is a continuation-in-part application of U.S. patent application Ser. No. 10/098,006, filed Mar. 13, 2002 now U.S. Pat. No. 7,046,521, entitled Enclosure With Shielded Power Compartment and Methods of Shielding Enclosures, the disclosure of which is herein incorporated by reference.

BACKGROUND OF THE INVENTION

1. Field of the Invention

The invention relates to shielded enclosures and, more particularly, is directed to shielded enclosures and extendable masts constructed to protect electrical and electronic equipment from damage caused by electromagnetic fields created by lightning strikes and other electrical or electronic equipment or sabotage.

2. Description of the Invention Background

Perhaps when one thinks of the discovery of electricity, various depictions of Benjamin Franklin flying his infamous kite in a lightning storm come to mind. While history is somewhat ambiguous as to exactly what role Franklin's observation of lightning played in the discovery of electricity and the subsequent invention of the myriad of electronic devices that we use in our every day life, man still struggles to harness and control its power.

A lightning strike starts with a "local" electrical breakdown of the atmosphere. Typically, the lightning "steps down" toward the earth about 150 feet in one micro-second time increments every 49 micro-seconds. During each of the 49 micro-second dormant stages, an imaginary hemisphere having a radius of 150 feet can be used to determine the next jumping distance. Any object such as a tower, building, tree, etc. which penetrates this hemisphere, can be chosen as the point of attachment for the return stroke (i.e., the lightning strike).

When lightning strikes an object, it generally takes the path of least resistance to the ground and, if that path happens to pass through a circuit that includes electrical/electronic components incapable of accommodating such a surge of electrical current, those components may be damaged or destroyed. For example, many people have had electrical devices such as televisions, VCRs, computers, etc. damaged by a lightning strike or probably know someone that has experienced such damage.

Over the years, a variety of different devices and methods have been developed to prevent electrical component damage caused by a lightning strike. Examples of such devices are fuses, circuit breakers, surge protectors, etc. Another device commonly used to protect electronic equipment from lightning strike damage is known as a lightning arrester which reduces excessive voltage resulting from lightning to a safe level by "grounding" the discharge.

"Ground" is the term used to describe the common connection in an electrical or electronic circuit. The common connection for electronic circuits is almost always ultimately routed to the earth. The earth is a fair to good conductor of electricity depending upon the characteristics of the soil. A ground connection is the electrical contact between the common point of an electrical or electronic system and the earth. Effective grounding systems typically include one or more ground rods driven into the soil to a depth of 6 to 8 feet. Other common grounding methods involve establishing a ground connection with a structure's cold water pipe. Thus, some circuit protection apparatuses and methods serve to provide a deliberate and controlled path for the electrical energy resulting from a lightning strike to return to ground.

While the above-mentioned apparatuses and practices serve to protect electrical components from surges of electrical energy caused by lightning strikes, lightning can cause other problems which require different solutions. For example, as the electromagnetic field, created by a "nearby" lightning strike passes through electrical/electronic components, voltages and/or currents are generated that may cause permanent damage to the components. In the past, to protect electrical/electronic components from such damage, each individual component was housed within its own enclosure fabricated from a material that is capable of attenuating electromagnetic effects by providing a low-reluctance path for magnetic lines of force and a closed conductive shell for electric lines of force. Because such material can be relatively expensive, the ability to protect numerous components with their own individual enclosures can be cost prohibitive. Also, in some cases, a single shield will reach saturation magnetization because of high-flux density magnetic fields, which reduces the effectiveness of the shield. That problem has been addressed by increasing the thickness of the shield material or by nesting a number of thinner shields together. Either method, however, can be very expensive when numerous electrical/electronic components must be shielded.

Perhaps the industry that has been most plagued with problems associated with lightning strikes is the natural gas industry. Today, the natural gas industry typically utilizes very sophisticated electronic equipment for monitoring and recording the output of gas wells and the purchase and resale of natural gas in the transmission and distribution systems. Usually such equipment is housed within an enclosure or building at the well site or pipeline. In remote locations, such equipment may communicate, via satellite, with computers and other equipment located at the gas company's offices.

In the past, gas companies have enclosed their gas well and pipeline equipment in makeshift buildings fabricated from various materials such as, for example, fiberglass, plastic, cement blocks, corrugated steel, etc. All of those materials generally have poor grounding capabilities in addition to various other shortcomings. For example, while buildings and enclosures fabricated from plastic and/or fiberglass do not experience corrosion problems and are generally easy to erect and transport, they are susceptible to pest and vermin damage. Such enclosures also fail to shield equipment from electromagnetic fields. Likewise, while enclosures fabricated from concrete blocks are generally impervious to vermin and pests, they are difficult to transport and usually must be constructed on site. Such buildings also offer little protection from electromagnetic fields. Enclosures and buildings fabricated from corrugated steel are generally easy to erect, but are susceptible to corrosion and vermin damage while providing little protection from electromagnetic fields.

The problems associated with lightning strikes and the electrical/electronic component damage caused by the electrical and magnetic energy created thereby are not unique to the natural gas industry, however. These problems are encountered in a variety of other industries and applications where electrical/electronic components are susceptible to lightning damage. U.S. Pat. No. 5,749,178, the disclosure of which is herein incorporated by reference, discloses a shielded enclosure that solves many of such problems.

Also, electronic equipment that is vital to an area's telecommunication and utility services may be susceptible to radio frequency and electromagnetic interference caused by adjacent equipment or even caused by sabotage if it is unshielded.

In addition, microprocessor based equipment such as variable frequency drives and computer controlled equipment used within manufacturing plants may be susceptible to such electromagnetic interference.

Furthermore, there is often a need for portable communication and other electronic equipment that can be used in remote locations while being protected from debilitating damage resulting from lightening strikes. For example, when fighting forest fires in remote locations, firefighting personnel often require the use of electronic communication equipment that, if left unprotected, could be damaged by lightening. Such equipment, due to the remote location in which it is needed, often requires the use of antennas to enable signals to be sent and received. Such antennas tend to attract lightning strikes which can damage the communication equipment and render it inoperable. Such problems, however, are not confined to firefighting. These problems may also be encountered in other settings wherein emergency personnel are responding to disasters and other problems. Moreover, similar problems could encountered by the military.

Thus, there is a need for shielded enclosures that are economical to manufacture and use to prevent equipment from damage caused by electromagnetic fields be it naturally or artificially generated.

There is a further need for a shielded enclosure that may be used in conjunction with an antenna mast without risking damage to electronic components within the enclosure resulting from electrical energy such as the electrical energy generated by lightening.

Yet another need exists for shielded enclosures and masts that have one or more of the above-mentioned attributes and that are readily portable.

SUMMARY

One embodiment of the invention comprises portable apparatus for housing electrically powered components. This embodiment includes an electrically groundable portable platform and a shell supported on the portable platform. The shell is electrically grounded to the platform. The shell has a plurality of exterior wall portions and houses the electrically powered components therein. The shell may be fabricated from electrically conductive material. This embodiment further includes an enclosure having a common exterior wall portion with the shell and is attached thereto. The common exterior wall portion is lined with a magnetic shield material. At least one power supply cable enters the enclosure through the common exterior wall portion and the magnetic shield material. This embodiment may also include a selectively extendable and retractable mast that is supported on the platform and electrically grounded thereto. The legs of the platform may be selectively extendable and retractable in the vertical direction and also selectively extendable and retractable relative to the platform in a lateral direction. Power generating equipment such as generators, batteries, solar panels, fuel cells, etc. may be mounted to the platform.

Another embodiment of the present invention may comprise portable apparatus for housing electrically powered components and include a portable platform that is electrically groundable. The portable apparatus may further include an equipment module fabricated from electrically conductive material and which is electrically grounded to the portable platform. The equipment module houses the electrically powered components therein. In addition, a power module fabricated from electrically conductive material is attached to the equipment module. The power module has a plurality of walls wherein at least one wall is lined with magnetic shield material. At least one power supply cable enters the power module and is coupled to at least one terminal block in one of the walls lined with magnetic shield material. At least one other cable attached to the terminal block and at least one of the electrically powered components supported within the equipment module. This embodiment also includes an articulated mast that is electrically grounded to the portable platform. An antenna conductor is supported on the articulated mast and enters the equipment module to be coupled to a component housed therein.

Yet another embodiment of the present invention comprises an articulated mast that includes a base member and at least two pivotally interconnected mast segments in series that are supported by the mast base. The pivotally interconnected mast segments are selectively pivotable between a position wherein the mast segments are coaxially aligned and positions wherein the mast segments are not coaxially aligned.

Still another embodiment of the present invention may comprise apparatus for housing electrically powered components. The apparatus includes an electrically groundable platform that has a plurality of legs attached thereto. A shell is supported on the platform and is electrically grounded thereto. The shell has a plurality of exterior wall portions and houses the electrically powered components therein. The shell is fabricated from electrically conductive material. The apparatus also includes an enclosure that has a common exterior wall portion with the shell and is attached thereto. The common exterior wall portion is lined with a magnetic shield material. The apparatus also includes at least one power supply cable entering the enclosure through the common exterior wall portion and the magnetic shield material. This embodiment may also include a selectively extendable and retractable mast that is support on the platform and electrically grounded thereto. The legs of the platform may be selectively extendable and retractable in the vertical direction and also selectively extendable and retractable relative to the platform in a lateral direction. Power generating equipment such as generators, batteries, solar panels, fuel cells, etc. may be mounted to the platform.

Another embodiment of the present invention may comprise a method of fabricating a shielded enclosure for housing electrically powered components therein. The method may include forming a shell having walls, a floor and a roof out of electrically conductive material and supporting the shell on an electrically groundable platform. The method further includes electrically grounding the shell to the portable platform and orienting a magnetic shield material adjacent at least one, but not all of the walls of the shell. A power cable is passed through one of the shell walls that has the magnetic shield material oriented adjacent thereto, such that the power cable passes through the adjacent magnetic shield material into the shell. The power cable is coupled to the equipment within the shell and the platform is grounded.

BRIEF DESCRIPTION OF THE DRAWINGS

In the accompanying Figures, there are shown present embodiments of the invention wherein like reference numerals are employed to designate like parts and wherein:

FIG. 34 is a side view of an articulated antenna embodiment of the present invention in an extended position;

FIG. 34A is an end view of the antenna of FIG. 34;

FIG. 34B is an enlarged partial view of a first articulated joint of the antenna depicted in FIG. 34;

FIG. 34C is an enlarged partial view of a second articulated joint of the antenna depicted in FIG. 34;

FIG. 34D is an enlarged partial view of a third articulated joint of the antenna depicted in FIG. 34;

FIG. 34E is another side view of the articulated antenna embodiment of FIG. 34;

FIG. 34F is another enlarged partial view of the first articulated joint of the antenna depicted in FIG. 34E;

FIG. 34G is another enlarged partial view of the second articulated joint of the antenna depicted in FIG. 34E;

FIG. 34H is another enlarged partial view of the third articulated joint of the antenna depicted in FIG. 34E;

FIG. 34I illustrates one extendable and retractable mast embodiment of the present invention in an extended position;

FIG. 34J illustrates the extendable and retractable mast embodiment of FIG. 34I in an intermediate folded position;

FIG. 34K illustrates the extendable and retractable mast of FIGS. 34I and 34J in a folded position;

FIG. 34L illustrates another extendable and retractable mast embodiment of the present invention in an extended position;

FIG. 34M illustrates the extendable and retractable mast embodiment of FIG. 34L in an intermediate folded position;

FIG. 34N illustrates the extendable and retractable mast of FIGS. 34L and 34M in a folded position;

DETAILED DESCRIPTION OF THE INVENTION

Figure 1:
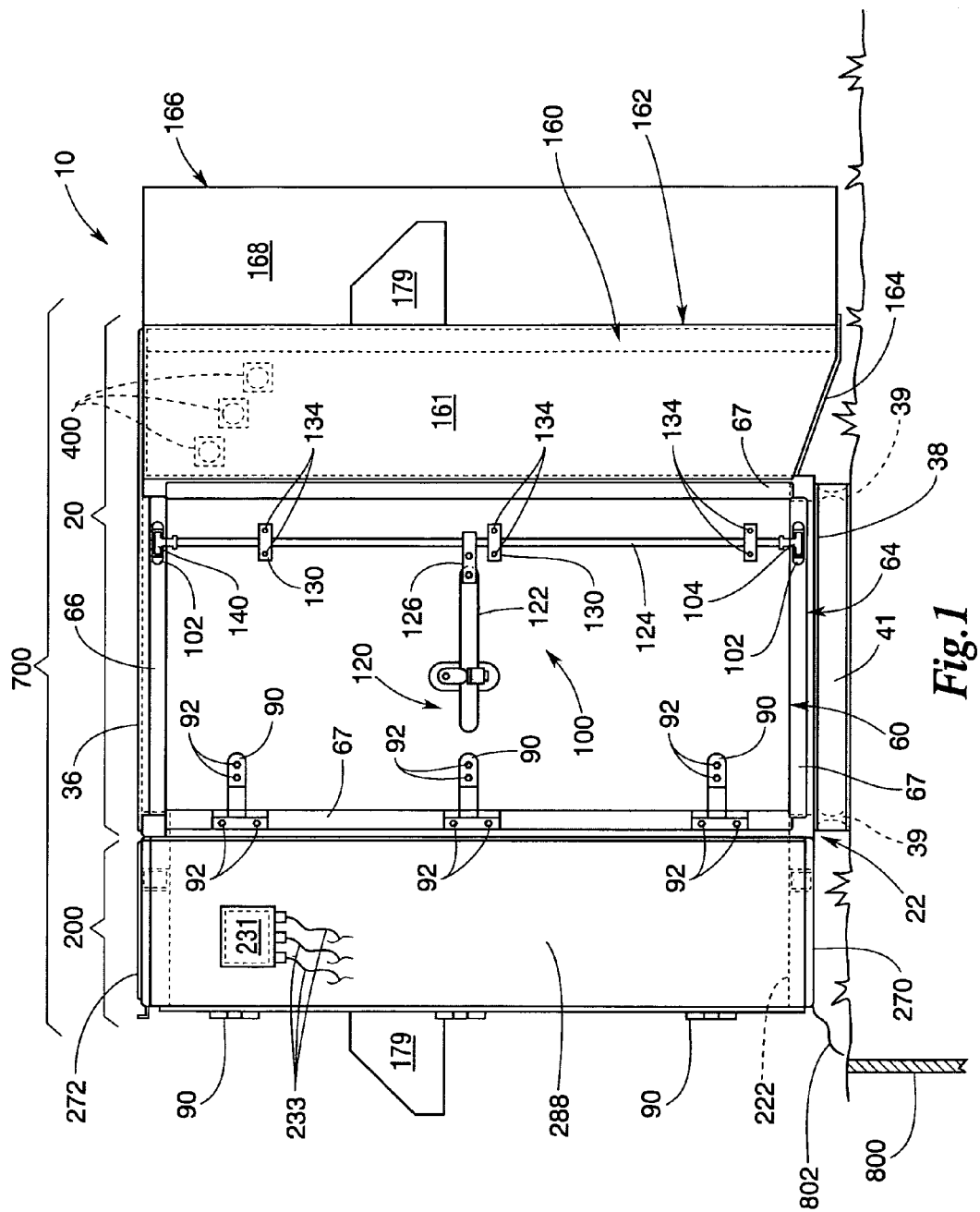
FIG. 1 is a side elevational view of one embodiment of an enclosure of the present invention.
Figure 2:
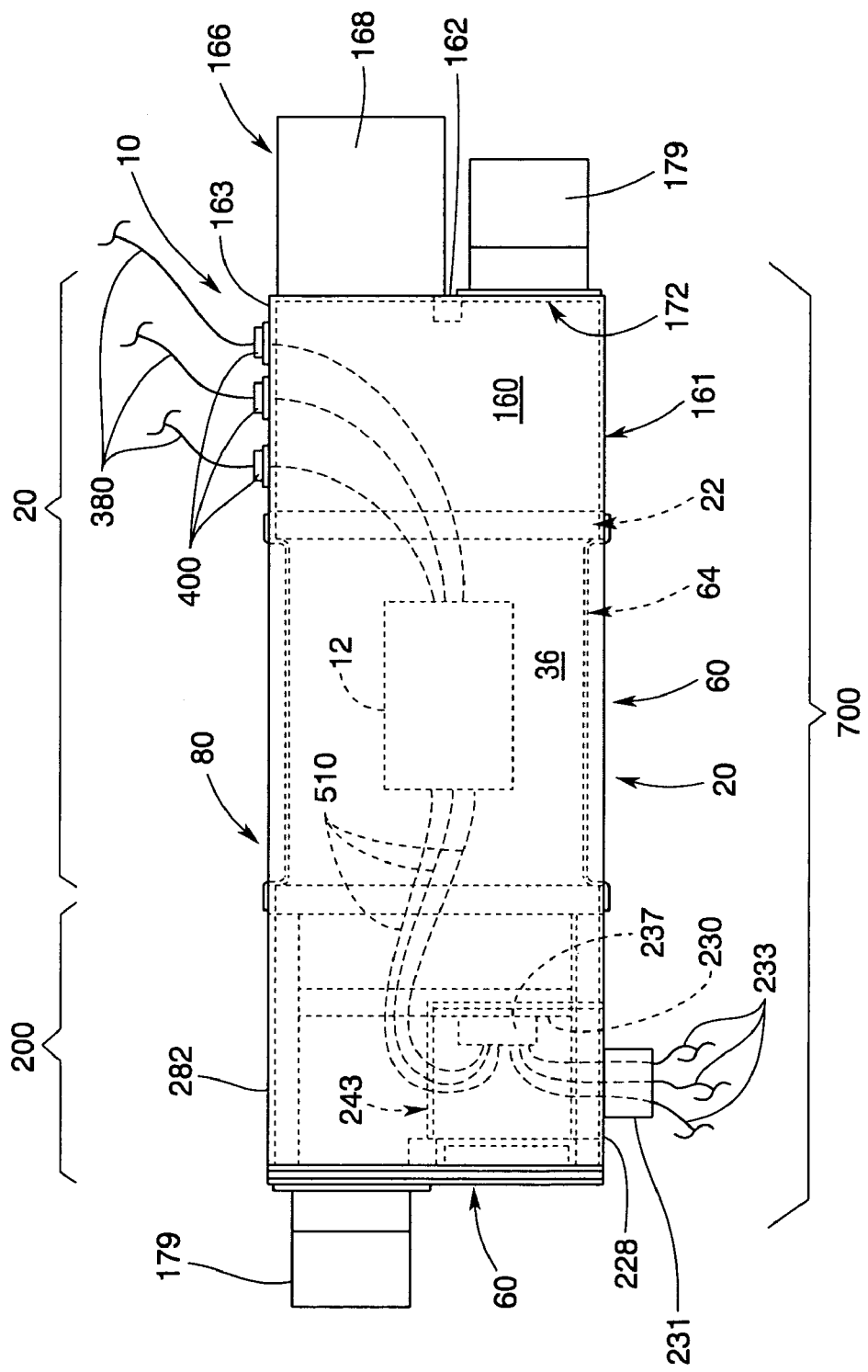
FIG. 2 is a top view of the enclosure depicted in FIG. 1.

Referring now to the drawings for the purposes of illustrating embodiments of the invention only and not for purposes of limiting the same, FIGS. 1 and 2 show one embodiment of a building enclosure generally designated as 10 that is adapted to house various types of electrical and other equipment 12 therein. Such equipment could comprise, for example, computers, transmitters, electronic meters, recorders, receivers, cellular telephone equipment, junction boxes, etc. While this embodiment may be well adapted for housing electrical equipment located at remote locations such as natural gas wells, the skilled artisan will readily appreciate that the novel features of this embodiment can be employed to protect/shield a variety of different electrical components regardless of their location and application. Thus, the scope of protection afforded to the subject invention should not be limited to enclosures for protecting/housing electrical equipment located at natural gas wells and pipelines.

More particularly and with reference to FIGS. 1 and 2, there is shown an embodiment of an enclosure 10 that has an equipment module 20 and a power module 200. As the present Detailed Description proceeds, the reader will appreciate that the novel apparatuses, arrangements, and manufacturing methods of the present invention may be successfully employed to construct a variety of different enclosure configurations without departing from the spirit and scope of the present invention.

Figure 3:
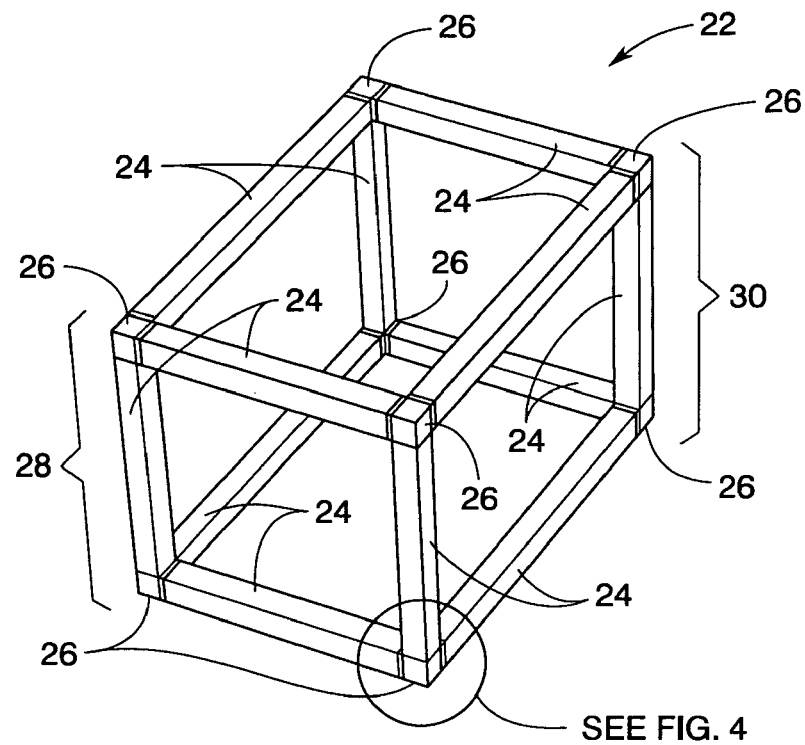
FIG. 3 is a perspective view of one embodiment of a frame assembly for an equipment module of one embodiment of the present invention.
Figure 4:
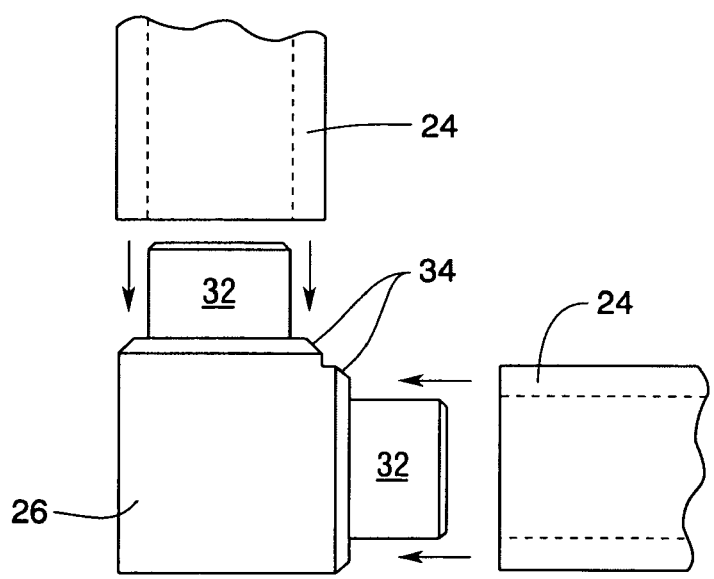
FIG. 4 is a partial top exploded assembly view of a portion of the frame assembly of FIG. 3.

In one embodiment, the equipment module 20 may house the electrical and other equipment, 12 therein and be fabricated utilizing unique modular construction techniques and methods. In particular, the equipment module 20 may have a frame assembly 22 that is fabricated from hollow tubular braces 24 that are interconnected to cornerblocks 26. As can be seen in FIG. 3, the frame assembly may include two end assemblies 28 and 30 that are interconnected by tubular braces 24. FIG. 4 illustrates one type of corner block 26 that may be cast or machined from an electrically conductive material such as aluminum or the like. Each corner block 26 may have one or more attachment posts 32 protruding therefrom which are each sized to be inserted into the hollow end of a corresponding hollow tubular brace 24. The hollow tubular braces 24 may also be fabricated from electrically conductive material such as aluminum or a similar material and they may be welded to the corresponding cornerblocks 26 to form an overall frame assembly generally designated as 22. It is conceivable, however, that the tubular braces 24 may be attached to the cornerblocks 26 by other suitable means. However, in this embodiment, to facilitate attachment of the tubular members 24 to the cornerblocks 26 by welding, a chamfered surface 34 may be provided adjacent each post 32 for receiving weld material therein. See FIG. 4.

This embodiment of the equipment module 20 also has a roof 36, a floor 38 and at least one door entry 60. The roof 36 and the floor 38 of the equipment module may be formed from electrically conductive material such as 3/16" aluminum plate or other suitable material that is welded to the frame assembly 22 as shown in FIGS. 1 and 2. Those of ordinary skill in the art will appreciate that such construction arrangement results in a shell 700 that has no fastener holes therethrough which may detrimentally affect the shielding properties of the enclosure 10. The frame assembly 22 may be supported on the ground or other surface by I-beams 39 and or channels that are welded or otherwise attached to the bottom portions of the frame assembly 22 and/or the floor 38 as shown in FIG. 1. A face channel 41 may be attached to the front ends of the I-beams 39 by welding or other suitable means and a second face channel 41 may be attached to the rear ends of the I-beams 39. The I-beams 39 and face channels 41 may be fabricated from electrically conductive material such as, for example, aluminum material.

Figure 5:
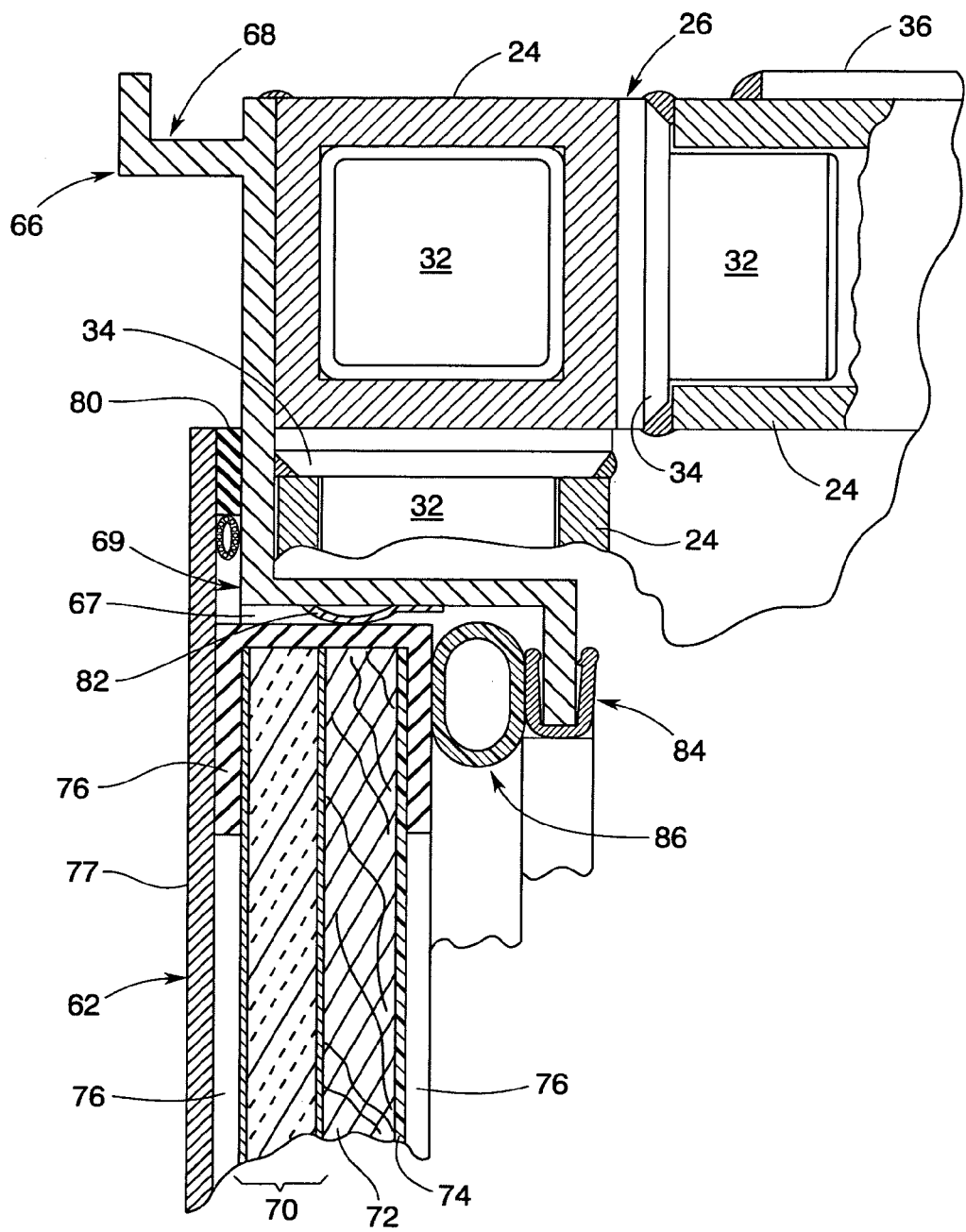
FIG. 5 is a partial cross-sectional view of a top of a door entry of one embodiment of the present invention.
Figure 6:
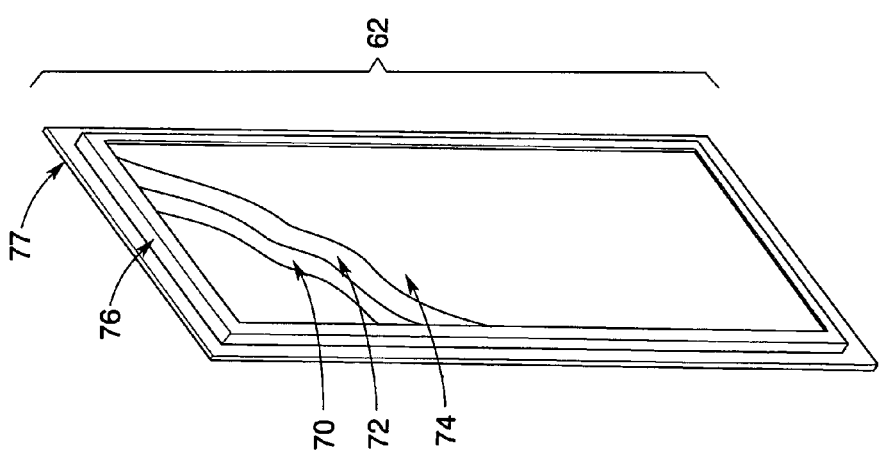
FIG. 6 is a perspective interior view of one door embodiment of the present invention.

To provide access into the equipment module 20, one or more door entries 60 may be provided. For example, in the embodiment depicted in FIG. 2, a front door entry 60 and a rear door entry 60' is shown. In this embodiment, the rear door entry 60' may be identical in construction and operation as the front door entry 60. A door entry 60 may comprise a door 62 that is supported by a doorframe arrangement, generally designated as 64. See FIG. 1. The upper portion of the doorframe 64 may be formed from electrically conductive material such as aluminum and be configured as shown in FIG. 5. As can be seen in FIG. 5, one embodiment of the present invention may include an upper frame member 66 that has a drip edge 68 formed thereon to channel water away from the door entry 60 in the equipment module 20. The upper frame member 66 and the side and bottom frame members 67 may form a planar sealing surface 69 for the door 62 to abut when it is closed. In one embodiment, the door 62 may be of layered construction and include a piece of commercially available material 70 sold under the trademark Celotex, plywood or other similar filler material 72 and, if desired, material 74 sold by Sequentia Incorporated of Strongsville, Ohio 44136 under the trademark Structoglas® which are all supported in an interior frame 76 that extends around the perimeter of those materials. See FIGS. 5 and 6. The interior frame 76 may be fabricated from electrically conductive material such as aluminum C-shaped channel members that are fastened together (welded) at their respective ends. In one embodiment, the exterior of the door 62 may comprise a piece of aluminum plate 77 that may be attached to the interior frame 76 by mechanical fasteners 79, such as, for example, those fasteners manufactured and sold by Celus Fasteners Mfg., Inc. of 2 Connector Road, Andover, Mass. 01810 under the trademark Tigerbolt™. However, other fasteners and fastening methods could be employed to fasten the doorplate 77 to the interior frame 76. The aluminum door plate 77 may be sized relative to the interior frame 76 such that it extends past the interior frame 76 on all sides to be brought into confronting relationship with the planar sealing surfaces 69 of the doorframe 64 when the door 62 is in a closed position as shown in FIG. 5. In one embodiment, a first seal material 80 may be attached around the perimeter of the aluminum doorplate 77 as shown in FIG. 5. The first seal 80 may comprise an RFI/EMI and environmental seal Model No. 3000 Twinseal™ fabricated by Tech-Etch, Inc. of 45 Aldrin Road, Plymouth, Mass. 02360, USA and be attached to the aluminum door plate 77 by pressure sensitive adhesive. However, other RFI/EMI and environmental seal arrangements could conceivably be used.

Also in this embodiment, a second RFI/EMI seal 82 may be employed as shown in FIG. 5. The second seal 82 may comprise, for example, the seal manufactured by Tech-Etch, Inc. under Model No. 375XXX. Such second seal 82 may be attached around an interior portion of the doorframe 64 by, for example, pressure sensitive adhesive such that the second seal 82 sealingly engages the approximate entire perimeter of the interior doorframe 76 when the door 62 is in the closed position as shown in FIG. 5. Other RFI/EMI seal arrangements could also conceivably be used. Their selection, however, may depend upon the types of materials from which the door 62 and doorframes 64 are made to achieve a desired sealing effect, while employing known techniques to minimize any deleterious effects caused by galvanic action between dissimilar materials.

This embodiment may also include a third RFI/EMI seal member 84 which may comprise a seal/shield known as the Bulb Shield™ Series, also manufactured by Tech-Etch. As can be seen in FIG. 5, the third seal 84 may be clipped onto the inwardly projecting portion of the doorframe 64 such that the bulb portion 86 of the seal 84 is in sealing contact with the interior-facing perimeter of the interior doorframe 76. If desired, commercially available adhesive may also be used to further attach the third seal 84 to the doorframe. However, it will be understood that other forms of seals and methods of attachment may also be employed. As was discussed immediately above, this embodiment employs three RFI/EMI seals between the portion of the door 62 and the doorframe 64. Those of ordinary skill in the art will appreciate that a variety of other types and quantities of seals/shields could also be successfully employed without departing from the spirit and scope of the present invention.

Figure 7:
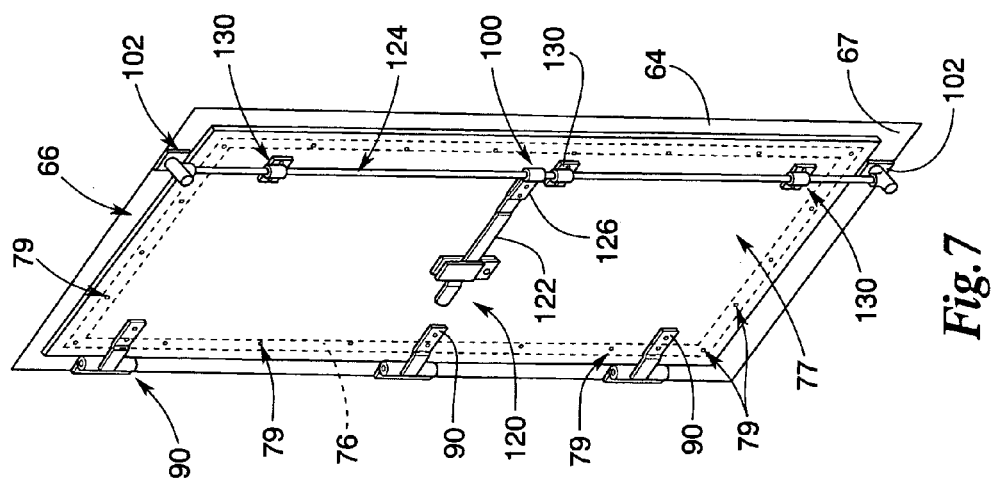
FIG. 7 is a perspective exterior view of the door of FIG. 6.

In one embodiment, the door 62 may be pivotally attached to the doorframe 64 by hinges 90 that may be fabricated from electrically conductive material such as, for example, aluminum. Hinges 90 may be attached to the doorframe 64 and the door 62 by mechanical fasteners 92 such as the previously mentioned Tigerbolts™. However, hinges 90 may be attached to the doorframe 64 and the door 62 by other types of mechanical fasteners such as bolts, screws, etc. or other methods such as welding. See FIGS. 1 and 7. Hinges 90 are configured to permit the door 62 to be received within the doorframe 64 when the door 62 is closed to achieve a desired amount of sealing contact between the door 62 and the doorframe 64 such that electrical current will pass between the door 62 and the doorframe 64.

To enable a consistent amount of environmental and RFI/EMI sealing to be maintained between the doorframe 64 and the door 62 when the door 62 is closed, an adjustable door latch assembly 100 may be employed. See FIGS. 1, and 7-11. One form of door latch assembly 100 may include a bottom catch member 102 that may be fabricated from aluminum or material that has shielding properties that are similar to the electrical grounding properties of the material from which the other components (i.e., the frame assembly 22, roof 36, floor 38, etc.) of the equipment module 20 are fabricated. The bottom catch member 102 may be attached to the bottom portion 67 of the doorframe 64 by welding, bolts, Tigerbolts™ or other suitable fasteners. Similarly, a top catch member 102 may be attached to the top portion 66 of the doorframe 64 as shown in FIG. 1. The door latch assembly 100 may also include a handle assembly 120. In one embodiment, the handle assembly 120 includes a handle 122 that is pivotally attached to a latch conduit 124. As can be seen in FIGS. 1, 7, 8, and 12, in this embodiment, the handle 122 is pivotally attached to an adjustable connector 126 that is clamped onto the latch bar or latch conduit 124. Such arrangement permits the handle 122 to be selectively pivoted in the direction represented by arrow 127 in FIG. 8. In this embodiment, the adjustable connector 126 may comprise a first clamp portion 128 that is attached to a second clamp portion 129 by a bolt 131 as shown in FIG. 12. The handle 122 may be pivotally attached to the first clamp portion 128 by another bolt 135. This arrangement permits the position of the handle 122 to be adjusted relative to the latch conduit 124 to establish a desired amount of compression between the door 62 and the various seal members 80 and 84 as will be discussed in further detail below. In this embodiment, the latch conduit 124 is rotatably affixed to the doorplate 77 by a series of door latch retainers 130.

Figure 11:
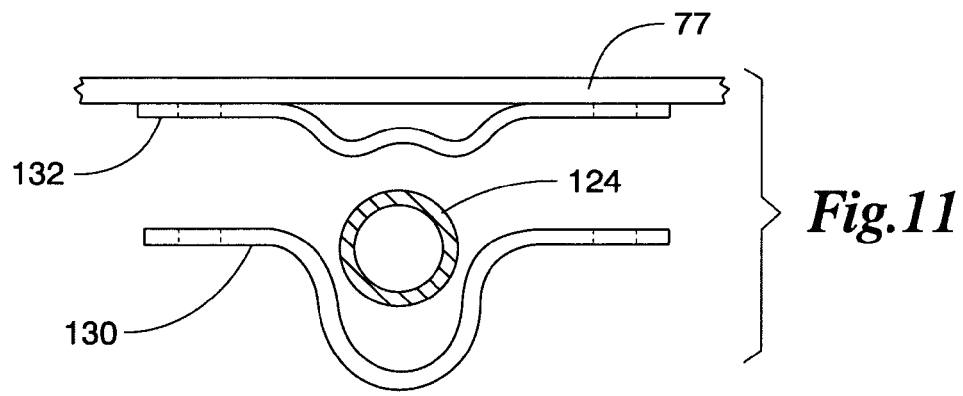
FIG. 11 is a partial exploded view of one embodiment of a door latch retainer embodiment of the present invention.
Figure 12:
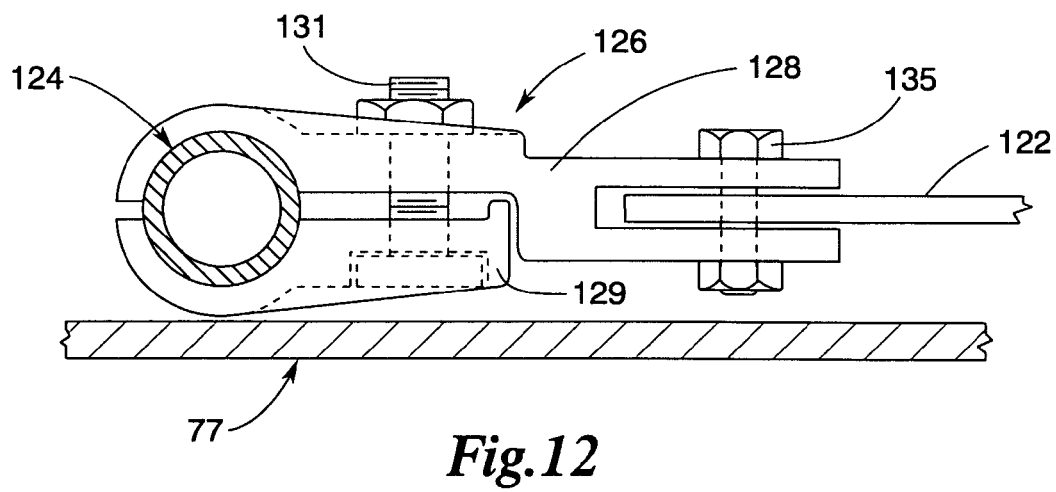
FIG. 12 is a partial view of an adjustable handle attachment member of an embodiment of the present invention.

As can be seen in FIG. 11, in this embodiment, the door latch retainers 130 may include an interior gasket member 132 that may be fabricated from, for example, a plastic or other polymer material and serve to prevent the latch conduit 124 from binding with the doorplate 77 as it is rotated. The gasket members 132 and door latch retainers 130 may be attached to the doorplate 77 by bolts or other mechanical fasteners 134 such as the above-mentioned Tigerbolts™ which may be fabricated from stainless steel or material having similar properties thereto. The reader will appreciate that the door latch retainers 130 permit the latch conduit 124 to be rotated relative to the doorplate 77.

Also in this embodiment, cam locks 140 may be attached to the top end and the bottom end of the latch conduit 124. In this embodiment, each cam lock 140 may be fabricated from electrically conductive material such as aluminum or other material that has similar properties to the properties of the other door components and equipment module structure and may include a hook portion 142 that is shaped to engage a corresponding T-shaped portion 106 formed on the corresponding cam latch 102. Each cam lock 140 may also have a boss 144 formed thereon that is sized to be inserted into the hollow interior of the latch conduit. See FIGS. 9 and 10. The cam locks 140 may then be attached to the latch conduit 124 by welding or other suitable fastening techniques.

Figure 8:
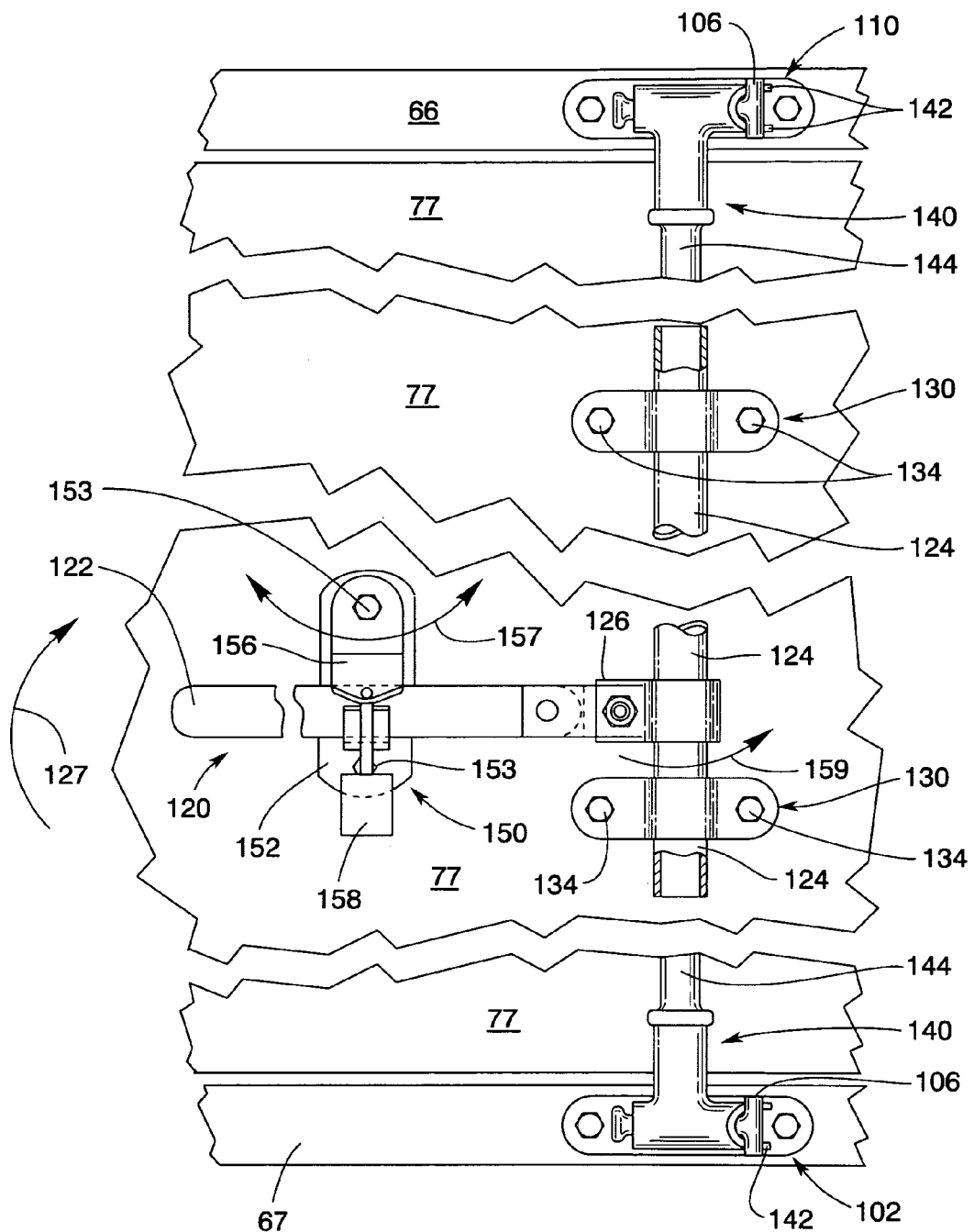
FIG. 8 is an exploded view of one embodiment of a door latch assembly of the present invention.
Figure 9:
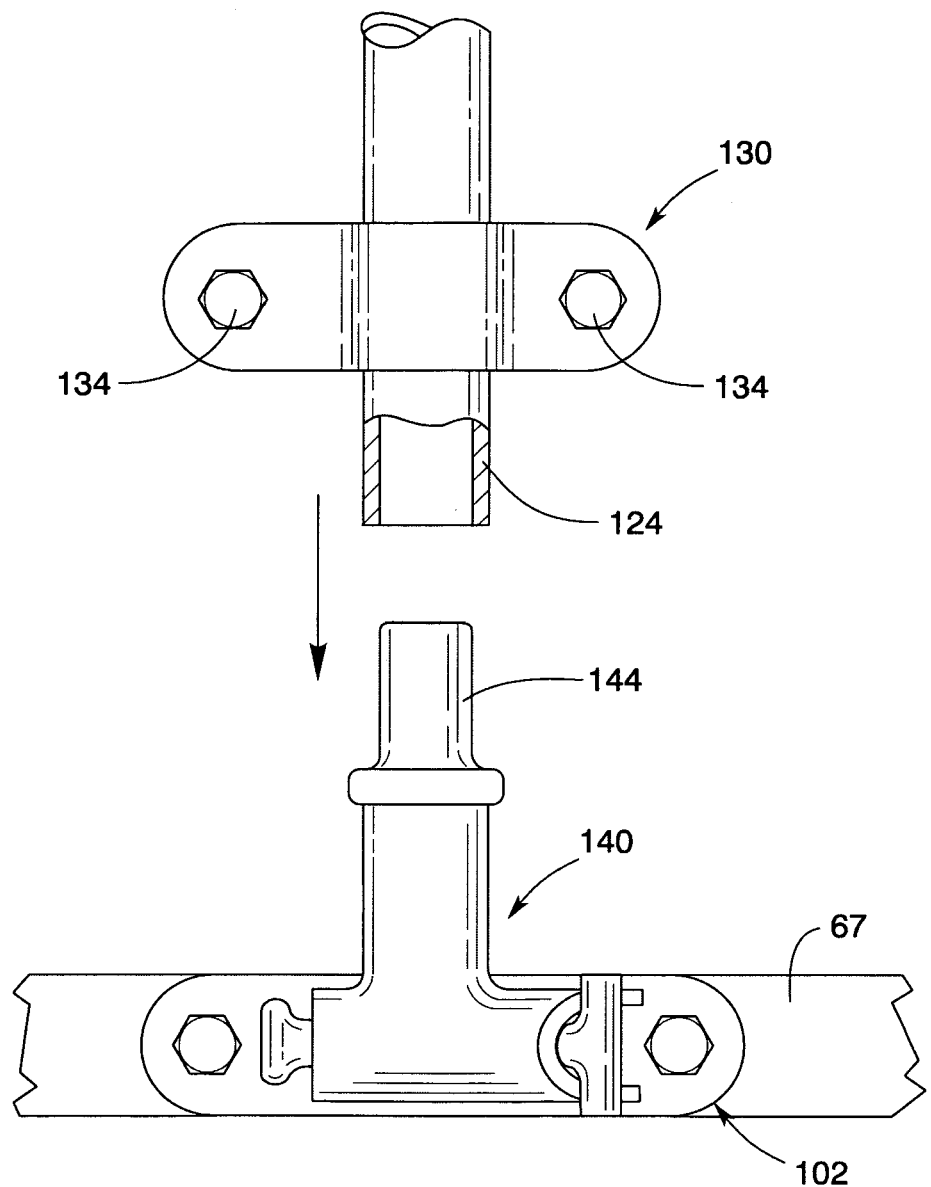
FIG. 9 is a partial exploded view of a portion of the door latch assembly of FIG. 8.
Figure 10:
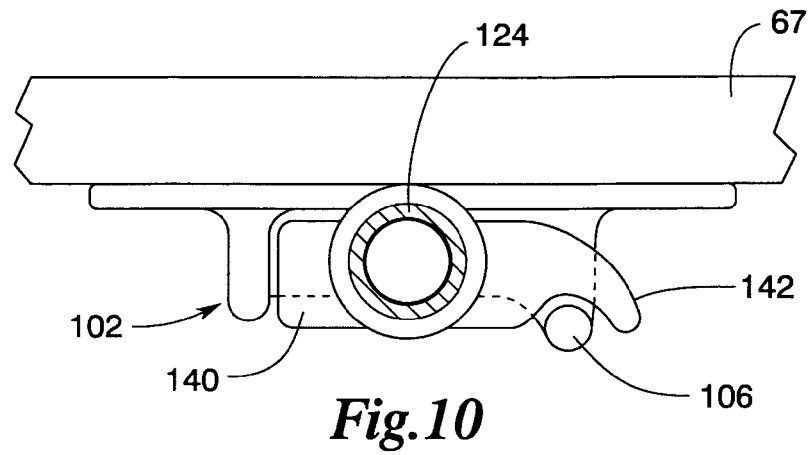
FIG. 10 is a top view of a portion of the door latch assembly of FIGS. 7 and 8.

A lock cradle assembly 150 of this embodiment may be provided to facilitate locking the door 62 in the closed position. As can be seen in FIG. 8, one form of the lock cradle assembly 150 may comprise a lower cradle member 152 for receiving and supporting a portion of the door handle therein. The lower cradle member 152 may be fabricated from, for example, stainless steel, aluminum, etc. and be attached to the doorplate 77 by, for example, bolts 153. An upper retainer member 156 may be pivotally supported on the lower cradle 152 by a pivot boss (not shown) formed on the lower cradle member 152 and be pivotably fastened thereto by one of the bolts 153. Such arrangement permits the upper retainer 156 to be pivoted in the directions represented by arrow 157 relative to the lower cradle member 152. To lock the handle 122 in position, the upper retainer 156 is pivoted to the position shown in FIG. 8, and a lock 158 is inserted through aligned holes in the upper and lower retainers 152, 156, respectively. To open the door 62, the lock 158 is removed and the upper retainer 156 is pivoted to a position whereby the door handle 122 may be pivoted out of the lower retainer 152 in the direction represented by arrow 127. The door handle 122 may then be rotated in the direction represented by arrow 159 to cause the latch conduit 124 to rotate the cam locks 140 and their hook portions 142 out of engagement with a T-shaped retainer portion 106 of the cam latches 102. After the cam locks 140 disengage the cam latches 102, the door 62 may be opened. To latch the door 62, the door 62 is moved to the closed position and the handle 122 is pivoted to bring the hook portions 142 of the cam locks 140 into engagement with the T-shaped portions 106 of the cam latches 102. Further rotation of the handle 122 results in a camming action between the cam locks 140 and the cam latches 102 which forces the door 62 into sealing contact with the seals 80, 82, and 84. Those of ordinary skill in the art will appreciate that the door 62 and door latch assembly 120 described above, are examples of closures that may be successfully used in connection with various embodiments of the present invention. It is conceivable, however, that other forms of door arrangements and latches may be employed without departing from the spirit and scope of the present invention. Regardless of the type and construction of the door latch arrangement, it may be desirable for the door to achieve an environmental seal and a seal such that electrical current will pass between the door and the frame when the door is closed and a metal to metal contact for RFI shielding capability.

In the above-described embodiment, the amount of compression achieved between the door and the seals 80 and 84 may be adjusted by adjusting the position of the latch conduit 124 (and the cam locks 140 attached thereto) relative to the handle portion 122, such that when the handle 120 is in the closed position (shown in FIG. 8), the cam locks 140, in engagement with the corresponding cam latches 102, cooperate to force the door 62 inward to compress the seals 80 and 84. To adjust the position of the latch conduit and the handle 120, the user simply loosens the bolt 131 and rotates the adjustable connector 126 until the handle 120 is in a desired position relative to the latch conduit 124 and the bolt 131 is then tightened. In one embodiment, it is desirable for the seal 80 and/or the seal 84 to be compressed by approximately 25 percent. However, such degree of compression may vary depending upon the construction and composition of the particular door seals employed. Those of ordinary skill in the art will appreciate that the novel method of adjusting the amount of compression applied to the seals enables the user to make the necessary adjustments to compensate for door component wear.

Also in this embodiment, end 28 of the frame assembly 22 of the equipment module 20 is attached to a frame assembly 210 of the power module 200 as will be discussed in further detail below. The other end 30 of the frame assembly 22 of the equipment module 20 may have a cable entry portion 160 attached thereto which has a front wall portion 161, an end wall portion 162 and a rear wall portion 163 that are fabricated from material that is electrically conductive such as aluminum. See FIGS. 2 and 15. For example, the walls 161, 162, 163 may be fabricated from aluminum plate or similar material and be welded together at their sides. Roof plate 36 may also be welded to the walls 161, 162, and 163 as shown in FIG. 1 and comprise electrically conductive material such as aluminum plate. The bottom of the cable entry portion 160 may be formed with another floor plate 164 that is welded to the bottom of the end 30 of frame assembly 22 and the bottom ends of the walls 161, 162, 163 to enclose the cable entry portion 160. If desired, an air conditioner assembly 166 may be coupled to the end wall 162 an end of the cable entry portion 160 as shown in FIG. 1. The air conditioner assembly 166 may include a housing 168 that is constructed from the same materials that forms the frame assembly 22, the roof 36, the floor 38, the walls 161, 162, 163, and floor plate 164 of the cable entry portion 160 and may be attached to the end wall 162 of the cable entry portion 160 by stainless steel bolts or screws.

Figure 14:
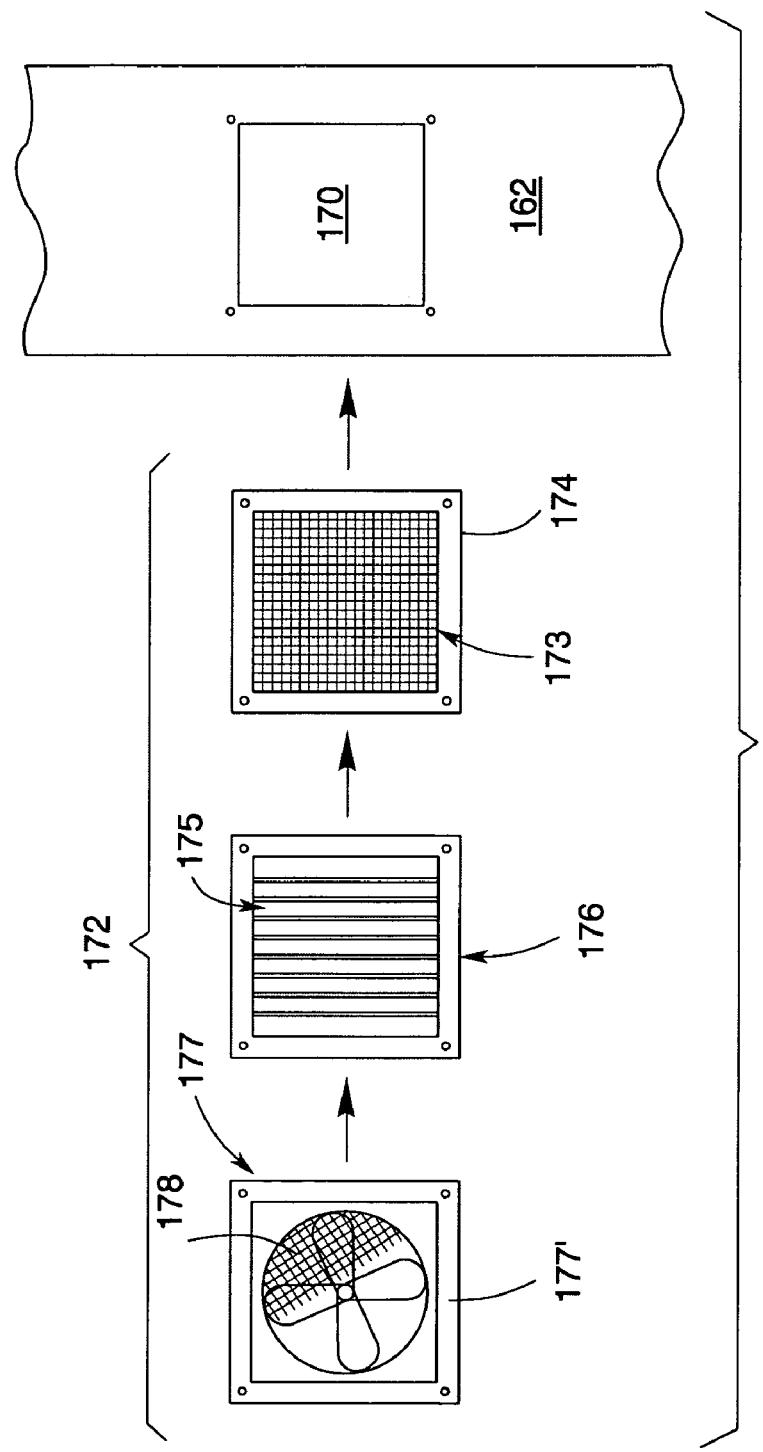
FIG. 14 is an exploded assembly view of on embodiment of a shutter and fan assembly of the present invention.

The cable entry portion 160 of this embodiment may be provided with a shutter and fan assembly 172 positioned over a vent opening 170 through the end wall 162. See FIG. 14. The shutter and fan assembly 172 may include a first EMI/RFI filter assembly 173 for example, of the type manufactured by Tech-Etch, Inc. under Series 8000, Style 6 or similar filter assembly that has a frame 174 adapted to be bolted to the end wall 162. The shutter and fan assembly 172 may further include a shutter assembly 175 that may be fabricated from electrically conductive material such as aluminum and be equipped with louvers and an attachment frame 176. The shutter assembly 175 may be of the adjustable type and be operated by a thermostat-controlled motor (not shown) which serves to open and close the louvers based on the temperature within the enclosure 10. To establish airflow through the enclosure 10, a fan 177 may also be employed. In one embodiment, the fan motor may be controlled by a thermostat-equipped switch (not shown). Fan 177 may also be provided with a frame member 177' and a guard 178 that may be fabricated from expanded metal. Those of ordinary skill in the art will appreciate that the frame members of the above components may be attached to the end wall 162 with bolts or similar fasteners (not shown). In addition, a deflector 179 fabricated from aluminum may be attached to the end of the cable entry portion 160 to prevent rain, snow, etc. from entering the enclosure through the shutter and fan assembly 172. See FIGS. 1 and 2. As can also be seen in those Figures, the cable entry portion 160 may have one or more cable entry ports 400 therein for facilitating entry of cables 380 into the enclosure 10. An exemplary construction of cable entry ports 400 is provided below.

Figure 15:
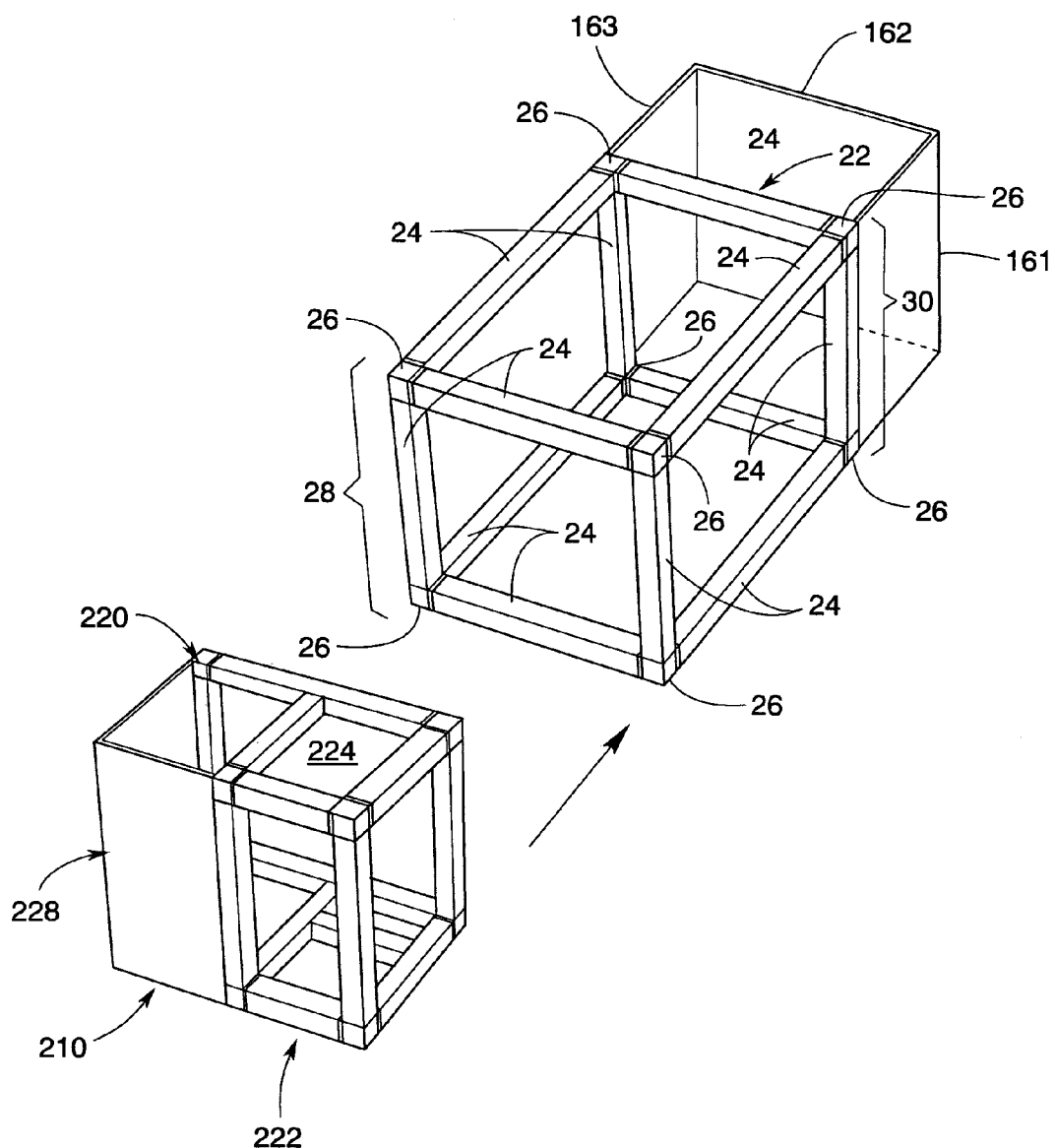
FIG. 15 is an exploded assembly view of a frame assembly of a power module embodiment and the frame assembly of an equipment module embodiment of the present invention.
Figure 15A:
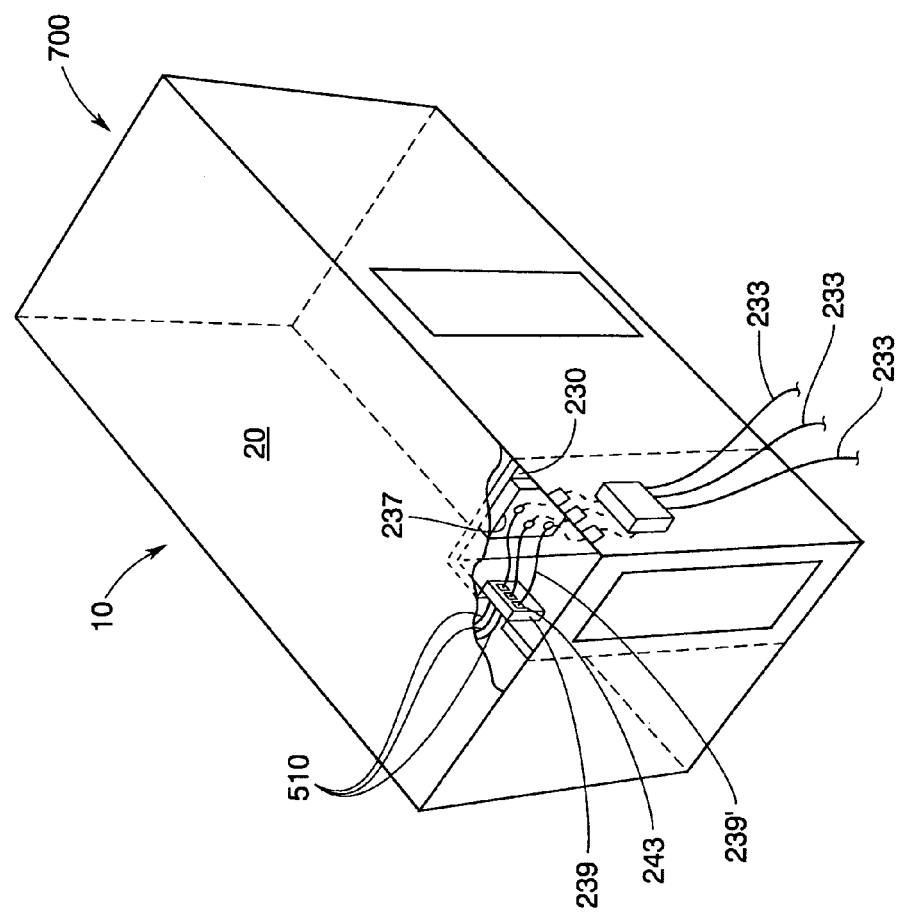
FIG. 15A is a diagrammatic perspective view of an enclosure embodiment of the present invention, with a portion of the roof removed to expose a portion of a magnetic shield enclosure supported therein.
Figure 16:
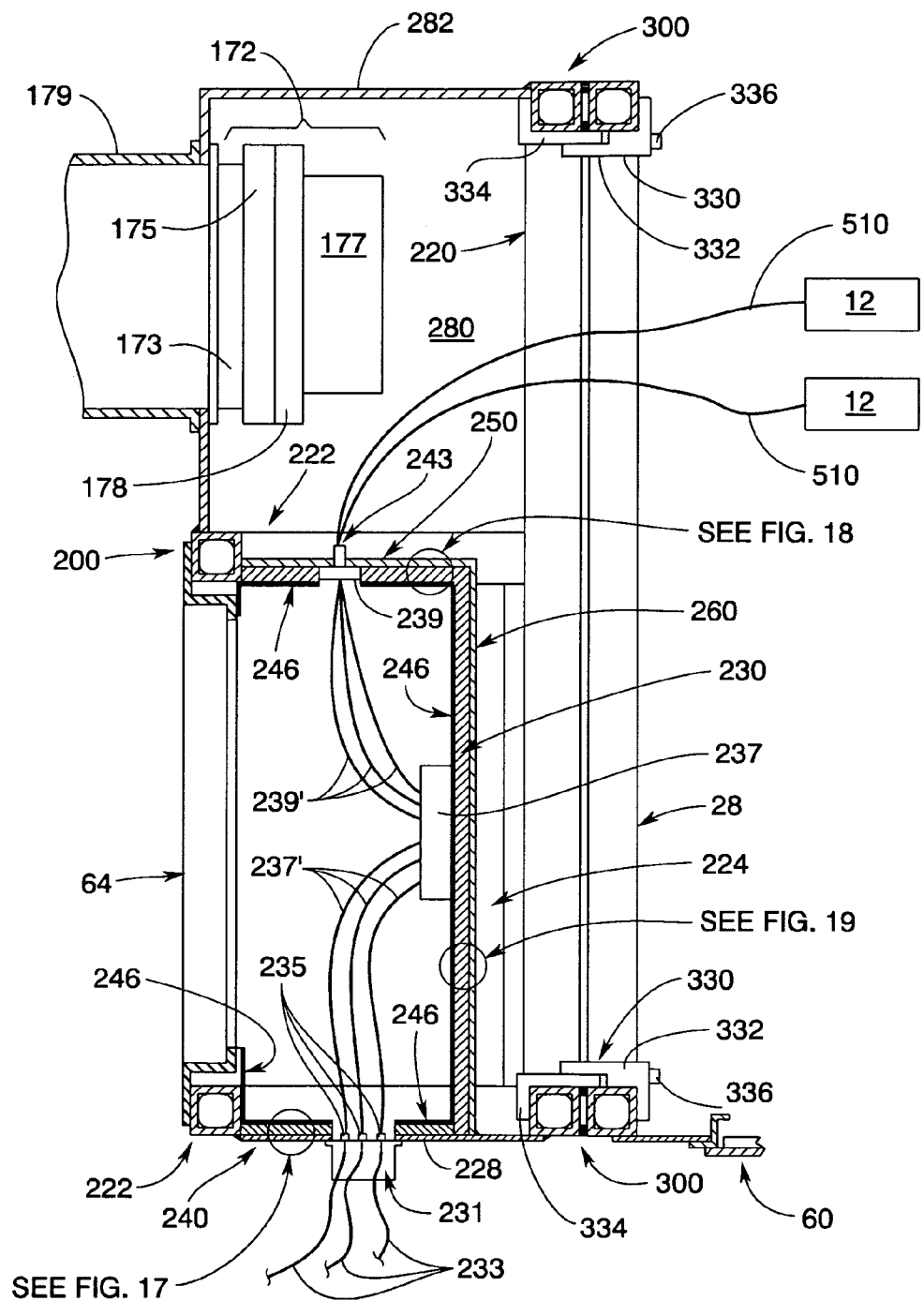
FIG. 16 is a partial top cross-sectional view of a power module embodiment of the present invention.

As was mentioned above, in this embodiment, the enclosure 10 also includes a power module 200. The power module 200 may be fabricated out of electrically conductive material such as aluminum and serve as the portion of the enclosure wherein power is brought into the enclosure 10 to power the equipment 12 supported in the equipment module 20. The power module 200 may include a frame assembly 210 that has an end frame member 220 that corresponds to end 28 of the equipment module frame assembly 22. See FIG. 15. In addition, attached to the end frame assembly 220 is another frame portion 222 that serves to define a power entry area 224 for supporting a magnetic field enclosure 230 therein. See FIGS. 16 and 16A. To provide access into the power entry area 224 and the magnetic field enclosure 230 therein, a doorframe 64 and door 62 of the types and constructions described above may also be provided in the power module 200. As can be seen in FIGS. 1 and 16, a front exterior wall plate 228 is attached to the front end of the frame portion 222. In one embodiment, the wall plate 228 is fabricated from electrically conductive material such as aluminum plate that may be welded to the frame portion 222 and the end frame portion 220.

Figure 17:
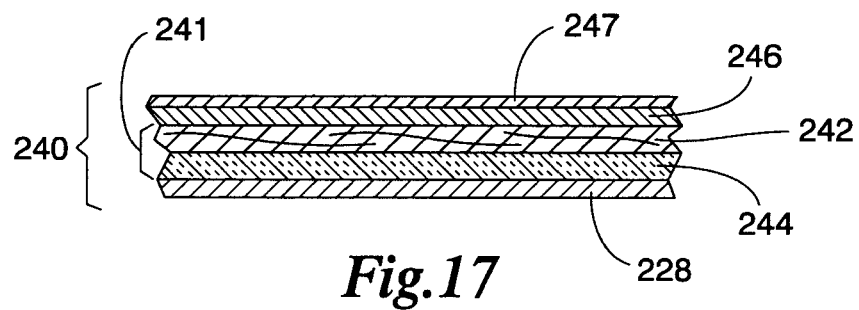
FIG. 17 is a partial cross-sectional view of a front wall of the shielded enclosure depicted in FIG. 16.
Figure 18:
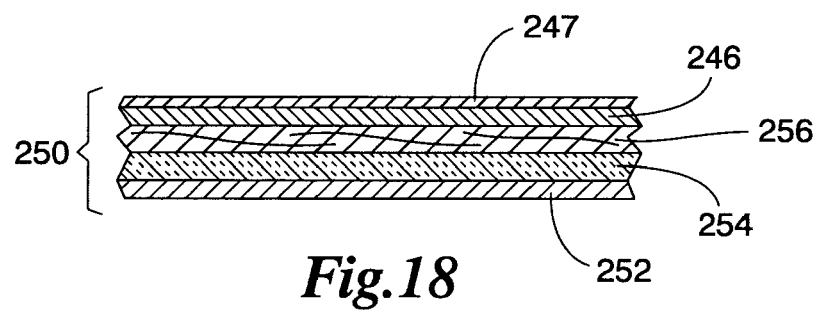
FIG. 18 is a partial cross-sectional view of a rear wall portion of the shielded enclosure depicted in FIG. 16.
Figure 19:
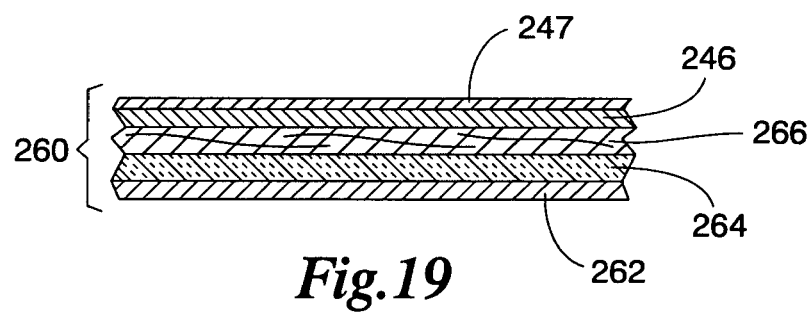
FIG. 19 is a partial cross-sectional view of a side wall of the shielded enclosure depicted in FIG. 16.

As can be seen in FIG. 16, the magnetic field enclosure 230 may be attached to the power module frame portion 222 within the power entry area 224 such that the magnetic field enclosure 230 shares at least one common wall with the remaining portion of the power module 220 and the equipment module 20 when the power module 220 is attached to the equipment module 20. More particularly and with reference to FIG. 16, the magnetic field enclosure 230 may comprise a rectangular shaped enclosure which is supported within the power entry area 224. Those of ordinary skill in the art will appreciate, however, that the magnetic field enclosure 230 may also be provided in other shapes and sizes. In this embodiment, the shielded enclosure has front wall 240, a rear wall 250 and a sidewall 260. As can be seen in FIG. 16, in this embodiment, the front wall 240 is supported such that it is substantially coplanar with the front wall plate 228 of the power module 220. Also in this embodiment, the front wall portion 240 may have a filler material 241 which may comprise a layer of plywood 242 and commercial insulation material 244 glued thereto. See FIG. 17. The inside of the front wall portion 240 is lined with magnetic shield material 246 which may comprise, for example, the AD-MU-80 material manufactured by Advance Magnetics of Rochester, Ind. or similar magnetic shield material. The AD-MU-80 material or similar material may comprise is a soft magnetic alloy containing approximately 80% nickel, 4.20% molybdenum, and 15% iron which develops extremely high permeabilities with minimum hysteresis loss. While one acceptable alloy may contain about eighty percent nickel, other alloys comprising about forty to about eighty percent nickel can also be successfully used. The magnetic shield material 246 may be glued to the plywood 242 or affixed thereto with double-sided adhesive tape. In addition, the exposed surface of the magnetic shield material 246 may be covered with a layer of material 247 such as that material fabricated by Sequentia Incorporated under the trademark Structoglas®. The material 247 may be attached to the magnetic shield material 246 by glue or double-sided tape. The rear wall 250 of this embodiment may also have a cross-sectional construction that is similar to the construction of the front wall 240. In particular, the rear wall 250 may comprise aluminum plate 252 that has insulation 254 glued or otherwise attached thereto. Plywood 256 or other filler member may be attached to the insulation 254 with glue or double-sided tape and a corresponding rear portion of the magnetic shield material 246 may be attached to the plywood with glue or double-sided adhesive tape. Structoglas® material 247 may be attached to the exposed surface of the magnetic shield material 246 in the manners described above. See FIG. 18. Likewise, the side wall portion 260 of this embodiment may comprise a piece of aluminum plate 262 that is welded to the front plate 228 and the rear plate 252 such that the plates 228, 252, 262 form a continuous 3-sided shell portion of the magnetic field enclosure 230. Those of ordinary skill in the art will also appreciate that the rear plate 252 and the side plate 262 may actually comprise a single plate that is bent to define the exterior sidewall and the exterior rear wall of the magnetic shield enclosure. Insulation 264 may be attached to the plate 262 and plywood 266 or other filler material is attached to the insulation 264. The magnetic shield material 246 may be attached to the plywood by glue, double-sided adhesive tape, etc. Structoglas® material 247 may be attached to the exposed surface of the magnetic shield material 246 in the manners described above. See FIG. 19.

Figure 16A:
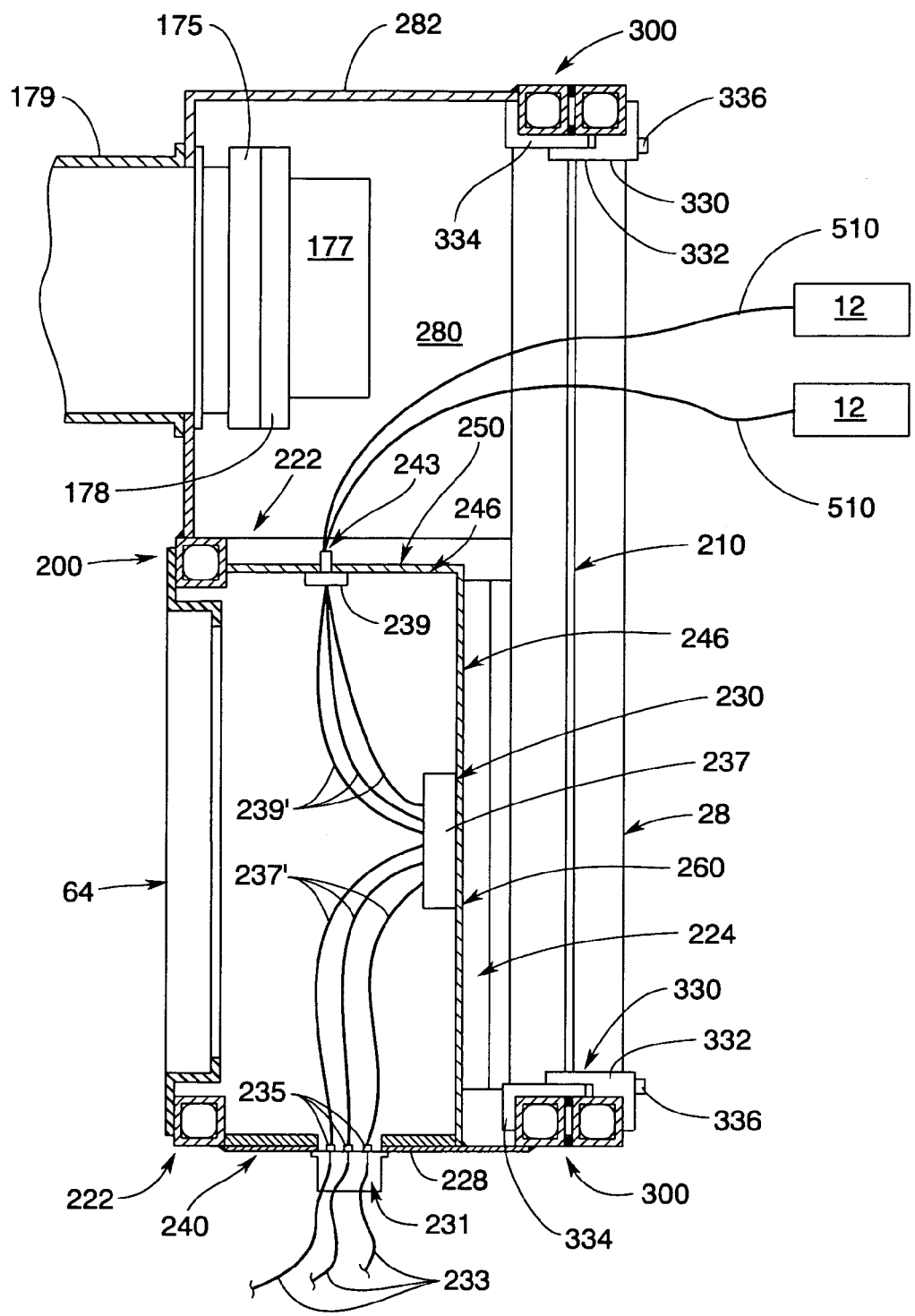
FIG. 16A is a partial top cross-sectional view of another power module embodiment of the present invention.

In an alternative embodiment as shown in FIG. 16A, the magnetic shield material 246 may be supported in a coplanar orientation relative to the front wall 228 of the power module 200 without the insulation and/or the plywood therebetween. The magnetic shield material 246 may be directly attached to the front wall 228 with a commercially available adhesive which may also serve to prevent the occurrence of galvanic corrosion between the magnetic shield material 246 and the front wall 228. Similarly, magnetic shield material 246 may form the entire rear wall 250 and sidewall 260. In these embodiments, those of ordinary skill in the art will appreciate that the magnetic shield material 246 may extend from a floor plate 270 attached to the frame assembly 210 of the power module 200 and the roof plate 272 that is also attached to the frame assembly 210. See FIG. 1.

Figure 13:
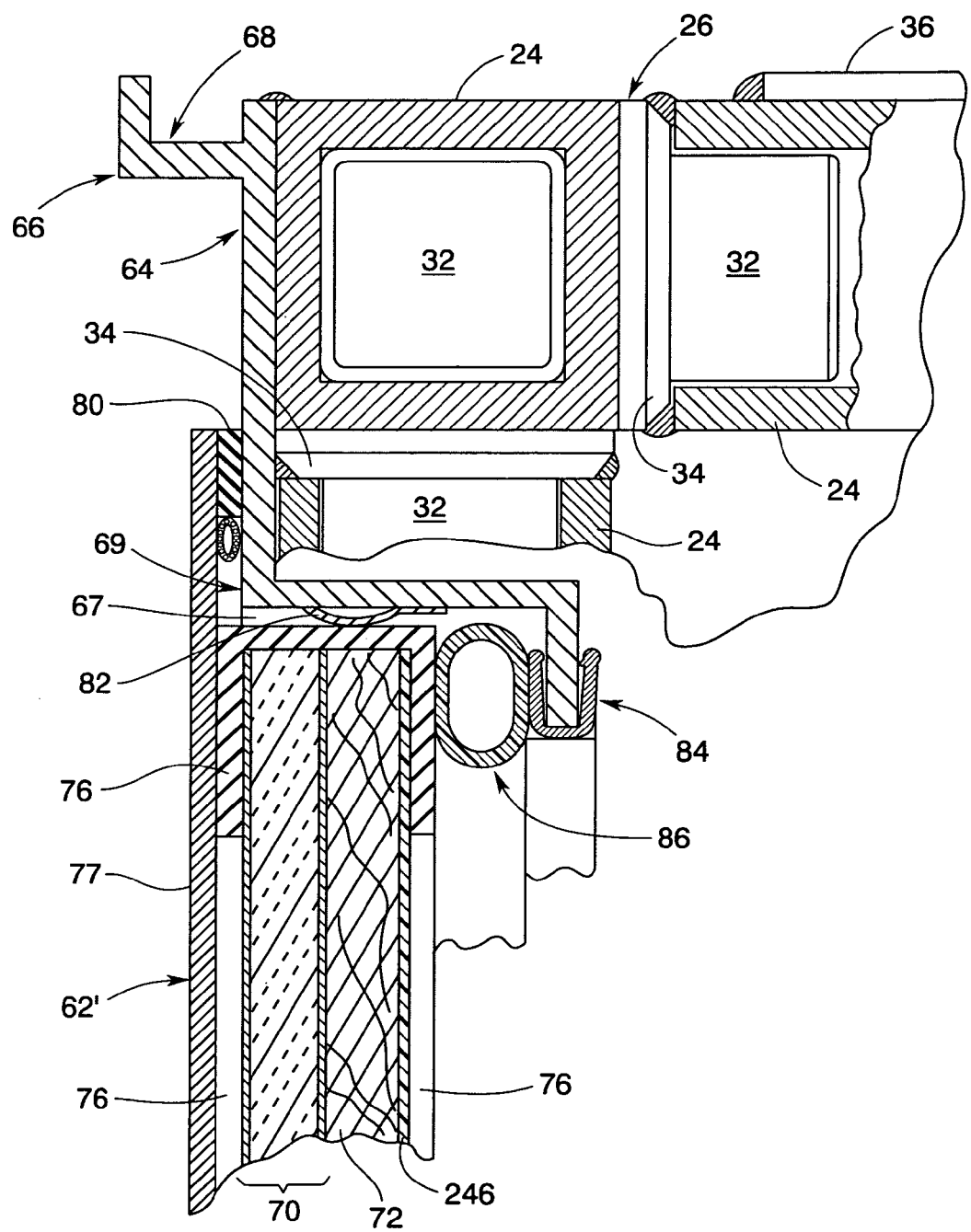
FIG. 13 is a partial cross-sectional view of a top of a door entry that may be employed in one magnetic shield enclosure embodiment of the present invention.
Figure 13A:
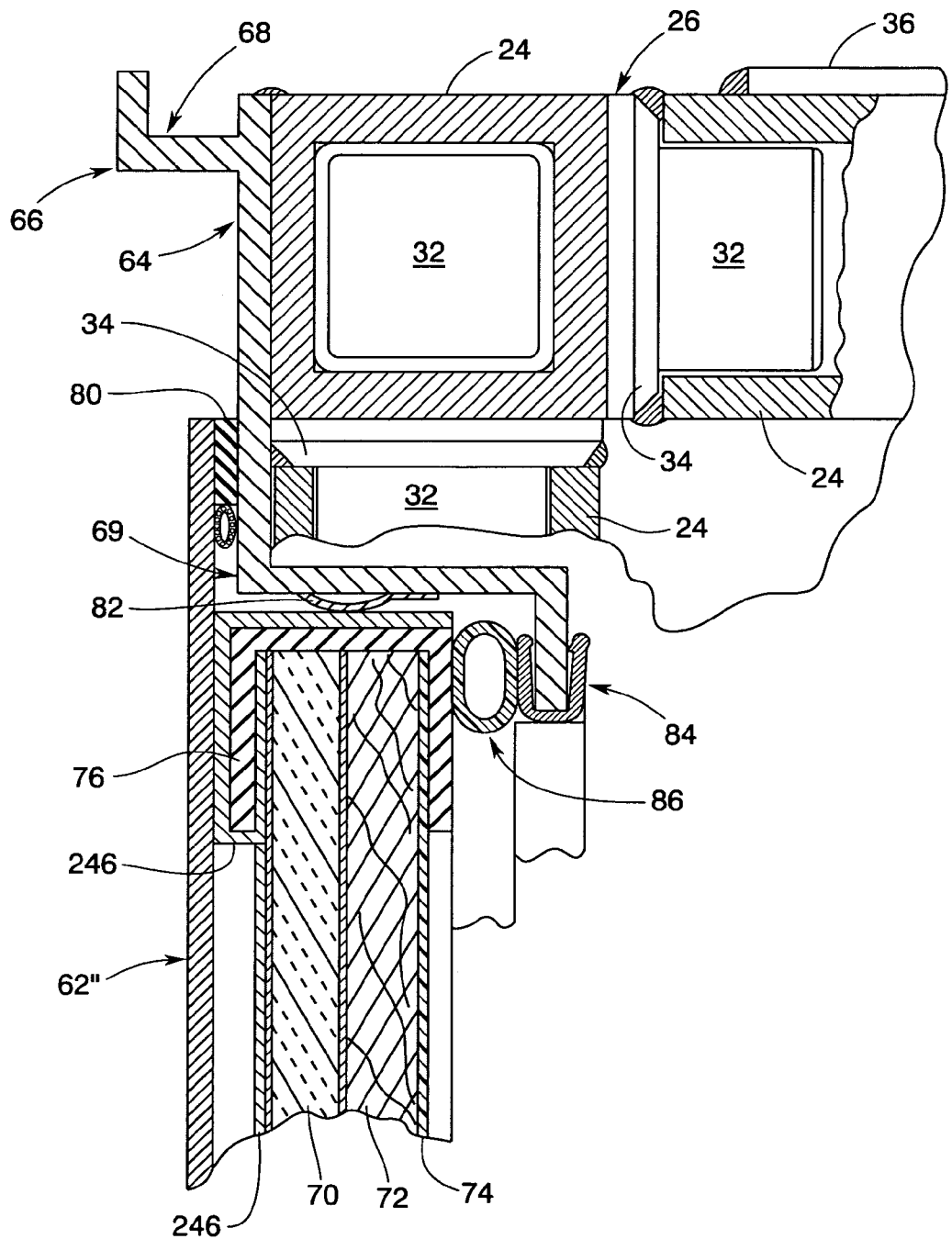
FIG. 13A is a partial cross-sectional view of a top of another door entry that may be employed in another magnetic shield enclosure of one embodiment of the present invention.

As indicated above, one embodiment, the magnetic field enclosure 230 may have a door 60 of the type described above and illustrated in FIG. 5. Other embodiments of the present invention may employ door constructions of the types depicted in FIGS. 13, 13A, and 13B. The embodiment of FIG. 13 may employ a doorframe 64 constructed as described above and a door 62'. However, the door 62' may have a layer of magnetic shield material 246 attached to the inner surface of the door 62'. In the embodiment depicted in FIG. 13A, the doorframe 64 may be constructed as described above. However, in this embodiment, the door 62" may include a piece of Celotex 70 and plywood 72 that are supported in an interior frame 76 that extends around the perimeter of those materials. In this embodiment, magnetic shield material 246 of the type described above may also be supported in the frame 76 and, if desired, attached to the plywood 72 with adhesive or double-sided tape. The interior frame 76 may be fabricated from electrically conductive material such as aluminum C-shaped channel members that are fastened together (welded) at their respective ends. Also in this embodiment, magnetic shield material 246 may be provided on exterior portions of the frame 76 as shown in FIG. 13A. As can also be seen in that Figure, a portion of the magnetic shield material 246' may extend between a portion of the Celotex material 70 and the frame 76. An additional piece of magnetic shield material 246 may also be attached to the exposed portion of the Celotex 70 with adhesive or double-sided tape. The exterior of the door 62" may comprise a piece of aluminum plate 77 that may be attached to the interior frame 76 by mechanical fasteners 79, such as Tigerbolt™ fasteners of the type described above. However, other fasteners and fastening methods could be employed to fasten the doorplate 77 to the interior frame 76. The aluminum door plate 77 may be sized relative to the interior frame 76 such that it extends past the interior frame 76 on all sides to be brought into confronting relationship with the planar sealing surfaces 69 of the doorframe 64 when the door 62" is in a closed position as shown in FIG. 13A. In one embodiment, a first seal material 80 may be attached around the perimeter of the aluminum doorplate 77 and comprise an RFI/EMI and environmental seal Model No. 3000 Twinseal™ fabricated by Tech-Etch, Inc. and be attached to the aluminum door plate 77 by pressure sensitive adhesive. However, other RFI/EMI and environmental seal materials could conceivably be used.

Also in this embodiment, a second RFI/EMI seal 82 may be employed as shown in FIG. 13A. The second seal 82 may comprise, for example, the seal manufactured by Tech-Etch, Inc. under Model No. 375XXX. Such second seal 82 may be attached around an interior portion of the doorframe 64 by, for example, pressure sensitive adhesive such that the second seal 82 sealingly engages the magnetic shield material 246 extending around the perimeter of the interior doorframe 76 when the door 62" is in the closed position as shown in FIG. 13A. Other seal members could also conceivably be used.

This embodiment may also include a third seal member 84 which may comprise a seal/shield known as the Bulb Shield™ Series, also manufactured by Tech-Etch, Inc. As can be seen in FIG. 13A, the third seal 84 may be clipped onto the inwardly projecting portion of the doorframe 64 such that the bulb portion 86 of the seal is in sealing contact with the interior-facing perimeter of the interior doorframe 76. If desired, commercially available adhesive may also be used to further attach the third seal 84 to the doorframe 64. However, it will be understood that other forms of seals and methods of attachment may also be employed. As was discussed immediately above, this embodiment employs three RFI/EMI seals between the portion of the door and the doorframe. Those of ordinary skill in the art will appreciate that a variety of other types and quantities of seals/shields could also be successfully employed without departing from the spirit and scope of the present invention.

Figure 13B:
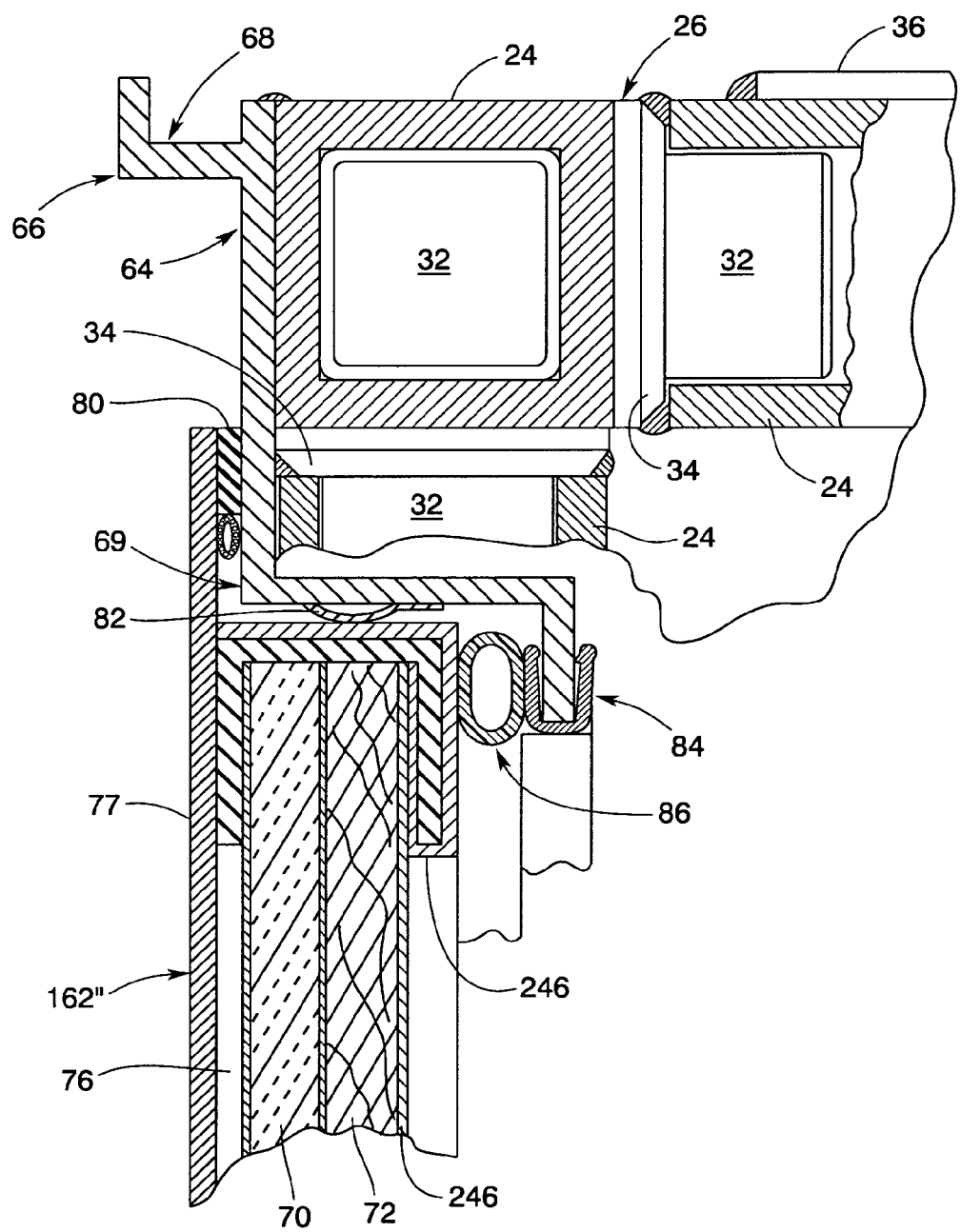
FIG. 13B is a partial cross-sectional view of a top of another door entry that may be employed in another magnetic shield enclosure of one embodiment of the present invention.

Another door embodiment that may be employed in the power module portion is shown in FIG. 13B. This embodiment may employ a door 162" and doorframe 64 constructed as described above. However, the door 62" may include a piece of Celoxtex 70, plywood 72 and a piece of magnetic shield material 246 that are supported in an interior frame 76 that extends around the perimeter of those materials. The interior frame 76 may be fabricated from electrically conductive material such as aluminum C-shaped channel members that are fastened together (welded) at their respective ends. Also in this embodiment, additional magnetic shield material 246 may be provided on exterior portions of the frame 76 as shown in FIG. 13B. As can be seen in that Figure, a portion of the magnetic shield material 246 extending around the perimeter of the frame 76 may extend between a portion of the magnetic shield material 246 attached to the plywood 72 and the frame 76. The exterior of the door 62 may comprise a piece of aluminum plate 77 that may be attached to the interior frame 76 by mechanical fasteners 79, such as Tigerbolt™ fasteners of the type described above. However, other fasteners and fastening methods could be employed to fasten the doorplate 77 to the interior frame 76. The aluminum door plate 77 is sized relative to the interior frame 76 such that it extends past the interior frame 76 on all sides to be brought into confronting relationship with the planar sealing surfaces 69 of the doorframe 64 when the door 162" is in a closed position as shown in FIG. 13B. In one embodiment, a first seal material 80 may be attached around the perimeter of the aluminum doorplate 77 and comprise an RFI/EMI and environmental seal Model No. 3000 Twinseal™ fabricated by Tech-Etch, Inc. and be attached to the aluminum door plate 77 by pressure sensitive adhesive. However, other RFI/EMI and environmental seal materials could conceivably be used.

Also in this embodiment, a second RFI/EMI seal 82 may be employed as shown in FIG. 13B. The second seal 82 may comprise, for example, the seal manufactured by Tech-Etch, Inc. under Model No. 375XXX. Such second seal 82 may be attached around an interior portion of the doorframe 64 by, for example, pressure sensitive adhesive such that the second seal 82 sealingly engages the magnetic shield material 246 extending around the perimeter of the interior doorframe 76 when the door 162" is in the closed position as shown in FIG. 13B. Other seal members could also conceivably be used.

This embodiment may also include a third RFI/EMI seal member 84 which may comprise a seal/shield known as the Bulb Shield™ Series, also manufactured by Tech-Etch, Inc. As can be seen in FIG. 13B, the third seal 84 may be clipped onto the inwardly projecting portion of the doorframe 64 such that the bulb portion 86 of the seal is in sealing contact with the interior-facing perimeter of the interior doorframe 76. If desired, commercially available adhesive may also be used to further attach the third seal 84 to the doorframe 64. However, it will be understood that other forms of seals and methods of attachment may also be employed.

In one embodiment, the floor plate 270 and the roof plate 272 may be fabricated from electrically conductive material such as aluminum and may be welded to the power module frame assembly 210 as shown in FIG. 1. In other embodiments, a layer of magnetic shield material 246 may also be associated with the floor plate 270 and the roof plate 272, if desired.

In environments wherein the enclosure 10 may encounter warm temperatures that could hamper the functioning of the electronic components therein, in addition to the air conditioner 160 and shutter and fan assembly 172, the power module 200 may be provided with a shutter and fan area 280 for cross-ventilation purposes. In this embodiment, the shutter and fan area 280 may be enclosed by electrically conductive material such as a piece of ³⁄₁₆" aluminum plate 282 or similar material that is configured as shown in FIG. 16 and that may be attached to the power module frame assembly 210 by, for example, welding. A shutter and fan assembly 172 of the type described above may be mounted in an end portion of the plate 282 as shown in FIGS. 16 and 16A.

Figure 20:
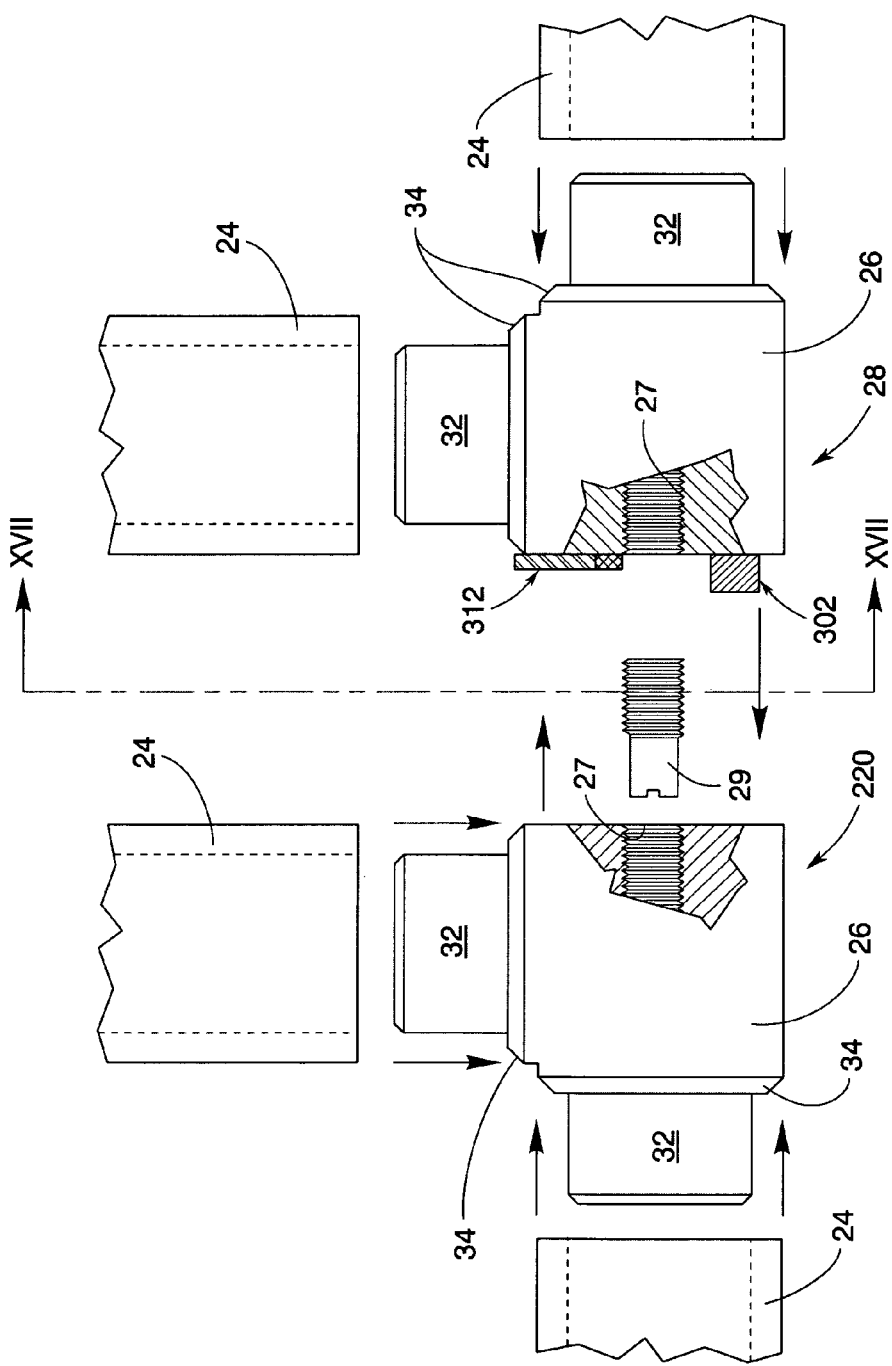
FIG. 20 is a partial exploded assembly view of a portion of an equipment module frame assembly and a power module frame assembly of one embodiment of the present invention.
Figure 21:
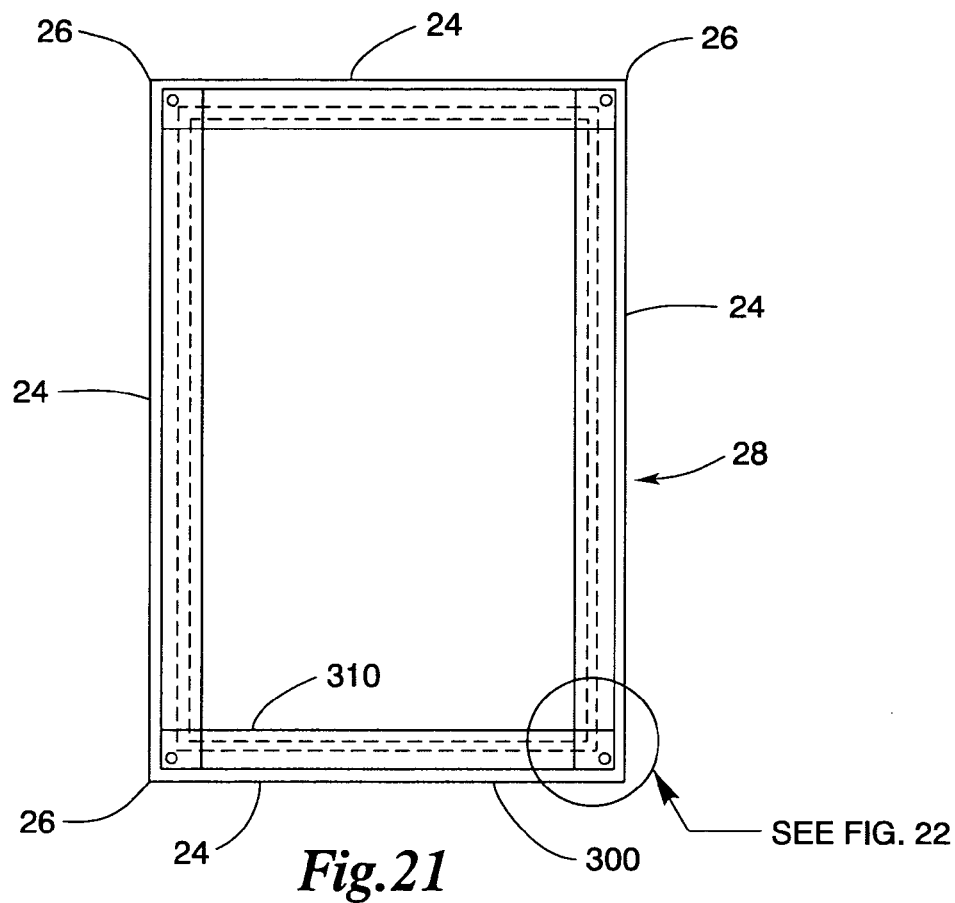
FIG. 21 is an end view of a portion of the equipment module frame assembly of one embodiment of the present invention.
Figure 22:
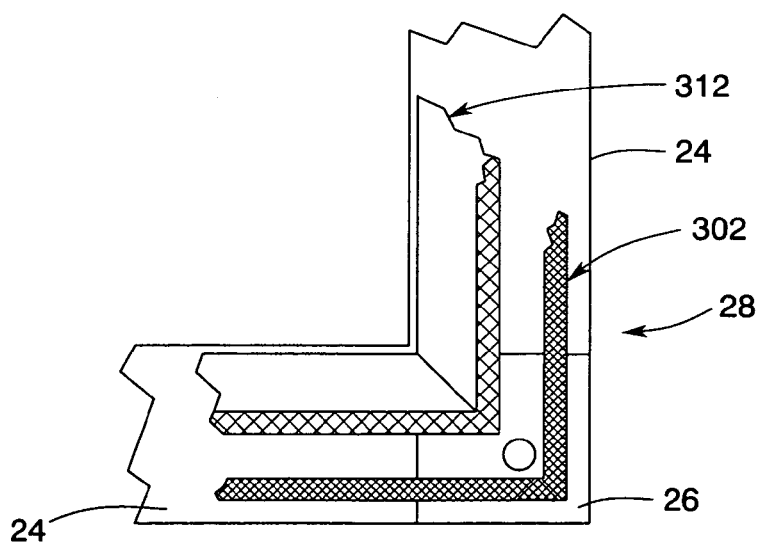
FIG. 22 is a partial enlarged view of a portion of the frame assembly depicted in FIG. 21.
Figure 23:
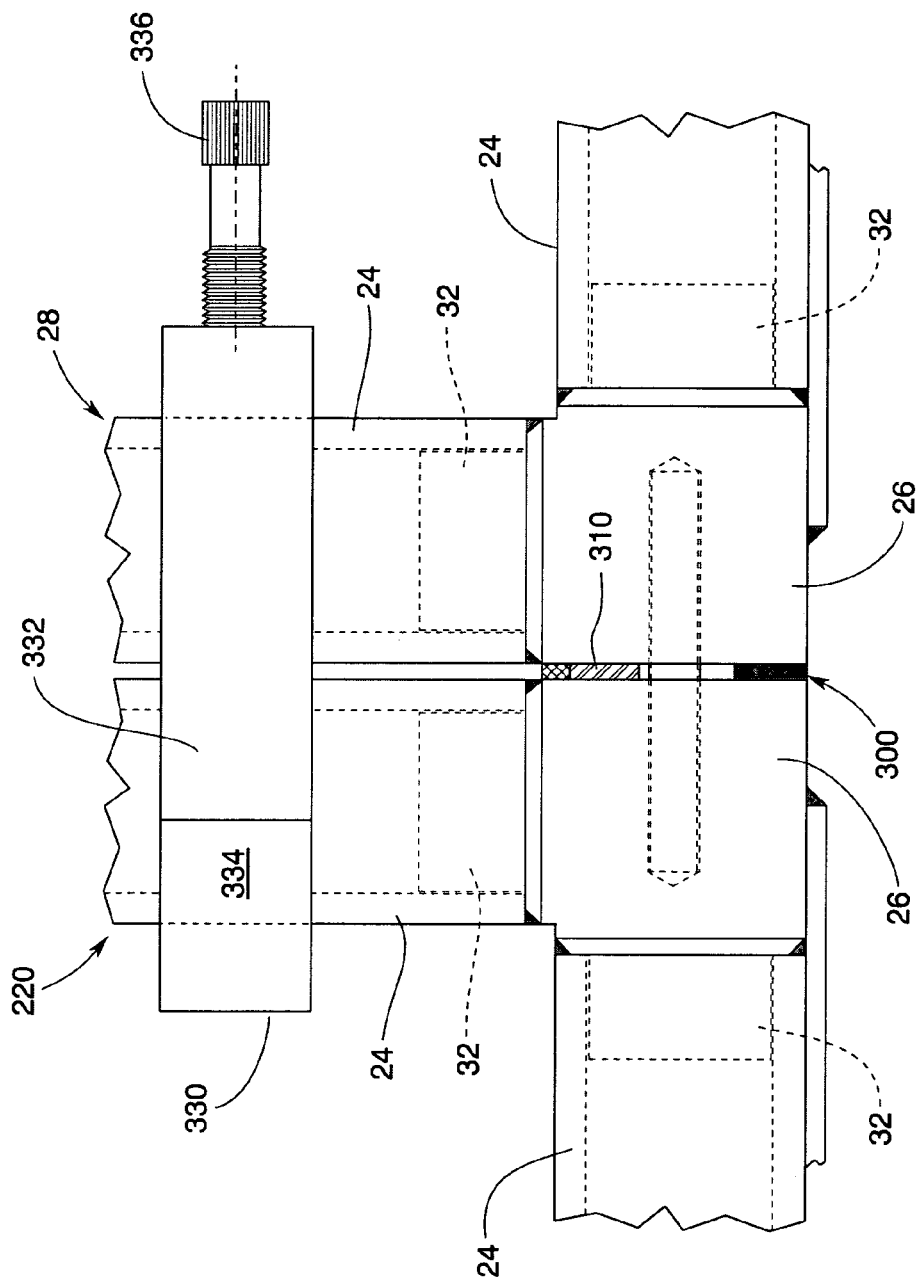
FIG. 23 is a partial assembly view of the equipment module and the power module frame assemblies of FIG. 20 coupled together with a clamp of the present invention.

In one embodiment of the present invention, the power module 200 may be interconnected to the equipment module 20 in the following manner. In the embodiment shown in FIGS. 16 and 20-23, an environmental barrier 300 may be provided between the end frame 28 of the equipment module frame assembly 22 and the end portion 220 of the power module frame assembly 210. For example, a sealant material 302 manufactured by the 3M Company of Minnesota under the trademark Mastik™ may be applied around the side perimeter of either of the end frame assemblies 28 or 220 as shown in FIGS. 22 and 23. However, other commercially available sealant material may be employed. Thus, when the end frames 28 and 220 are brought together as shown in FIGS. 15, 20, and 23, the seal material 302 forms an environmental barrier 300 between the end frames 28 and 220. Also in this embodiment, to form an RFI/EMI barrier 310 between the end frames 28 and 220, a shield member 312 may be attached to one of the end frames 28 and 220 such that it is inboard of the environmental seal 302. Such shield member 312 may comprise the serial 3000 Twin seal™ manufactured by Tech-Etch. Other environmental seal materials and shield materials may also be employed.

In this embodiment, after the environmental seal 302 and the shield member 312 have been attached to the perimeter of one of the side perimeters of one of the end frame sections 28, 220, they are positioned adjacent each other as shown in FIG. 20. To facilitate confronting alignment of the end frames 220 and 28, the corner blocks 26 may be provided with holes 27 such that, when the cornerblocks 26 in the end frames 220 and 28 are aligned with each other, the holes 27 in the confronting cornerblocks are coaxially aligned with each other. The holes 27 may be threaded to receive a threaded portion of a locating pin 29. The locating pins 29 may be screwed into holes 27 in the cornerblocks 26 of either of the end frame sections 28, 220 and left to protrude a distance therefrom such that when the end frame sections are juxtapositioned relative to each other, the protruding ends of the locator pins 29 may be inserted into the holes 27 in the cornerblocks 26. The protruding portions of the locator pins 29 may be smooth and sized to be slidably received in the threaded holes 27 in the cornerblocks 26 as shown in FIG. 20.

After the end frame sections 28, 220 are brought together, a plurality of clamp assemblies 330 may be employed to connect the end frame sections together. In one embodiment, a clamp assembly 330 may comprise a first clamp portion 332 that is interconnected to a second clamp portion 334 by a threaded screw. Turning the threaded screw 336 draws the ends of the first and second clamp sections 332, 334 together or moves them away from each other depending upon the direction of screw rotation. Those of ordinary skill in the art will appreciate that other fasteners and fastening techniques could conceivably be employed to attach the end frame sections 28, 220 together.

FIG. 15 A depicts the enclosure 10 after the end frame sections 28 and 220 have been clamped together in the above-described manner. In the enclosure 10 described above, the external portions of the frame assembly 22, the door assemblies 60, the roof plate 36 and the floor plate 38 of the equipment module, the walls 161, 162, 163 and floor plate 164 of the cable entry portion along with the ends of the frame assembly 210, the walls 228, the door assembly 60, 282, the floor 270 and the roof 272 of the equipment module form the "shell" 700 of the enclosure 10. Thus, in the above-described embodiment, the shell 700 is essentially fabricated from components that are fabricated from electrically conductive material such as aluminum and that are welded or otherwise fastened together. The shell 700 is essentially one common large box for electric field purposes. As will be discussed in further detail below, the power for powering components 12 within the enclosure 10 may be brought into the enclosure 10 through the magnetic field enclosure 230. Thus, the magnetic field is contained in or is other wise prevented from entering the equipment module section 20 of the shell 700 by virtue of the magnetic shield material 246 arrangement in the power module and the various power filter arrangements which will be discussed in further detail below.

In this embodiment, the power enters the magnetic field enclosure 230 through the front wall portion 240 that shares a common exterior wall 228 with the remaining portion of the enclosure 10. In alternative embodiments, power may be brought into the magnetic field enclosure 230 through an exterior wall that is common and contiguous with an exterior wall of the remaining portions of the enclosure 10. In the embodiments depicted in FIGS. 1, 2, 16 and 16A, a conventional junction box 231, fabricated from material such as aluminum or the like, may be attached to the exterior wall 228 by welding or other fastening methods. Conventional power cables 233 may enter the junction box 231 and be coupled to power filters 235 mounted to the exterior wall 228 and extending into the magnetic shield enclosure 230. Such power filters 235 may comprise those filters manufactured by Spectrum Control, Inc. of Erie, Pa. under Model No. 52-267-026. However, other commercially available power filters may be employed. As can be seen in FIGS. 16 and 16A, in one embodiment, the power filters 235 may be coupled to a conventional breaker box or main load center panel 237 mounted within the magnetic shield enclosure 230 through cables 237'. Exiting the main load center panel 237 are cables 239' that are attached to a terminal block 239 that is attached to the rear wall 250 of the magnetic shield enclosure 230. Filters 243 are attached to the terminal block 239 and may comprise those filters manufactured by Spectrum Control, Inc. under Model No. 52-257-005A or similar commercially available filters. The reader will appreciate that the function of such filters 243 is to filter RF and EMI interference that may be carried into the magnetic shield enclosure 230 by the incoming power cables 233. Of course, other suitable filters may be employed. Appropriately sized cables 510 may then be attached between the filters 243 and the various pieces of equipment 12 contained within the enclosure 10.

Figure 24:
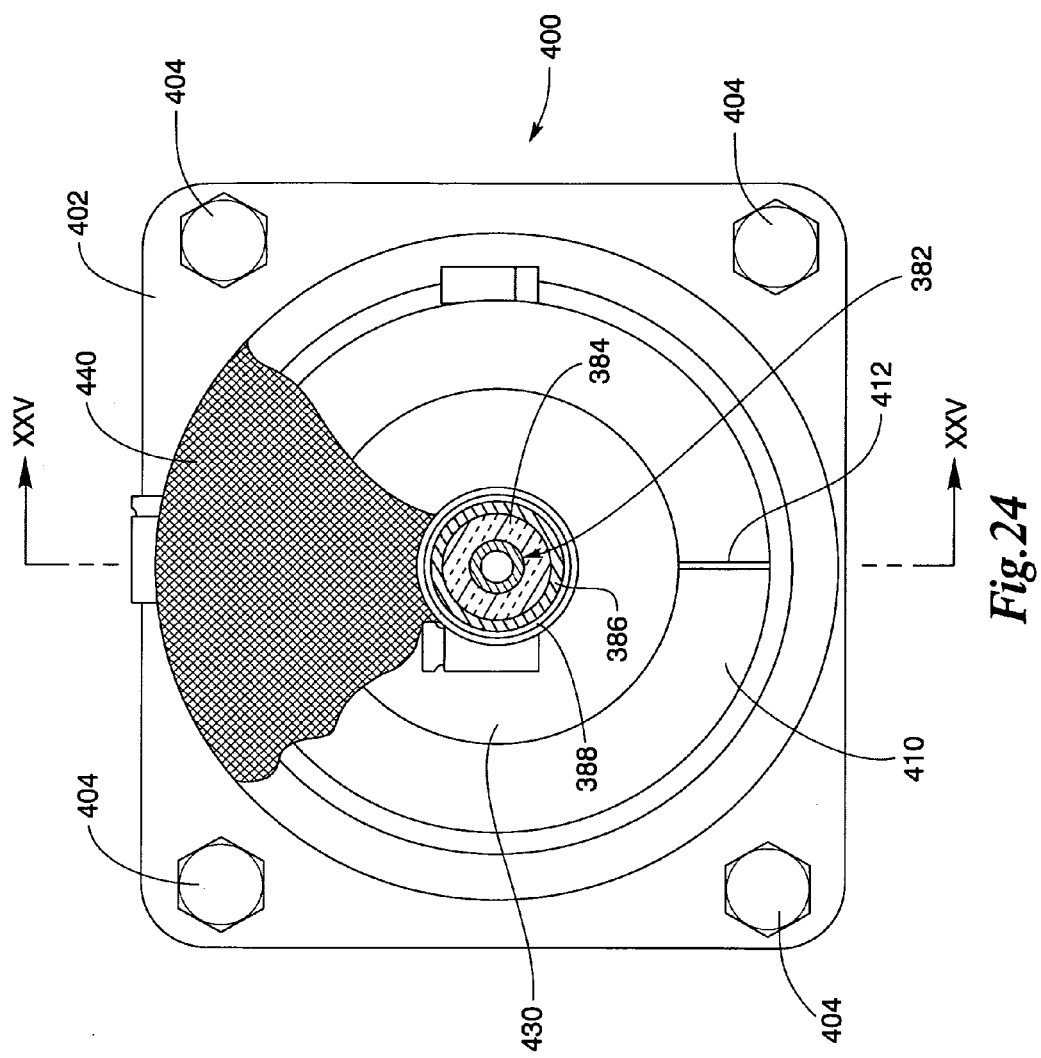
FIG. 24 is a front view of one embodiment of a cable port of the present invention.
Figure 25:
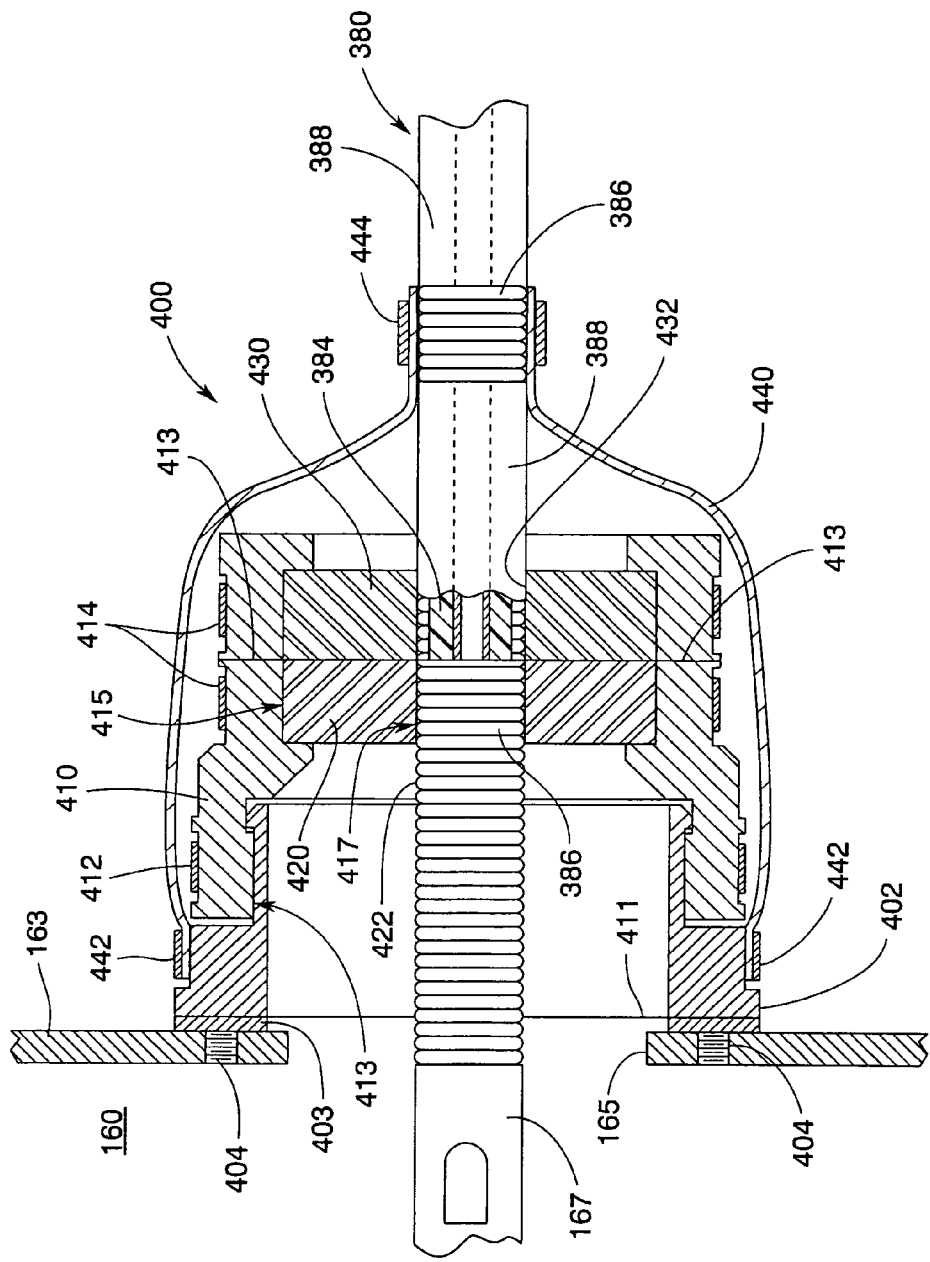
FIG. 25 is a cross-sectional view of the cable port of FIG. 24, taken along line XXV-XXV in FIG. 24.

FIGS. 24 and 25, illustrate one embodiment of an entry port 400 that may be used to supply signals to radio and cellular type equipment housed within the enclosure 10. Such ports 400 may be mounted to the cable entry portion 161 of the equipment module 20 as shown in FIGS. 1 and 2. The cable 380 that is commonly employed to supply antenna signal to such equipment is also shown in those Figures and in FIGS. 24 and 25. It will be understood that the cable 380 may have an inner hollow core 382 that is fabricated from copper or similar material. The inner core 382 is surrounded by an insulation material 384. An exterior core 386 also fabricated from copper or similar material is coaxially aligned on the insulation material 384. The cable 380 also has an insulation sheath 388 that covers the exterior core 386.

Although FIG. 1 illustrates the use of three entry ports 400, the skilled artisan will appreciate that any appropriate numbers of entry ports may be employed depending upon the power needs of the equipment housed within the enclosure 10. In the embodiment depicted in FIGS. 24 and 25, the power entry port 400 may include an attachment flange 402 that may be provided with bolt holes to facilitate attachment to the wall 163 of the cable entry portion 160 by bolts 404. Those of ordinary skill in the art will appreciate, however, that the attachment flange 402 may be attached to the wall 163 utilizing other fastening methods such as, for example, welding. In one embodiment, the attachment flange 402 is cast or machined from the material that has the same electrical grounding properties as the material making up the exterior of the enclosure 10. For example, if the exterior of the enclosure is fabricated from aluminum, then the attachment flange 402 may also be fabricated from aluminum. In such example, the bolts 404 used to attach the attachment flange 402 to the wall 163 may be fabricated from aluminum or stainless steel. In addition, in this embodiment, an EM/RFI flange gasket 403 of the types, for example, manufactured by Tech Etch, Inc. may be provided between the attachment flange 402 and the wall 163. Those of ordinary skill in the art will appreciate that the attachment flange 402 is attached to the wall 163 such that it covers the entry hole 165 through the wall 163 to permit the cable core 382 to pass through the port 400 into the cable entry portion 160 wherein a conventional cable fastener 167 may be attached thereto. The cable 380 would then be attached to the corresponding piece or pieces of equipment 12 housed within the equipment module 20. As can also be seen in FIG. 25, a boot assembly 410 may be coaxially received on the attachment flange 402 and be coupled thereto by a conventional adjustable strap clamp 412. In one embodiment, the boot assembly 410 is fabricated from material that is electrically compatible with the material from which the attachment flange 402 is fabricated. In one embodiment, for example, wherein the attachment flange 402 is fabricated from aluminum, the boot assembly 410 may be fabricated from the same material that is sold by Tech-Etch as its model 1000 series gasket material which will be compatible with aluminum also is an RFI/EMI shield.

Also in this embodiment, a first retainer shield or donut 420 may be supported within the interior of the boot assembly 410 as shown in FIG. 25. Such first retainer shield 420 has a hole 422 therethrough sized to receive a portion of the cable 380 therethrough. As can be seen in that Figure, a portion of the cable sheath 380 is removed to permit the exterior core 386 to be in contact with the first retainer shield 420. In one embodiment, the first retainer shield 420 may be fabricated from the Super Shield 1000 Series™ manufactured by Tech Etch, Inc. and which is compatible with the exterior core 386 which may be copper. Those of ordinary skill in the art will appreciate that the first retainer shield 420 may be compatible with copper and with the boot assembly 410 which may be compatible with aluminum. Such elements may be fabricated from appropriate types of metal filings embedded in a silicone core. To prevent the metal filings from possibly deteriorating, it may be desirable for them to be compatible with each other. As can be seen in FIG. 25, different areas of compatibility may be provided between the various elements of the entry port 400. For example, a first annular area of compatibility 411 may be provided between the end of the attachment flange gasket 403 and the exterior wall portion 228. A second annular compatibility area 413 may be provided between the attachment flange 402 and the boot assembly 410. In addition, a third annular compatibility area 415 may be provided between the exterior of the first retainer shield 420 and a portion of the boot assembly 410. The first retainer shield may also define a fourth annular compatibility area 417 between the first retainer shield 420 and the exposed core 386 of the cable 380.

Also in this embodiment, a second retainer donut or shield 430 may be employed and positioned within the boot assembly 410 adjacent to the first retainer shield 420. The second retainer shield 430 has a hole 432 therethrough that is sized to receive the cable 380 therein such that the exterior sheath 388 of the cable 380 contacts the second retainer shield 430. In one embodiment, the second retainer shield 430 is fabricated from silicone which serves to weatherproof the penetration into the enclosure. To facilitate installation of the first and second retainer shields 420, 430 into the boot assembly 410, the installer may create small slits 412 in portions of the boot assembly 410 to permit a portion of the outer perimeter of the boot assembly 410 to be peeled apart and flexed to a position wherein the first and second retainer shields 420, 430 are positioned as shown in FIG. 25. Thereafter, a pair of adjustable strap clamps 414 may be used to clamp the boot assembly 410 and the first and second retainer shields 420, 430 to the cable 380. The skilled artisan will appreciate that the entry port 400 of the present invention serves to substantially reduce the amount of RFI/EMI entering into the enclosure 10 from the cable 380 by channeling the interference from the cable core 386 to the first retainer shield 420 to the boot assembly 410 to the attachment flange 402 and through the flange gasket 403 before entering the enclosure 10.

In one embodiment of the present invention, if desired, an auxiliary shield 440 may be affixed to the entry port assembly 400 to enhance its shielding capabilities. As can be seen in FIGS. 24 and 25, the shield assembly may be flexible and shaped to be placed around the exterior of the entry port 400. In one embodiment, the shield assembly 440 may be fabricated from Super Shield 1000™ material or Weave Shield 5500™ material both manufactured by Tech-Etch, Inc. or similar material. One portion of the shield assembly 440 may be clamped around the perimeter of the attachment flange 402 with a conventional adjustable conduit clamp 442. Another portion of the shield assembly 440 may be clamped to the outer core portion 386 of the cable 380 also with a conventional adjustable conduit clamp 444 as shown in FIG. 25.

Figure 26:
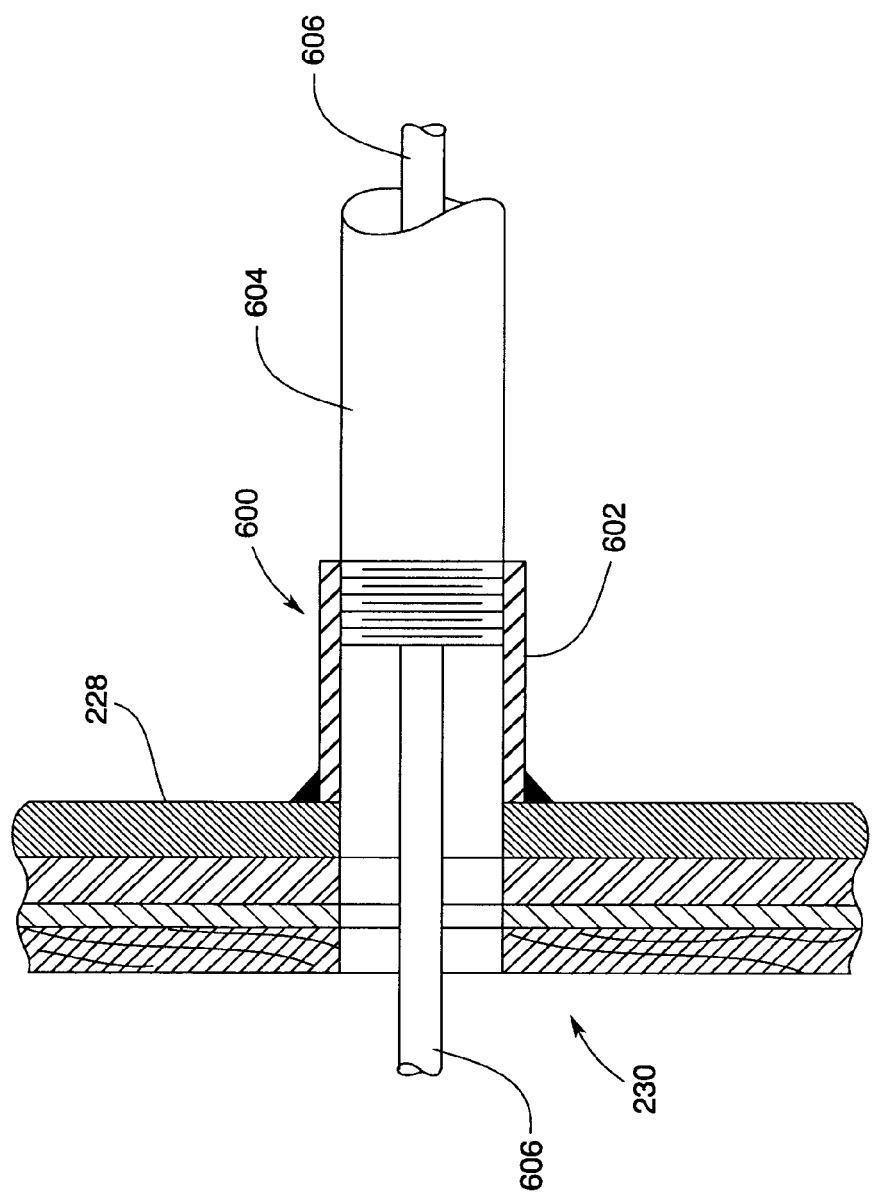
FIG. 26 is a cross-sectional view of another cable port embodiment of the present invention.

FIG. 26 illustrates an alternate cable entry port 600 that may be used in connection with the present invention. The cable entry port 600 comprises a threaded socket 602 that is welded or otherwise attached to the wall 163 of the cable entry portion 160. The socket 602 is adapted to be attached to corresponding threaded conduit 604 that is carrying one or more cables 606 therein. The cable 606 extends through the conduit 604 and socket 602 and into the cable entry portion 160 of the equipment module to be coupled to the corresponding pieces of equipment 12 housed therein. In one embodiment, the threaded socket 602 is fabricated from the same material that comprises the wall 228. For example, the threaded socket may be fabricated from aluminum.

In embodiments wherein the equipment 12 within the enclosure may be connected to instrumentation and other equipment, such as, for example, meters, transducers, etc, that are located outside of the enclosure 10, cable entry ports 400 and/or 600 may be installed in the wall of the cable entry portion 160 to facilitate passage of cables 622 from equipment 12 to the instrumentation.

Thus, in this embodiment, the shell 700 is fabricated from an electrically conductive material such that when a lightning strike hits in the vicinity or otherwise communicates with the enclosure 10, the shell 700 provides a path for the electric current to safely reach ground. In one embodiment, a commercially available grounding rod 800 (preferably 5'-6' long) is inserted into the earth and is connected to the enclosure by a copper wire 802 or other suitable conductor. See FIG. 1. Thus, when the shell 700 conducts electrical current from a lightning strike, the energy passes through the conductor 802 to the grounding rods 800 to the earth to "ground" the enclosure 10. The skilled artisan will, of course, appreciate that the number, size, composition of grounding rods 800 and even the grounding method employed could vary depending upon the type, size, shape, composition, etc. of the enclosure. The skilled artisan will appreciate that electrical current is conducted through the shell 700 to ground. As the current passes through the shell 700 it establishes an eddy current field (magnetic field) in the shell 700 that serves to repel magnetic fields that occur external to the shell 700 to prevent such externally occurring fields from damaging or interfering with the equipment 12 housed within the enclosure 10.

As was discussed above, in this embodiment, the magnetic field enclosure 230 shares a wall portion 228 with the shell 700. The external power is brought into the enclosure 10 through the common wall portion 228 and into the power filters mounted to the magnetic shield enclosure 230. The power entering the enclosure 10 through the common wall 228 also results in the establishment of eddy currents in the shell 700 which also serve to repel magnetic fields established outside of the enclosure 10. Those of ordinary skill in the art will appreciate that the magnetic field enclosure 230 serves to contain the magnetic field entering the shell 700 on the cables 233 that enter the enclosure 10. The power cables 233 are attached to filters 235 which are connected to a main load center panel 237. The main load center panel 237 is then attached to filters 243 which enable the power to be distributed to the components 12 within the enclosure while substantially preventing magnetic fields contained within the shielded enclosure from entering the equipment module 20. Thus, the magnetic filed enclosure 230 is effectively grounded at the cable entry point and at the terminal block.

Figure 27:
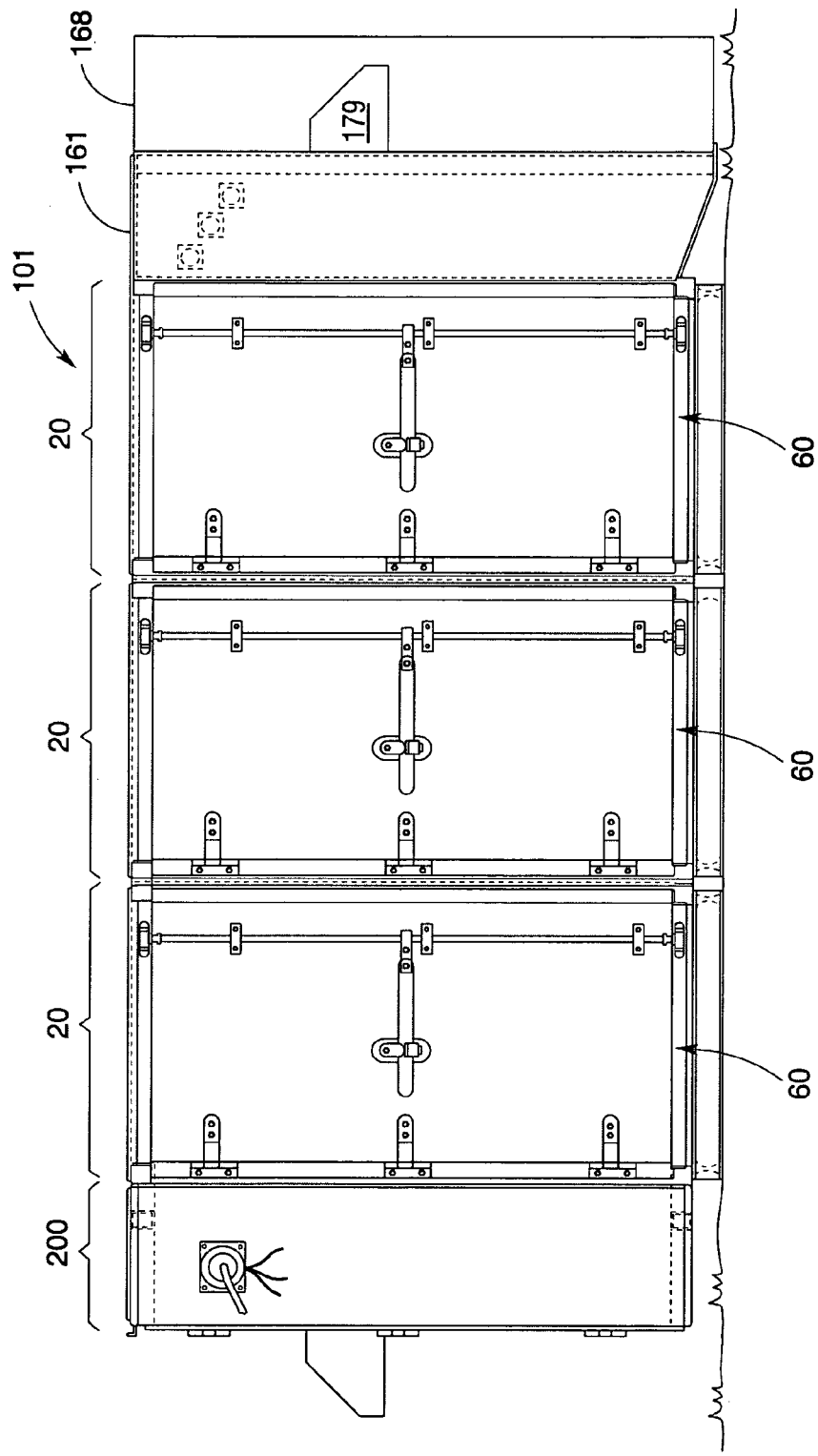
FIG. 27 is a side elevational view of another enclosure embodiment of the present invention.
Figure 27A:
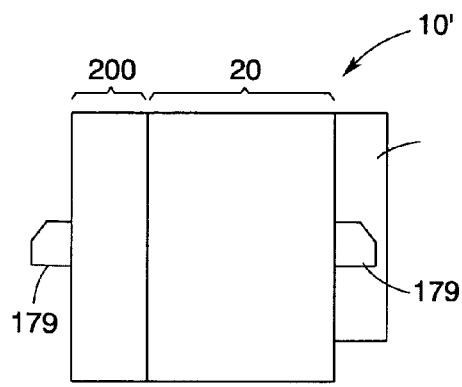
FIG. 27A is a diagrammatic side elevational view of another enclosure embodiment of the present invention.
Figure 27B:
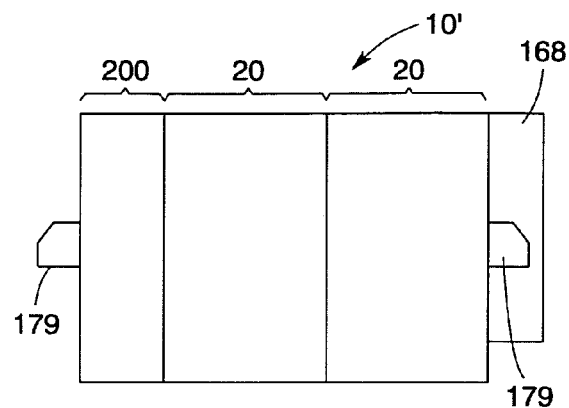
FIG. 27B is a diagrammatic side elevational view of another enclosure embodiment of the present invention.
Figure 27C:
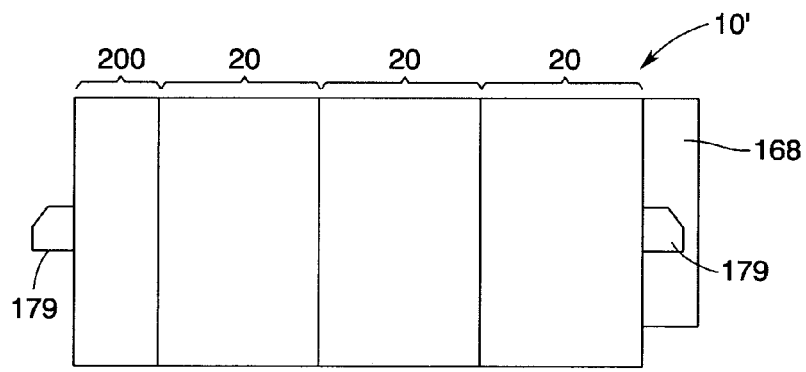
FIG. 27C is a diagrammatic side elevational view of another enclosure embodiment of the present invention.
Figure 27D:
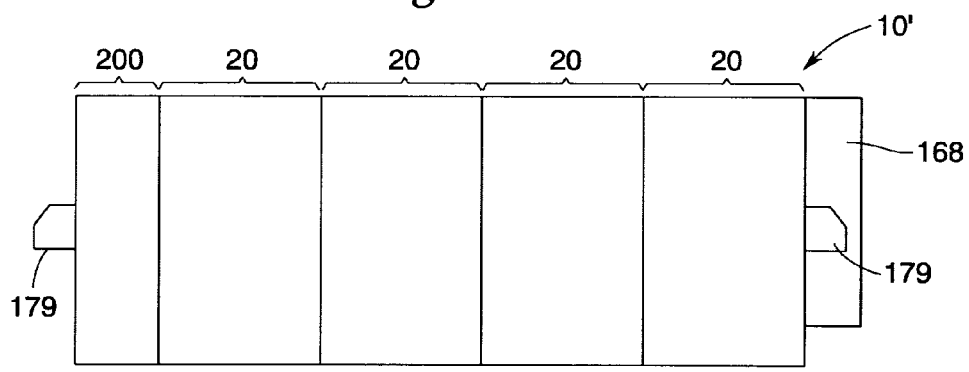
FIG. 27D is a diagrammatic side elevational view of another enclosure embodiment of the present invention.

Those of ordinary skill in the art will readily appreciate that the size and shape of the enclosure 10 may be varied without departing from the spirit and scope of the present invention. For example, FIG. 27 illustrates an enclosure 10' that may be fabricated in the above described manners and be provided with three interconnected equipment modules 20 and a power module 200 that may be constructed with the components and methods described above. FIG. 27A illustrates one embodiment with one power module 200 and one equipment module 20. FIG. 27B illustrates an embodiment that has one power module 200 and two equipment modules 20. FIG. 27C illustrates an embodiment with one power module 200 and three equipment modules 20. FIG. 27D illustrates an embodiment with one power module 200 and four equipment modules 20. Other numbers of equipment modules, door enclosures, fan and vent arrangements may be employed without departing from the spirit and scope of the present invention.

Figure 28:
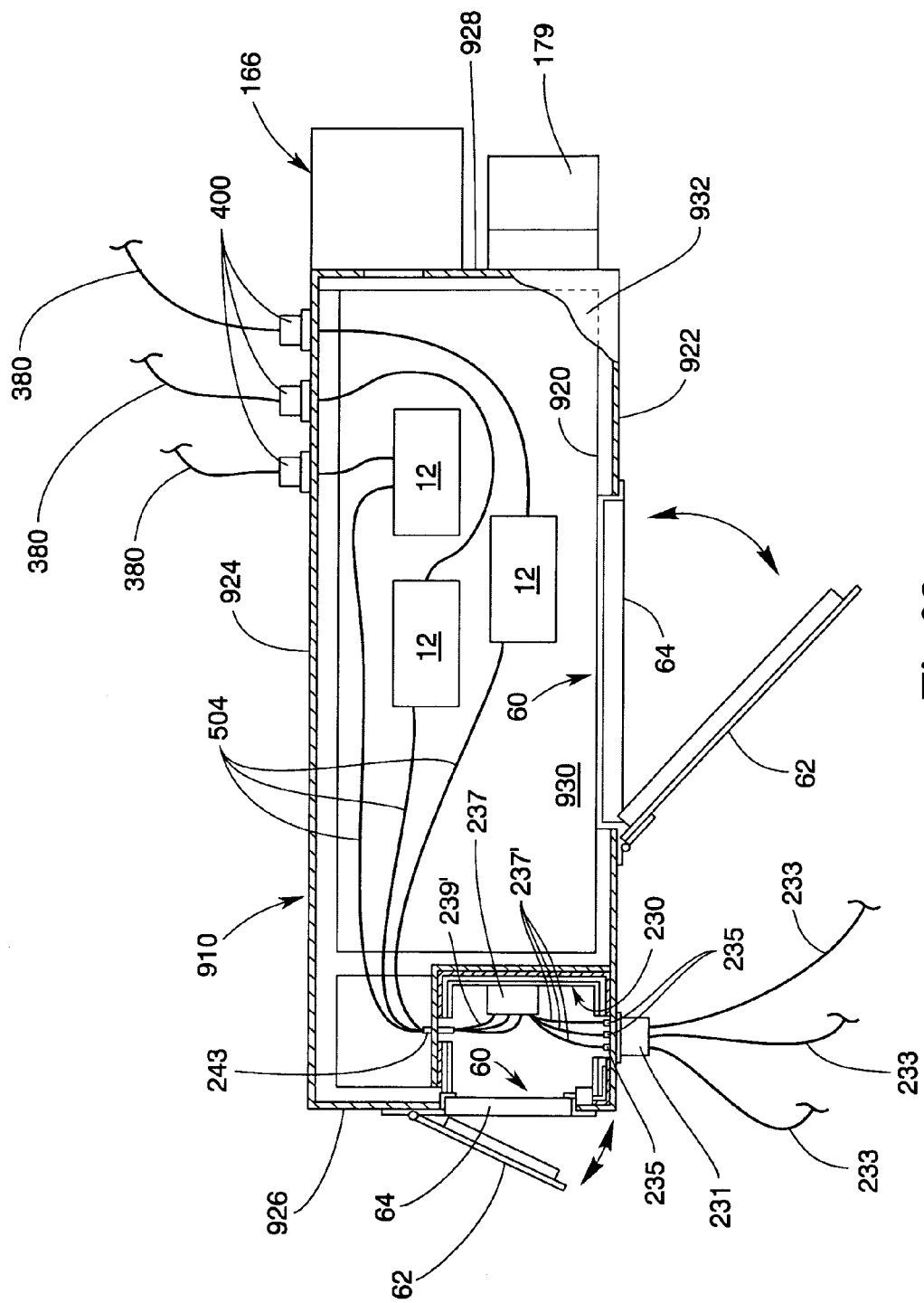
FIG. 28 is a top cross-sectional view of another enclosure embodiment of the present invention.

The skilled artisan will further appreciate that the enclosure 10 may have a common frame assembly as an alternative to the modular frame arrangements of the enclosures described above. More particularly and with reference to FIG. 28, an enclosure 910 is shown that has a frame assembly 920 that may be fabricated from tubular material such as tubular aluminum pieces that are welded together. Attached to the frame assembly 920 is a front wall 922, a rear wall 924, two end walls 926, 928, a floor 930 and a roof 932 which may all comprise aluminum plate or plate material fabricated from the same or similar material from which the frame assembly is fabricated. The floor 930 may be mounted on aluminum or similar I-beams and channels (not shown) as was described above. Door entries 60 may be provided in the front wall 922 and end wall 926 and other walls as desired. The doors 62 and doorframes 64 may be fabricated in the manners described above.

In this embodiment, a magnetic field enclosure 230 which may be fabricated in the manners described above, shares the front wall 922. Power is brought into the magnetic field enclosure 230 in the manners described above. That is the power cable(s) 233 may enter a junction box 231 attached to the exterior wall 922 and be attached to corresponding power filters 235 mounted in the exterior wall 922 as described above. The power filters 235 are then attached to a main load center panel 237 that may container circuit breakers (not shown). The main load center panel may then be coupled to one or more filters 243 mounted in a terminal block 239 through cables 239'. Cables 504 then transport the power from the filters 239 to the components 12 housed within the enclosure 910. If the components 12 communicate with equipment located external to the enclosure 910 through cables 380, the cables 380 may exit the enclosure 920 through ports 400 or, for example, ports 600 of the type described above. In this embodiment, anyone of the door embodiments depicted in FIGS. 5, 13, 13A, and 13B could conceivably be employed in connection with the magnetic shield enclosure 230. The shielding action of the enclosure 910 operates in the same manner as was described above for enclosures 10 and 10'.

Figure 29:
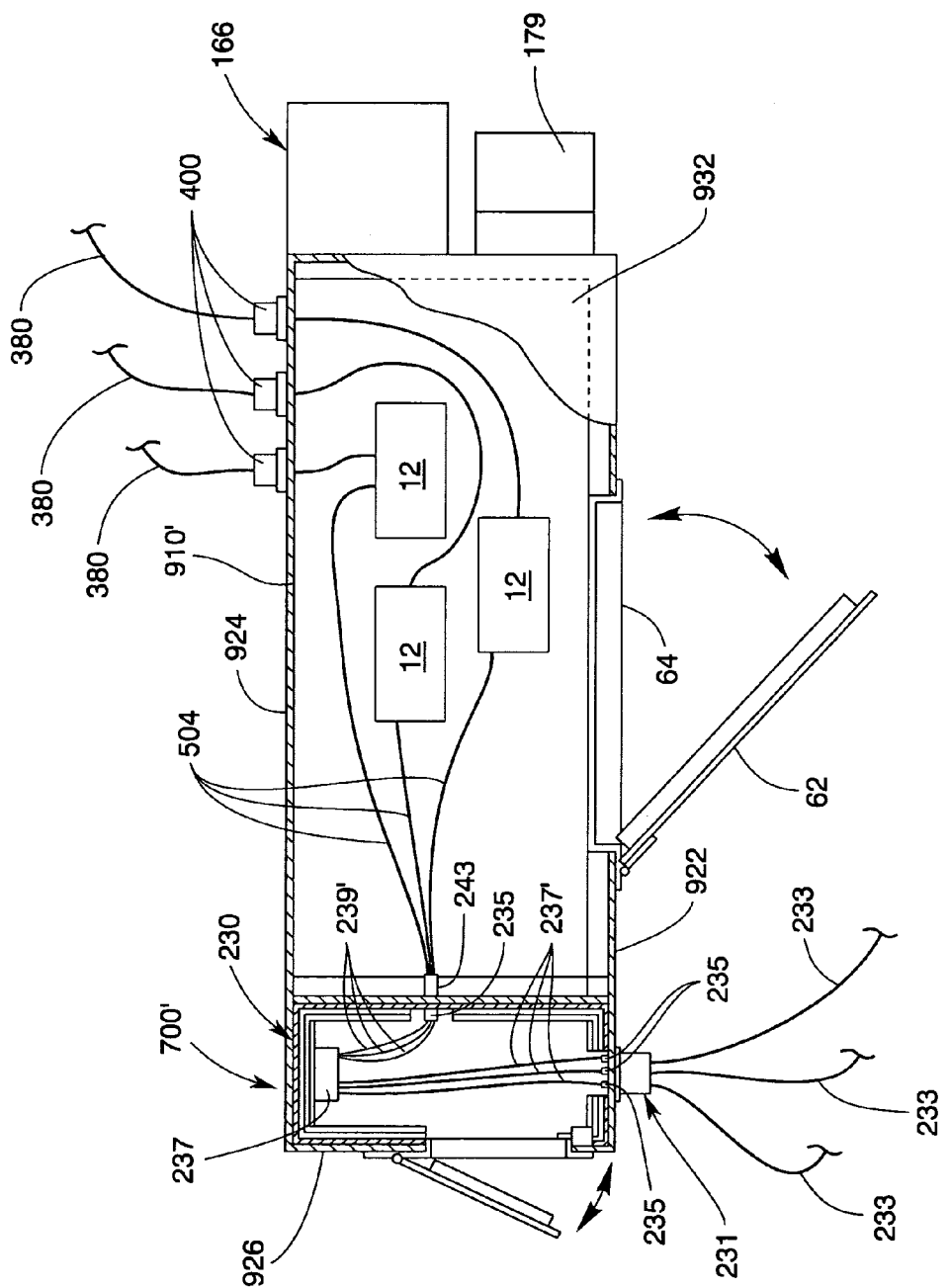
FIG. 29 is a top cross-sectional view of another enclosure embodiment of the present invention.

FIG. 29 illustrates another enclosure embodiment 910' which may be identical in construction to enclosure 910 described above. However, in this embodiment, the magnetic field enclosure 230 shares front wall 922, rear wall 924 and end wall 926 of the shell 700'. The reader will also appreciate that the enclosure 910 operates in the manners described above with respect to enclosure 10.

Figure 30:
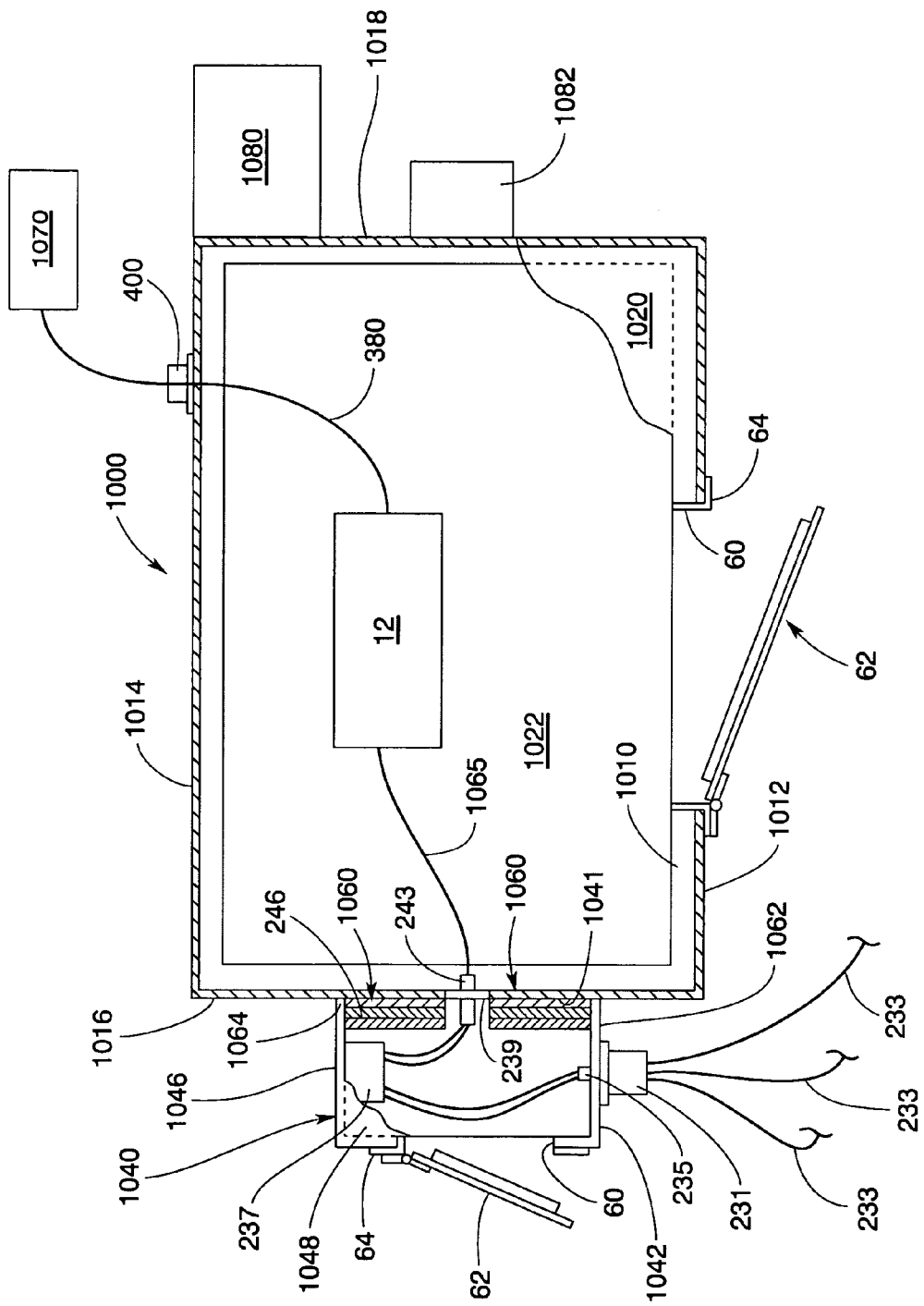
FIG. 30 is a top cross-sectional view of another enclosure embodiment of the present invention.

FIG. 30 illustrates another enclosure 1000 of the present invention. In this embodiment, the enclosure 1000 has a frame assembly 1010 that is fabricated from electrically conductive material. A front wall 1012, a rear wall 1014, and two end walls 1016 and 1018 maybe attached to the frame assembly 1010. The walls 1012, 1014, 1016, 1018 maybe fabricated from electrically conductive material such as, for example, aluminum and be attached to the frame assembly by welding.

One or more door entries 60, which include the doorframes 64 and door 62 of the types described above may be provided in one or more of the walls 1012, 1014, and 1018. In addition, a roof 1020 and a floor 1022 may also comprise electrically conductive material such as aluminum and be attached to the frame assembly 1010 by welding. The above-mentioned components, i.e., frame assembly 1010, walls 1012, 1014, 1016, 1018, roof 1020, floor 1022 and doorframe 64 and door 62 serve to comprise a shell designated as 1030. The shell 1030 may be grounded in the manners described above.

Also in this embodiment, a magnetic shield enclosure 1040 is attached to the end wall 1016 such that wall 1016 forms a common exterior wall portion 1041 therebetween. In this embodiment, the magnetic shield enclosure 1040 may be fabricated from electrically conductive material such as aluminum plate to form walls 1042, 1044 and 1046, a roof 1048 and a floor 1050. A door entry 60, including door 62 and a doorframe 64, may be provided in wall 1046. Magnetic shield material 246 may be attached directly to the common wall portion 1041 by adhesive or, if desired, a filler material 1060, such as plywood 1062 and/or insulation 1064 may be provided between the magnetic shield material 246 and the common wall portion 1041. The magnetic shield material 246 may be attached to the plywood 1062 which may be attached to the insulation 1064 which may be attached to the common exterior wall portion 1041. Power cables 233 may enter through a junction box 231 attached to the wall 1042. The cables 233 may then be coupled to power filters 235 mounted in the wall 1042. The power filters 235 may then be coupled to a main load center panel 237 that may contain circuit breakers. The circuit breaker are then coupled to filters 243 mounted in a terminal block 239 mounted in the wall 1060 through cables 239'. The filters 243 may be connected to the equipment 12 housed within the shell 1030 through cables 1065. If desired, ports 400 or 600 may be provided in wall 1014 to permit the passage of cables 1067 from equipment 12 to equipment 1070 located external to the enclosure 1000. Also if desired, an air conditioner 1080 and shutter and fan assembly 1082 of the types described above may be mounted to the end wall 1018. Those of ordinary skill in the art will appreciate that enclosure 1000 operates in the same manners as described above with respect to enclosures 10 and 10'.

Figure 31:
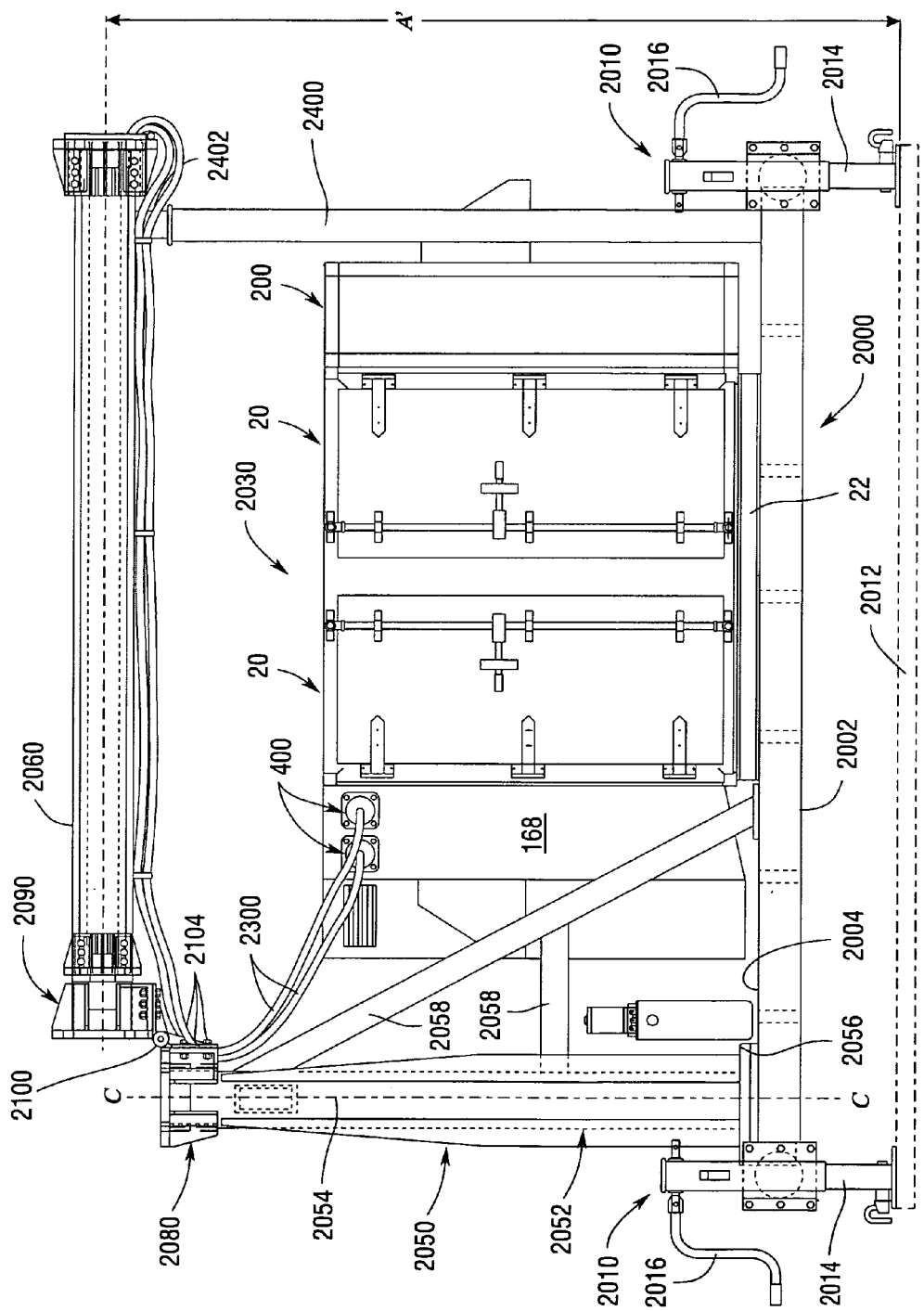
FIG. 31 is a side elevational view of a platform and enclosure embodiment of the present invention used in connection with an embodiment of an articulated antenna mast of the present invention.
Figure 32:
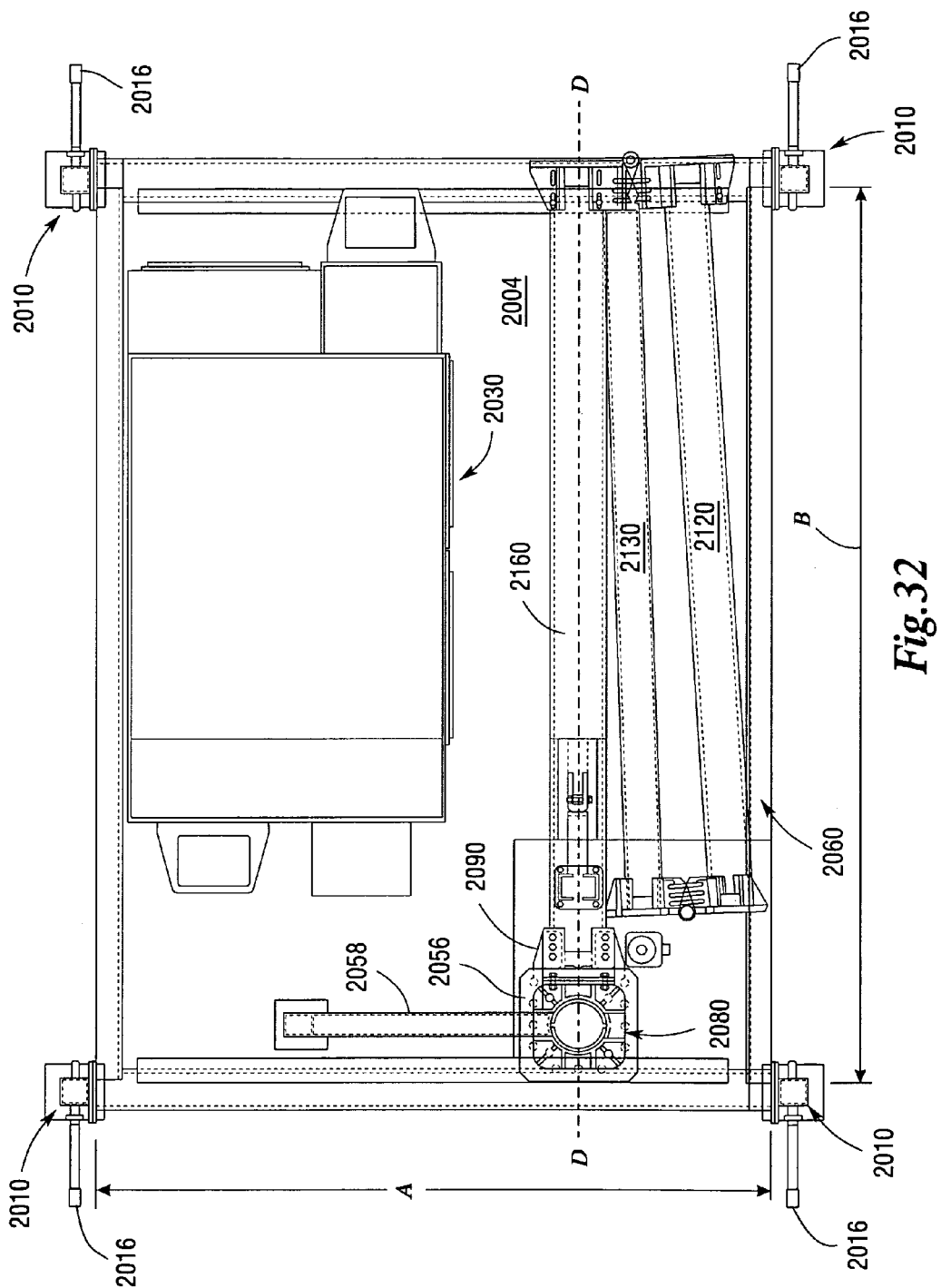
FIG. 32 is a plan view of the platform and enclosure embodiment of FIG. 31, with the articulated antenna embodiment in a folded position.
Figure 33:
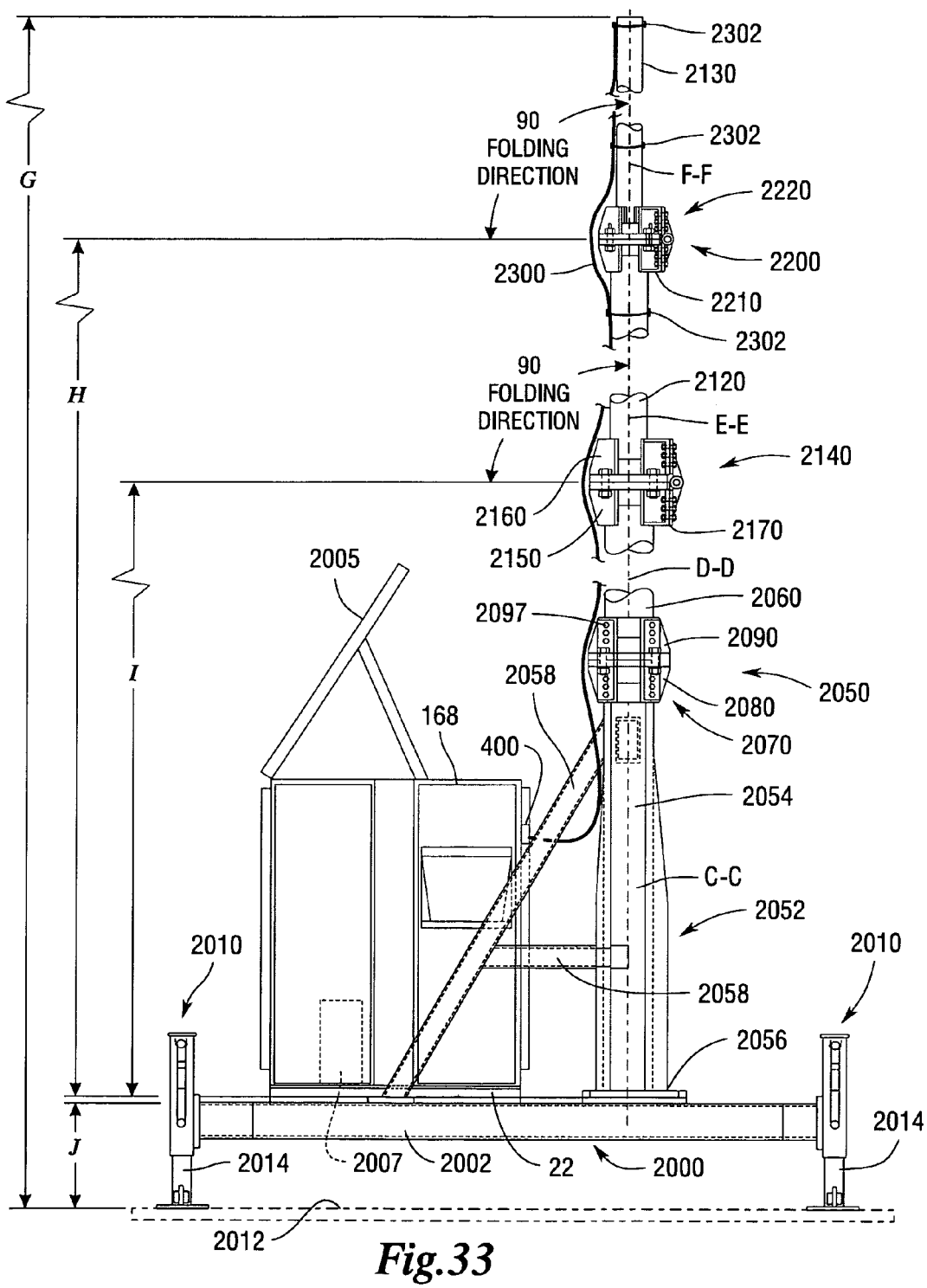
FIG. 33 is an end elevational view of the platform and enclosure embodiment of FIGS. 31 and 32 with the articulated antenna embodiment thereof in an extended position.

FIGS. 31-33 illustrate a shielded enclosure 2030 of the type and construction described above mounted to a platform 2000. In one embodiment, the platform 2000 is relatively portable. For example, certain embodiments may be constructed such that they may be transported by truck or other conventional motor vehicles. Other embodiments may be transported to remote locations by, for example, helicopter or fixed wing aircraft. In other embodiments, however, the platform 2000 may be designed to be relatively permanent. The platform 2000 is fabricated from an electrically conductive frame 2002 that may be fabricated from, for example, carbon steel, stainless steel, aluminum, and other electrically conductive metal beams, tubing, angles, etc. that may be welded or bolted together. One or more panels 2004 may be supported on the platform frame 2002 and attached thereto by appropriate fasteners (i.e., screws, bolts, etc.). Panels 2004 may be fabricated from, for example, wood, composite materials, polymer materials, steel, aluminum, etc. Platform 2000 could conceivably be fabricated in a variety of different shapes and sizes. In one embodiment, for example, the platform 2000 is approximately 8'-6" wide (dimension "A" in FIG. 32) and 12' long (dimension "B" in FIG. 32). However, it may be advantageous to size the platform 2000 such that it is relatively easy to transport with conventional means, yet provides sufficient deck space to support the desired components and enclosures as will be discussed in further detail below.

In one embodiment, a leg assembly 2010 is attached to each corner or other portions of the platform 2000. The leg assembly 2010 may comprise an electrically conductive member that is fabricated from the same or similar material comprising the frame 2002 and be welded, bolted, screwed, etc. thereto. The leg assemblies 2010 serve to support the platform 2000 above the ground or other surface 2012 and conduct electricity passing through the frame 2002 (resulting from, for example, a lightening strike) to the ground 2012.

In the embodiment depicted in FIGS. 31-33, the leg assemblies 2010 comprise an extendable and retractable leg member 2014 that may be selectively vertically extended and retracted with a hand crank 2016 to orient the platform 2000 at a desired height above the ground and to provide a means for leveling the platform 2000. In one embodiment, those leg assemblies manufactured by Ralph K. Bodmann Corporation of 1750 Costner Drive, Unit F, Warrington, Pa. 18976 under product number 182800/015181 may be employed. In this embodiment, each leg member 2014 may be bolted to the frame 2002 or otherwise attached thereto such that electricity will freely pass from the platform frame 2002 to one or more of the leg members 2014.

In this embodiment, any of the enclosures of the type and construction described above may be supported on the platform 2002. For example the enclosure 2030 in FIGS. 31-33 may include two equipment modules 20, one power module 200 and a temperature module 168 that are interconnected and fabricated in the manners described above and include an electrically conductive frame assembly 22. The frame assembly 22 is attached to the platform frame 2002 such that electrical current may pass from the frame assembly 22 to the platform frame 2002, through leg assemblies 2010 to ground 2012. The frame assembly 22 may be attached to the platform frame 2002 by, for example, welding, screws, bolts, etc. For remote applications, one or more solar panels 2005 may be supported on the enclosure 2030 or platform 2002 or be mounted independent from the platform and enclosure, depending upon the application, to provide power for components within the enclosure 2030. In other applications, fuel cells 2007 or propane, gasoline or diesel fuel powered generators could also be employed if desired.

The embodiment depicted in FIGS. 31-33 may also include a selectively extendable mast 2050. The mast 2050 may be articulated in nature and include a mast base 2052 that comprises an upstanding mast post 2054 that is attached to the platform frame 2002 such that electrical current passing through the mast base 2052 may pass through the platform frame 2002 through one or more of the leg assemblies 2010 into ground. Mast post 2054 may be fabricated from schedule 40, schedule 60, schedule 80, schedule 120 seamless aluminum pipe, for example, and have a fastening plate 2056 attached thereto. However, depending upon the application, steel pipe or other metal structural components could be used. The fastening plate 2056 may be welded, bolted, etc. to the mast post 2054 and be attached to the platform frame 2002 by welding, bolting, etc. such that the mast base 2052 is electrically grounded to the platform. One or more braces 2058 may be attached between the post 2054 and the platform frame 2002 to support the mast post 2054 in an upright position. For example, the embodiment depicted in FIGS. 31-33 employs two braces 2058 to support the mast post 2054 in an upstanding position. Mast post 2054 has an axis designated as C-C in FIGS. 31 and 33.

Figure 35:
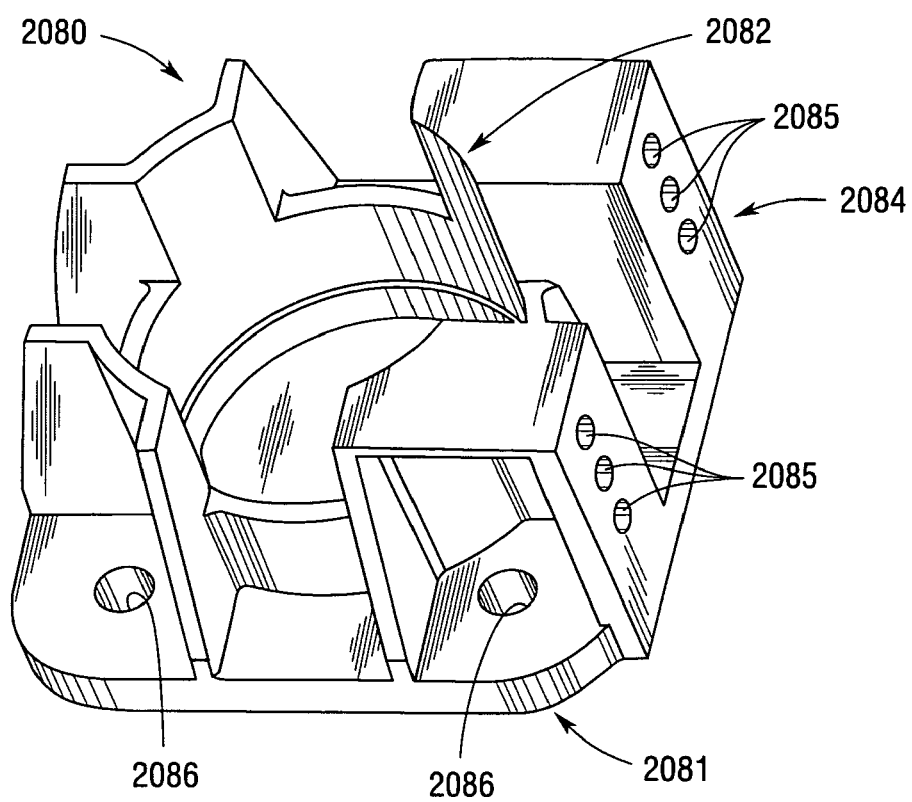
FIG. 35 is a perspective view of one hinge block embodiment of the present invention.
Figure 36:
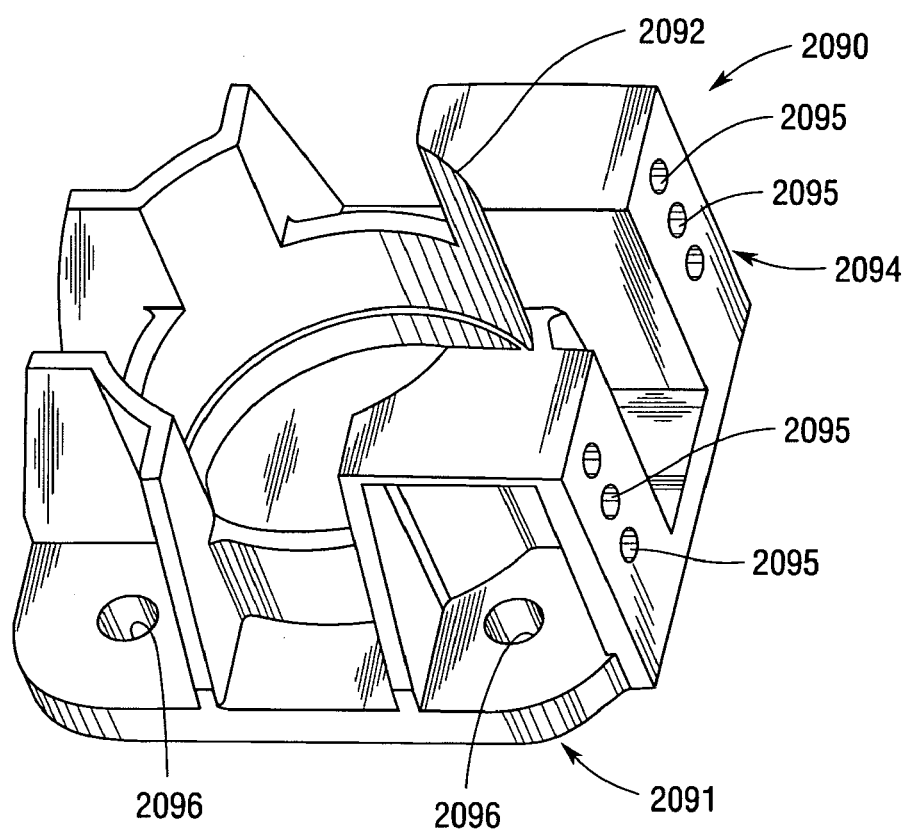
FIG. 36 is a perspective view of another hinge block embodiment of the present invention.
Figure 37:
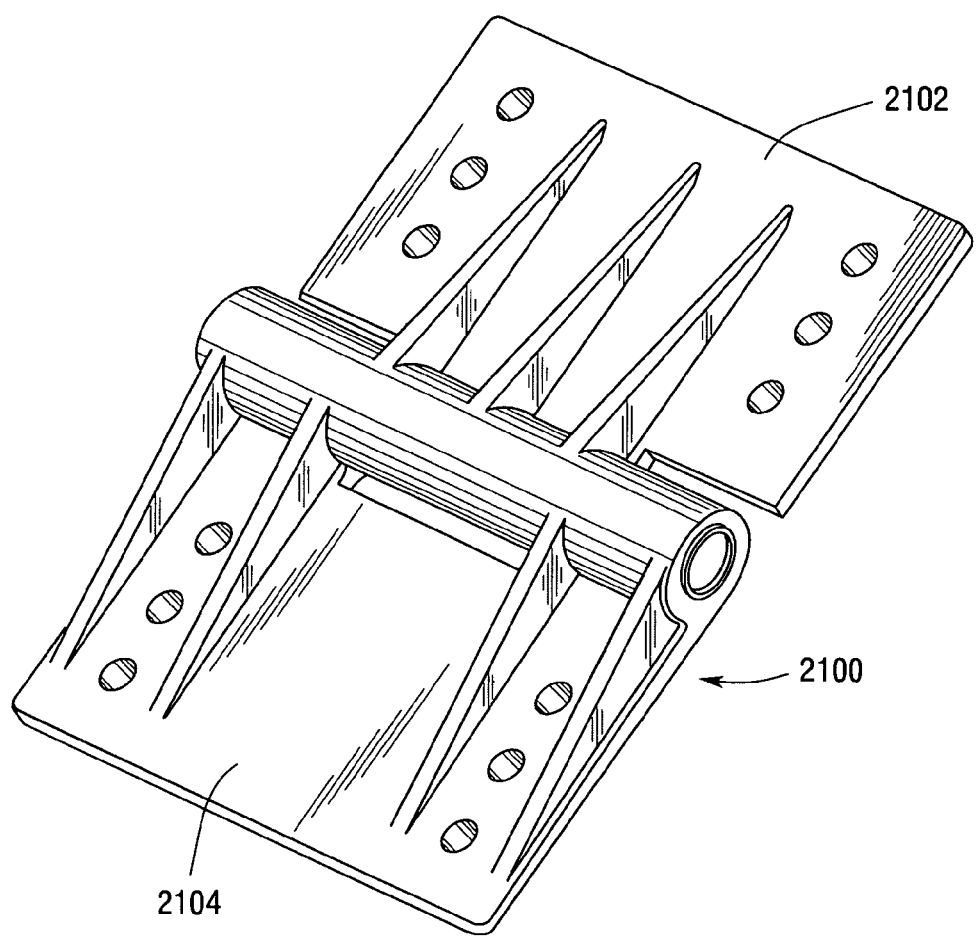
FIG. 37 is a perspective view of a hinge embodiment of the present invention.

The mast 2050 may also include a plurality of mast segments that may be pivotally interconnected in a serial arrangement in the following manner. More specifically and with reference to FIGS. 31, 33, 34-34G and 35-37, the upstanding mast post 2054 may be attached to a first mast segment 2060 by a first joint assembly 2070 such that the first mast segment 2060 may be selectively pivoted between a position wherein the axis D-D of the first mast segment 2060 is coaxially aligned with the axis C-C of the mast post 2054 (FIG. 33) and other positions wherein the axis D-D is not coaxially aligned with axis C-C (FIGS. 31 and 32). In one embodiment, the first joint assembly 2070 comprises a first hinge block 2080 and a second hinge block 2090. First hinge block 2080 may be fabricated (welded, cast, etc.) from, for example, steel, aluminum, stainless steel and be configured as shown in FIG. 35. As can be seen in FIG. 35, the first hinge block 2080 includes a mast socket 2082 that is sized to receive an upper end of the mast post 2054 therein. Once the end of the mast post 2054 is received within the mast socket 2082, the first hinge block 2080 may be welded or otherwise attached to the end of the mast post 2054. See FIGS. 31, 33 and 34B. The first hinge block 2080 also has a hinge attachment surface 2084 provided adjacent the mast socket 2082 as shown in FIG. 35 for supporting a first portion 2102 of a hinge 2100 of the type depicted in FIG. 37. Hinge attachment surface 2084 has a plurality of holes 2085 therethrough for attaching the first portion 2102 of the hinge 2100 to the hinge attachment surface 2084 by bolts 2104 or other suitable fasteners. See FIGS. 31 and 34F. The end of the first hinge block 2080 may comprise a flat surface 2081 and have a plurality of holes 2086 therethrough. See FIG. 35.

The second hinge block 2090 may be identical to the first hinge block 2080 if desired. However, if the diameter and/or shape of the first mast segment 2060 differs from the diameter and/or shape of the mast post 2054, the "first" socket 2092 in the second hinge block 2090 will have to be sized and shaped accordingly to receive an end of the first mast segment 2060 therein. For example, in one embodiment, the mast post 2054 is fabricated from eight inch schedule 80 extruded aluminum pipe and the first mast segment 2060 is fabricated from eight inch schedule 80 extruded aluminum pipe. The second hinge block assembly 2090 may be attached to the end of the first mast segment 2060 by welding or other suitable fasteners and include a hinge attachment surface 2094 that has a plurality of holes 2095 therethrough for receiving bolts 2097 to affix a second portion 2104 of hinge 2100 thereto. See FIGS. 36 and 34F. The second portion 2104 of the hinge 2100 may be attached to the second hinge block 2090 by bolts 2106 or other appropriate fasteners. The end of the second hinge block 2090 may comprise a flat surface and have a plurality of holes 2096 therethrough.

Thus, when coupled in the above-described manners, the first mast segment 2060 may be pivoted about a pivot axis defined by hinge 2100 between the position wherein the first mast segment 2060 is coaxially aligned with the mast post 2054 (FIGS. 33, 34B, 34F) and other positions including the position shown in FIGS. 31 and 32, wherein it is substantially parallel to the platform 2000. When in the position shown in FIGS. 33, 34B, 34F, the ends of the first and second hinge blocks are in confronting relationship and the holes 2086 in the first hinge block 2080 are aligned with corresponding holes 2096 in the second hinge block 2090 to permit retaining bolts 2099 to be inserted therethrough to rigidly couple the ends of the first and second hinge blocks 2080, 2090 together in the coaxially aligned position. In alternative embodiments, the first and second hinge blocks 2080, 2090, respectively, may be releasably retained together in the coaxially aligned position by other releasable retaining means such as releasable clamps or other suitable fasteners.

The embodiment depicted in FIGS. 31-33 and 34-34H includes a second mast segment 2120 and a third mast segment 2130. The second mast segment 2120 may be pivotally coupled to the first mast segment 2060 by a second joint assembly 2140 that comprises a third hinge block 2150 and a fourth hinge block 2160. Third hinge block 2150 and fourth hinge block 2160 may be identical in construction as the first and second hinge blocks 2080, 2090, except, perhaps, for the sizes of their respective mast sockets. For example, in one embodiment the second mast segment 2120 is fabricated from six inch schedule 40 extruded aluminum pipe. Thus, the mast socket in the fourth hinge block 2160 is sized to receive the end of the second mast segment 2120 therein and be attached thereto. The mast socket in the third hinge block 2150 would be sized to receive the other end of the first mast segment 2060 therein. The third and fourth hinge blocks 2150, 2160 would then be attached together by a second hinge 2170 that is coupled to the third and fourth hinge blocks 2150, 2160 by bolts 2172 or other suitable fasteners. See FIG. 34C. Such arrangement permits the axis E-E of the second mast segment 2120 to be selectively pivoted about a second pivot axis defined by the second hinge 2170 between a position wherein it is coaxial with the axis D-D of the first mast segment 2060 (FIGS. 33, 34, 34C, 34G) and other positions such as those shown in FIGS. 31 and 32. When in the position shown in FIGS. 34C, 34G, the ends of the third and fourth hinge blocks are in confronting relationship such that retainer bolts 2199 may be inserted into the coaxially aligned holes in the third and fourth hinge blocks 2150, 2160 to releasably retain the third and fourth hinge blocks 2150, 2160 in such coaxially aligned position in the same or similar manner as the second hinge block 2090 is attached to the end of the first hinge block 2080.

The third mast segment 2130 may be pivotally coupled to the second mast segment 2020 by a third joint assembly 2200 that comprises a fifth hinge block 2210 and a sixth hinge block 2220. Fifth hinge block 2210 and sixth hinge block 2220 may be identical in construction as the first, second, third and fourth hinge blocks 2080, 2090, 2150, 2160 except for the sizes of their respective mast sockets. For example, in one embodiment the third mast segment 2130 is fabricated from four inch extruded aluminum pipe. Thus, the mast socket in the sixth hinge block 2220 must be sized accordingly to receive the end of the third mast segment 2130 therein and be attached thereto. The mast socket in the fifth hinge block 2210 would be sized to receive the other end of the second mast segment 2120 therein. The fifth and sixth hinge blocks 2210, 2220 would then be attached together by a third hinge 2230 that is coupled to the fifth and sixth hinge blocks 2210, 2220 by bolts 2232 or other suitable fasteners. See FIG. 34D. Such arrangement permits the axis F-F of the third mast segment 2130 to be selectively pivoted between a position wherein it is coaxial with the axes D-D and E-E of the first and second mast segments 2060, 2120, respectively (FIG. 33) and other positions such as those shown in FIGS. 31 and 32. When in the position shown in FIGS. 33, 34D and 34H, the ends of the fifth and sixth hinge blocks are in confronting relationship such that retainer bolts 2234 may be inserted into the coaxially aligned holes in the fifth and sixth hinge blocks 2210, 2220 to releasably retain the ends of the fifth and sixth hinge 2210, 2220 blocks in such coaxially aligned position.

FIGS. 34I-34N illustrate various arrangements of mast segments of the present invention. For example, FIGS. 34I-34K illustrate a mast 2050 wherein the second mast segment 2120 is arranged to be pivoted adjacent the first mast segment 2060 and the third mast segment 2130 is pivoted adjacent to the second mast segment 2120 when the mast 2050 is in the folded position. See FIGS. 34J and 34K. FIGS. 34L-34N illustrate yet another arrangement of mast segments of an embodiment of the extendable mast of the present invention. In this arrangement, the third mast segment 2130 is arranged to be pivoted adjacent the first mast segment 2060 and between the first and second mast segments when in the folded position. See FIGS. 34M and 34N.

To support the end of the first mast segment 2060 when in the folded state as shown in FIG. 31, a support post assembly 2400 may be attached to the platform 2000 and fitted with a cradle member 2402 for supporting the end of the first mast segment 2060 therein. In one embodiment, when the mast 2050 is in the folded position 2050 as shown in FIG. 31, the distance "A'" may be approximately 9'-2". However, the distance will vary with the height of the platform, the length of the leg assemblies and the length of the mast post 2054 as desired.

When in the extended position, appropriate antenna cables or conductors 2300 may be attached to the mast 2050 by, for example, clamps 2302 or other connectors such as those manufactured by Times Microwave Systems of 358 Hall Ave, Wallingford, Conn. under product number 114BC. See FIG. 33. However, other methods of attaching the antenna conductor may be employed. The end of the antenna conductor extends through the shell wall that is adjacent to the magnetic shield enclosure such that the conductor enters the magnetic shield enclosure and a portion of the conductor exits the magnetic shield enclosure into the shell and be coupled to the equipment within the equipment modules.

The reader will appreciate that the overall length of the mast 2050 when extended may vary depending upon the various lengths and numbers of the mast segments employed. For example, in the embodiment depicted in FIG. 33, the distance "G" is approximately 39', the distance "H" is approximately 28', the distance "I" is approximately 17'-8" and the distance "J" is approximately 1'-7". Again, however, those distances may vary with the lengths and number of mast segments and other components, without departing from the spirit and scope of the present invention.

Figure 33A:
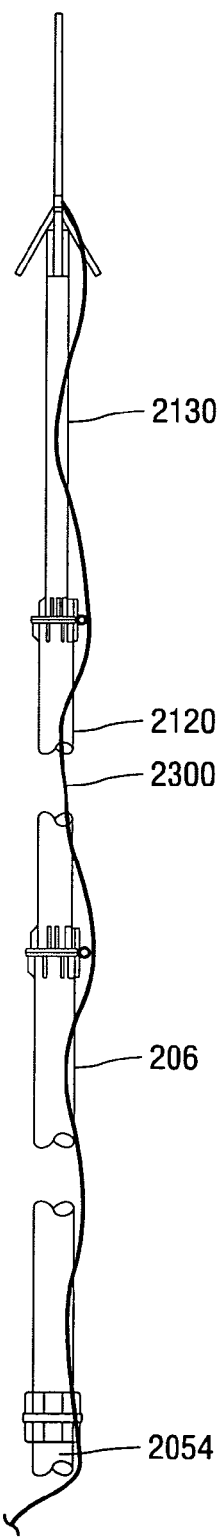
FIG. 33A is a partial view of an articulated antenna mast embodiment of the present invention with a conventional antenna attached to the third mast segment thereof.

As can be seen in FIG. 33A, a conventional antenna 2135 is attached to the uppermost mast segment 2130. The reader will appreciate that the extendable mast embodiments of the subject invention may be successfully employed in connection with a variety of different types of antennas without departing from the spirit and scope of the present invention.

The reader will also appreciate that lightening striking the antenna 2135 and/or the antenna mast 2050 will travel down the antenna mast 2050, into the platform frame 2000, and pass through the leg assemblies 2010 to ground. Any electricity from the lightening strike traveling on the antenna conductor 2300 will be transported onto the shell of the enclosure 20 through the ground conducting capability of the cable entry 400 shown in FIGS. 24, 25 and 29.

Another embodiment of the present invention is depicted in FIGS. 38-42. As can be seen in those Figures this embodiment includes a portable platform 3000 includes an electrically conductive frame 3002 that may be fabricated from, for example, carbon steel, stainless steel, aluminum, and other electrically conductive metal beams, angles, tubing, C-shapes, etc. that may be welded or bolted together. To reduce the weight of the platform 3000, one or more panels 3004 may be supported on the frame 3002 and attached thereto by appropriate fasteners (i.e., screws, bolts, etc.). Panels 3004 may be fabricated from, for example, wood, composite materials, polymer materials, steel, aluminum, etc. Platform 3000 could conceivably be fabricated in a variety of different shapes and sizes and may be provided with a conventional hitch arrangement 3006 that enables the platform 3000 to be towed. If the platform 3000 is to be towed on the highway, the platform 3000 should not exceed the maximum length and width as established by the applicable motor vehicle codes. In one embodiment, for example, the platform 3002 is approximately 80" wide (dimension "K" in FIG. 39) and approximately 18'-9" long (dimension "L" in FIG. 38). However, it may be advantageous to size the platform 3000 such that it is relatively easy to transport with other conventional means, yet provides sufficient deck space to support the desired components and enclosures as will be discussed in further detail below. To facilitate the easy movement and transport of the platform 3000, conventional wheel assemblies 3008 may be attached to the platform 3000 as shown. As indicated above, if it is contemplated that the platform will be towed on the highway, the user should ensure that the platform 3000 complies with the relevant motor vehicle code requirements. For example, the platform may have to be equipped with operable tail lights, license plate holder and lights, reflectors, wheel brakes, etc. In the embodiment depicted in FIG. 39, for example, dimension "M" may be approximately 8'-6".

Figure 38:
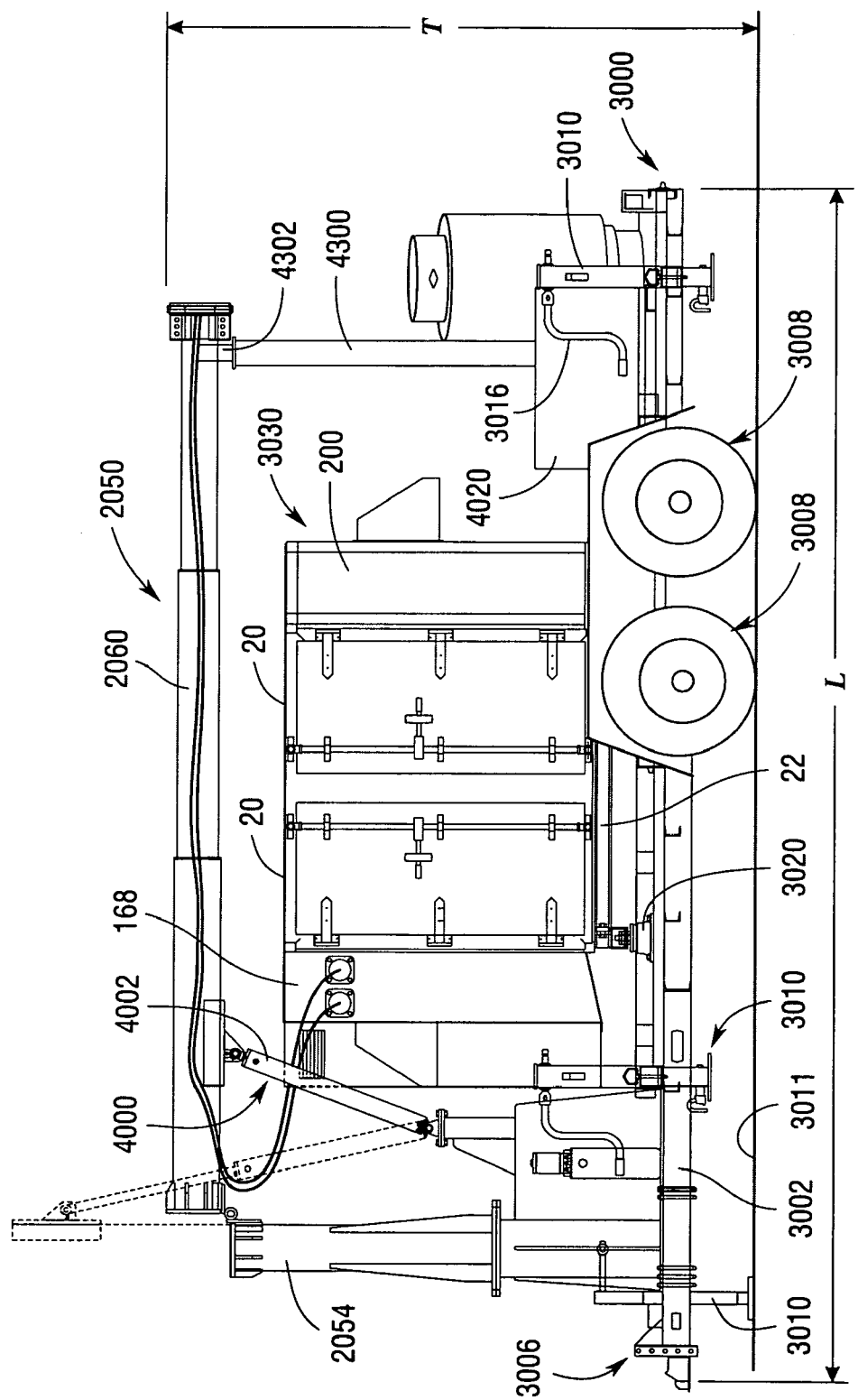
FIG. 38 is a side elevational view of a portable platform and enclosure embodiment of the present invention used in connection with an embodiment of an articulated antenna mast of the present invention.
Figure 39:
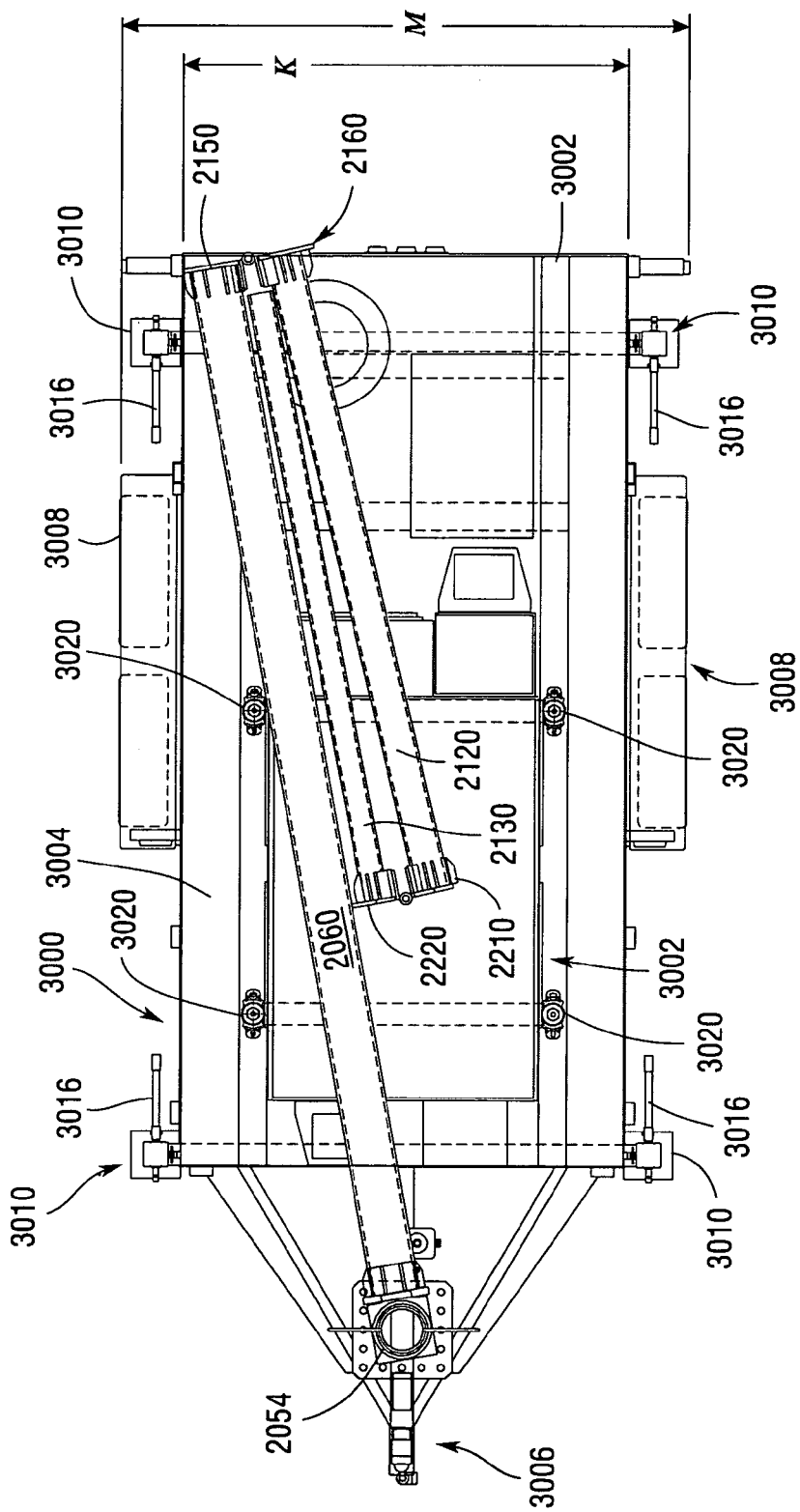
FIG. 39 is a plan view of the portable platform and enclosure embodiment of FIG. 38, with the articulated antenna embodiment in a folded position.

The platform 3000 is equipped with at least four outrigger assembly 3010. The embodiment depicted in FIGS. 38 and 39 is equipped with five outrigger assemblies 3010 to provide stability to the platform 3000 and to form one or more paths for electricity to travel to ground 3011. In one embodiment, the outriggers 3010 are selectively vertically extendable and retractable with corresponding hand cranks 3016. In one embodiment, those leg assemblies or outrigger assemblies manufactured by Ralph K. Bodmann Corporation of 1750 Costner Drive, Unit F, Warrington, Pa. 18976 under product number 182800/015181 may be employed.

Figure 42:
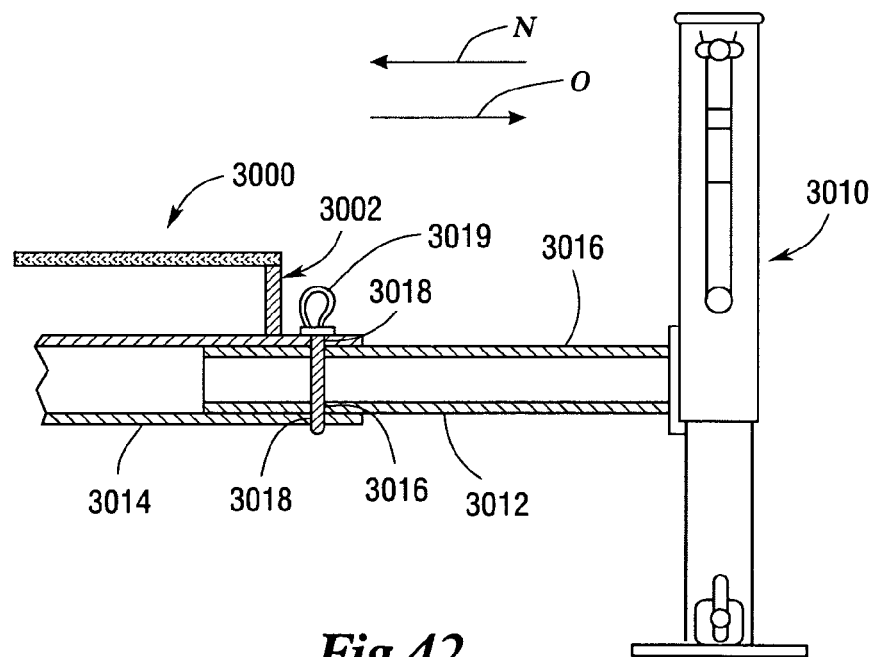
FIG. 42 is a partial view of an outrigger assembly of the present invention in a laterally extended position.

To improve the lateral stability of the platform 3000, in one embodiment, the outriggers 3010 are selectively laterally extendable and retractable with respect to the platform 3000. In particular as can be seen in FIG. 42, the outriggers 3010 may each include a lateral support member 3012 that is sized to be slidably received in a corresponding sleeve or tubing member 3014 attached to the platform frame 3002. In one embodiment, for example, the lateral support member 3012 comprises a piece of square steel tubing that is welded or otherwise attached to the vertical support housing portion 3013 of the outrigger 3010. The end of the lateral support member 3012 is slidably received within a corresponding piece of square steel tubing 3014 welded or otherwise attached to the platform frame 3002 such that it may freely slide therein in the directions represented by arrows "N" and "O" in FIG. 42. The lateral support member 3012 may be provided with one or more holes 3016 therethrough adapted to be aligned with a corresponding holes 3018 in the socket 3014 such that a retaining pin 3019 or retaining bolt may be inserted therethrough to retain the lateral support member 3012 in that position. It will be understood that when the platform 3000 is being towed or otherwise transported, the outriggers 3010 maybe moved inward to the sides of the platform 3000 (see FIG. 39) and the support leg 3015 is cranked into the "up" position and when the platform 3000 has been located in the desired location, the outriggers 3010 may be laterally extended (in the "O" direction) relative to the platform 3000, locked in that lateral position by inserting the retainer pin 3019 or bolt through the aligned holes 3016, 3018 and then cranked down into contact with the ground. When the support legs 3015 of the outriggers 3010 are cranked into contact with the ground, electricity in the platform frame 3002 can pass through the lateral support member 3012, through the outrigger(s) 3010 to the ground. This laterally extending outrigger arrangement could also be successfully employed with the embodiment depicted in FIGS. 31-33.

In this embodiment, any of the enclosures of the type and construction described above may be supported on the platform 3002. For example the enclosure 3030 in FIGS. 38-41 may include two equipment modules 20, one power module 200 and a temperature module 168 that are interconnected and fabricated in the manners described above and include an electrically conductive frame assembly 22. The frame assembly 22 may be attached to the platform frame 3002 by a plurality of shock absorber assemblies 3020. For example, the shock absorber assemblies manufactured by Lord Manufacturing Co. of Erie, Pa. under product name "Shock Mount Assembly" may be successfully employed.

Figure 43:
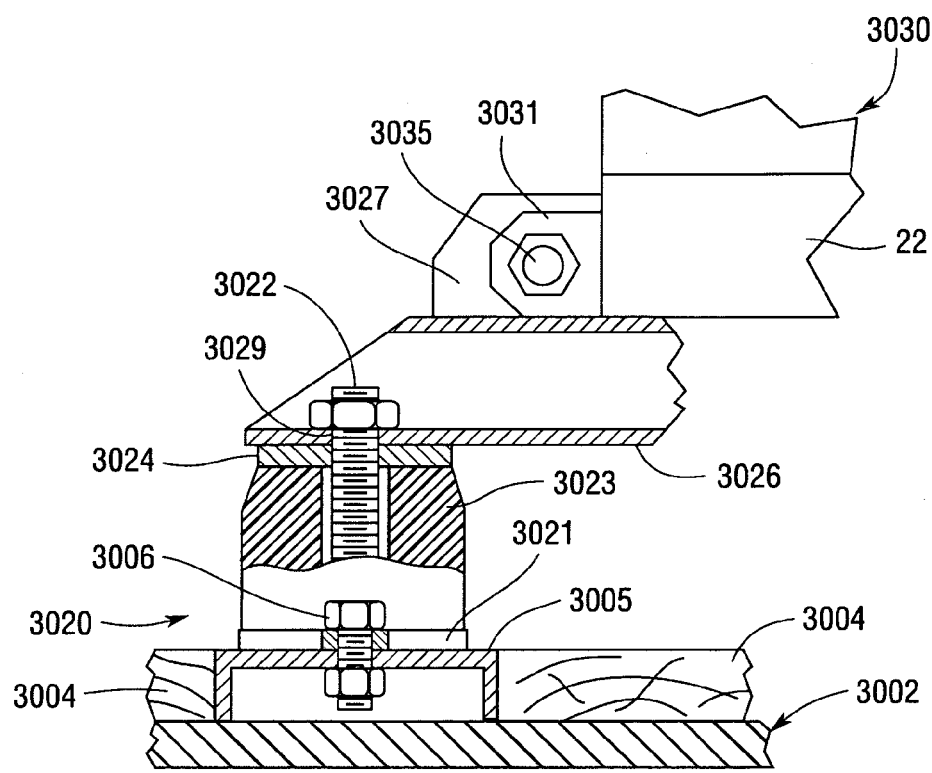
FIG. 43 is a partial cross-sectional view of a shock absorber embodiment of the present invention attaching the frame assembly to the platform frame.
Figure 44:
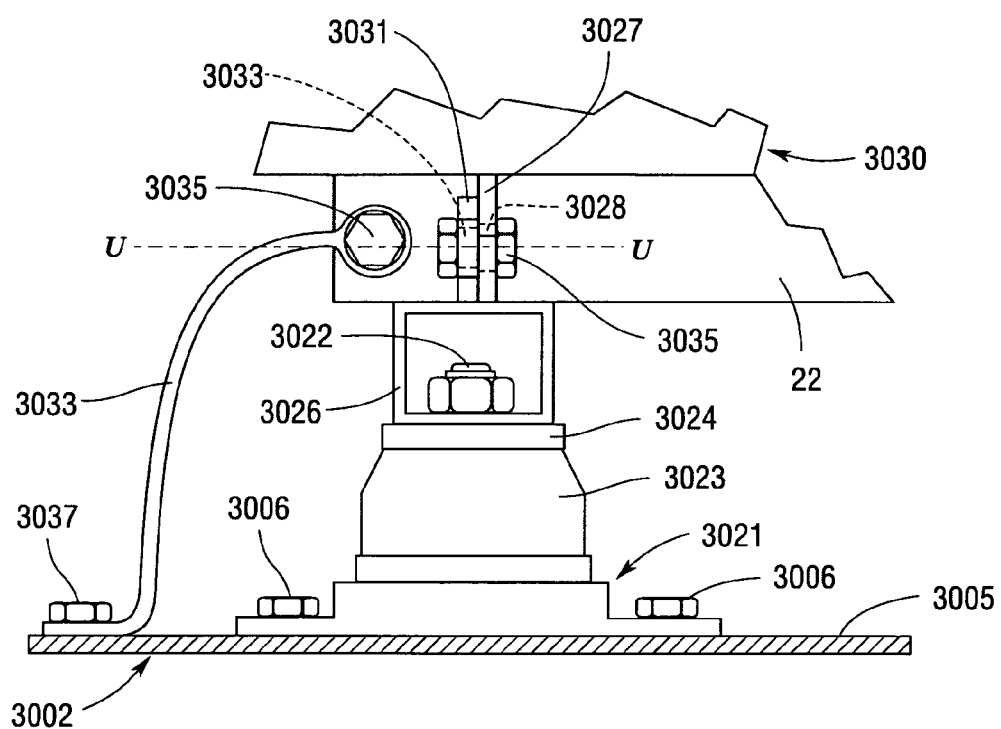
FIG. 44 is a side elevational view of the shock absorber assembly depicted in FIG. 43.

As can be seen in FIG. 43, such shock absorbers 3020 may comprise a metal base 3021 member that may be bolted to a brace 3005 comprising part of the platform frame 3002 by bolts 3006. A bolt 3022 may protrude from the base 3021 and a flexible pad 3023 may be received thereon. A flat washer 3024 is received on the pad 3023. The shock absorber assembly 3020 may be attached to the frame assembly 22 by a corresponding lateral leg 3026 that may be fabricated from, for example, square steel tubing or the like. A hole 3029 is provided through leg 3026 to enable the bolt 3022 to be inserted therethrough to receive a fastener nut thereon. The leg 3026 may have an attachment tab 3027 protruding from its upper surface. Tab 3027 has a pivot hole 3028 that is adapted to align with a pivot hole 3033 in an attachment tab 3031 that is attached to the frame 22. A pivot bolt 3035 is inserted through holes 3028 and 3033 to pivotally couple the frame assembly 22 to the leg 3026 for pivotal travel about axes "U-U". See FIG. 44. The end of the leg 3026 has a hole 3029 therethrough for receiving the attachment bolt 3022 protruding from the shock-absorber base 3021. Appropriately sized nuts are threaded onto bolts 3022, 3035 to couple the leg 3026 to the shock absorber assembly 3020 and pivotally couple the leg 3026 to the frame assembly 22. In the embodiment depicted in FIGS. 38-40, four shock absorber assemblies 3020 are employed to attach the frame assembly 22 to the platform 3000. Other types and numbers of shock absorbing arrangements could be used to couple the frame assembly 22 to the platform 3000. The frame assembly 22 is electrically grounded to the platform frame 3002 by at least one conductor strap 3033 that has one end bolted to the frame assembly 22 by bolt 3035 and the other end thereof bolted to the platform frame member 3005 by bolt 3037. Thus electricity traveling in the frame assembly 22 will be free to travel through the conductor strap(s) 3033 into the platform frame 3002 through outriggers 3010 to ground 3011.

Figure 40:
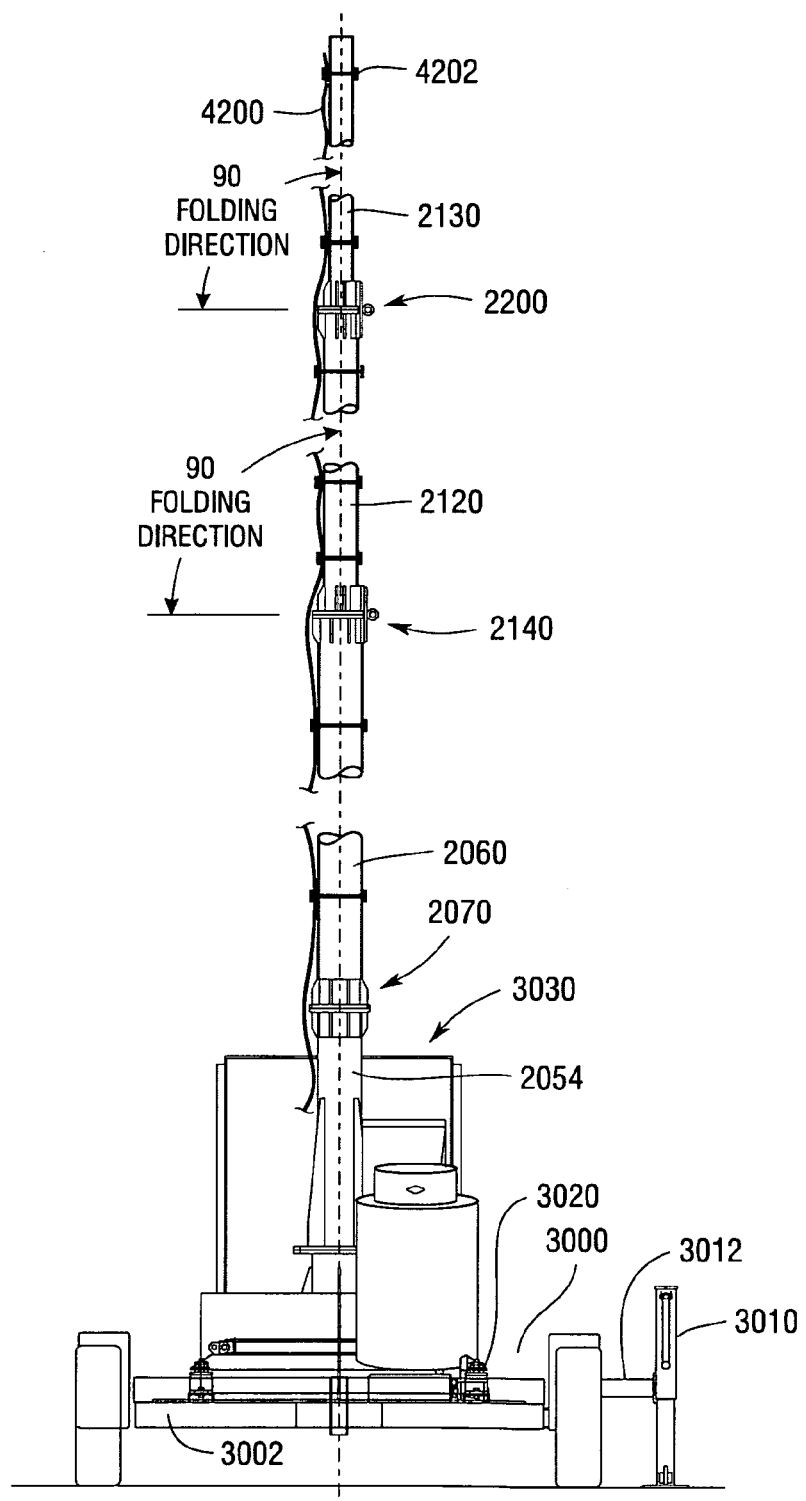
FIG. 40 is an end elevational view of the portable platform and enclosure embodiment of FIGS. 38 and 39 with the articulated antenna embodiment thereof in an extended position.

The embodiment depicted in FIGS. 38-40 may also include a selectively extendable mast 2050 of the type and construction described above. The fastener plate 2056 is attached to the platform frame 3002 by, for example, bolting, welding etc. such that the mast base 2052 is electrically grounded to the platform 3000. In one embodiment, however, an extension device 4000 may be used to move the first mast segment 2060 into coaxial alignment with the mast post 2054 as shown in FIG. 40. In the embodiment depicted in FIG. 38, the extension device 400 comprises an extendable and retractable hydraulic cylinder 4002. Extension device could also conceivable comprise a pneumatically powered extendable and retractable cylinder, a lead screw/stepper motor, etc. The reader will appreciate that the extension device 4000 could also be employed in place of braces in the embodiment depicted in FIGS. 31-33.

Figure 41:
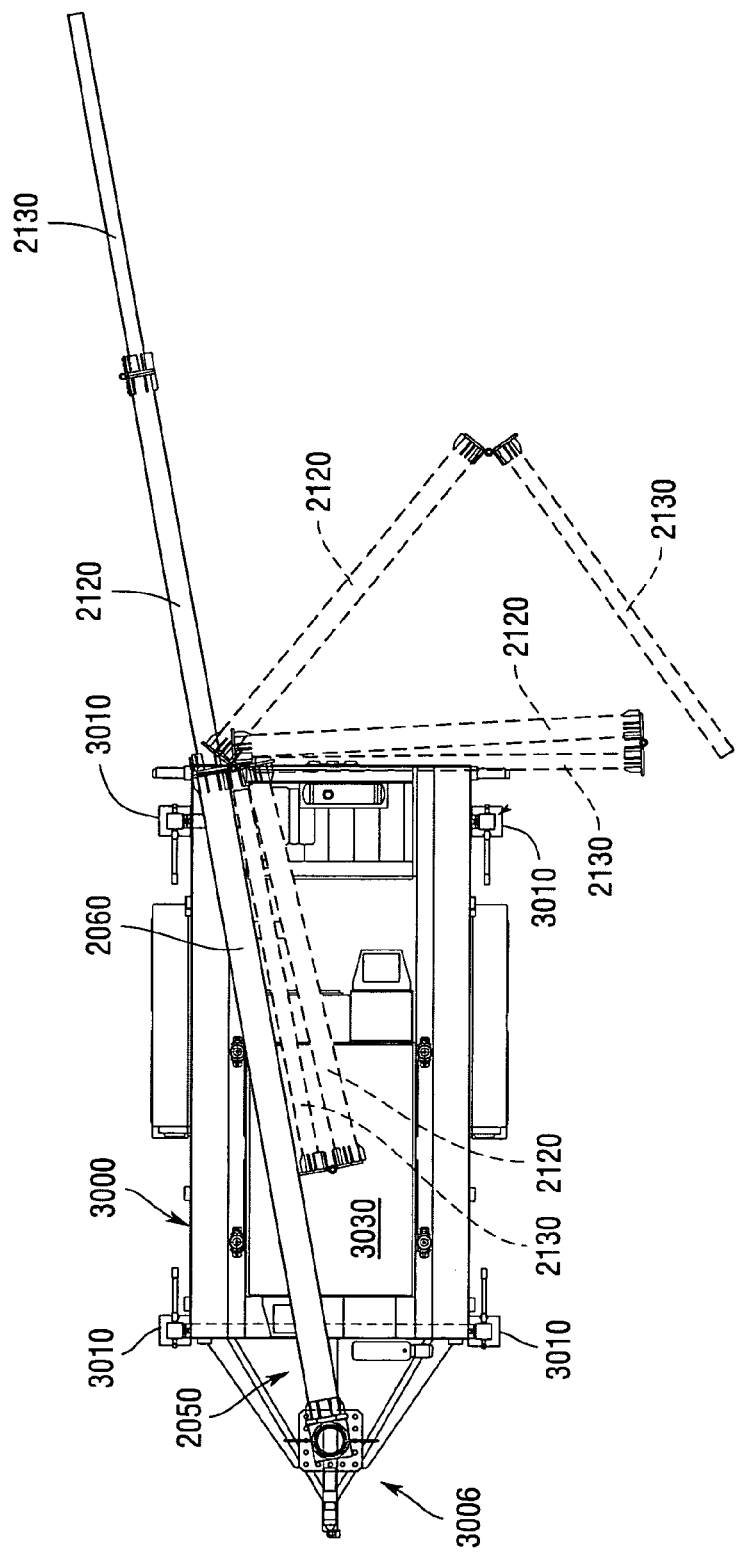
FIG. 41 is another plan view of the portable platform and enclosure embodiment of FIG. 38, showing the articulated antenna in various positions.

To use the extension device 4000, the mast 2050 may be configured in its extended position when the mast segments 2060, 2120, 2130 are substantially parallel to the platform 3000. FIG. 41 illustrates the movement of the mast segments 2060, 2120, 2130 from a first "folded" position wherein the first second and third mast segments 2060, 2120, 2130 are substantially parallel (this would presumably be the position of the mast segments when the platform is being transported or towed) to a partially unfolded second position to a third coaxial position wherein the mast segments 2060, 2120, 2130 are coaxially aligned and the second and third joints 2140, 2200 are locked in position by bolting or otherwise retaining the end of the third and fourth hinge blocks 2150, 2160 together and the fifth and sixth hinge blocks 2210, 2220 together. The actions of folding and coaxially aligning the mast segments 2060, 2120, 2130 may be accomplished manually while the mast segments 2060, 2120, 2130 are relatively parallel with the platform 3000. It is conceivable, however, that the mast segments 2060, 2120, 2130 may be automatically folded and extended through the use of conventional rotary actuators, cylinders, etc.

After the first, second and third mast segments 2060, 2120, 2130 have been coaxially aligned and locked (bolted, pinned, clamped, etc.) in that position (FIG. 34), the extension cylinder or device 4000 may be actuated to lift the extended mast 2050 to the vertical position (FIG. 40) such that the first mast segment 2060 is substantially coaxially aligned with the mast post 2054. The ends of the first and second hinge blocks 2080, 2090 may then be locked together by bolts, clamps, etc. to retain the mast 2050 in that position.

A variety of different types of conventional antennas may be attached to the uppermost mast segment in the manner discussed above and illustrated in FIG. 33A. Appropriate antenna cables or conductors 4200 may be attached to the antenna and attached to the mast by, for example, clamps 4202 or other connectors such as those manufactured by Times Microwave under product numbers LMR 400, LMR, 500, LMR 600, LMR 900 and LMR1200. However, other methods of attaching the antenna conductor 4200 may be employed. The other end of the antenna conductor 4200 extends through the shell wall that is adjacent to the magnetic shield enclosure such that the conductor enters the magnetic shield enclosure and a portion of the conductor exits the magnetic shield enclosure into the shell and be coupled to the equipment within the equipment modules.

The reader will appreciate that lightening striking the antenna and/or antenna mast 2050 will travel down the antenna mast 2050, into the platform frame 3002, and pass through one or more of the extended outriggers 3010 to ground. Any electricity from the lightening strike traveling on the antenna conductor 4200 will be transported onto the shell of the enclosure 20 through the ground conducting capability of the cable entry 400 shown in FIGS. 24, 25 and 29.

When it is desirable to retract the mast 2050, the retainer bolts 2099 (clamps, etc.) used to fasten the first and second hinge blocks 2080, 2090 together are removed to permit the second hinge block 2090 to pivot relative to the first hinge block 2080 about the hinge pin of the first hinge 2100. The cylinder 4002 is retracted to move the mast 2050 to the position wherein the mast segments 2060, 2120, 2130 are parallel to the platform 3000. In one embodiment, an upstanding support post 4300 is attached to the platform frame 3002 and provided with a cradle 4302 for receiving a portion of the first mast segment 2060 therein. See FIG. 38. The retainer bolts 2199 (clamps, etc.) used to bolt the third and fourth hinge blocks 2150, 2160 together are removed to permit the fourth hinge block 2160 to pivot relative to the third hinge block 2150 about the hinge pin of hinge 2170. Likewise the bolts 2234 (clamps, etc.) used to fasten the fifth and sixth hinge blocks 2210, 2220 together are removed to permit the sixth hinge block 2220 to pivot relative to the fifth hinge 2210 block about the hinge pin of hinge 2230. Such articulated mast arrangement permits the first, second and third mast segments 2060, 2120, 2130 to be pivoted to a folded position for travel. See FIG. 39. In one embodiment, the mast segments are clamped together in the travel position with portable nylon straps. When employing portable units that must be transported great distances or deployed, for example by helicopter, the mast segments are bolted or clamped together to prevent the mast segments from inadvertently moving to extended positions.

As can be seen in FIG. 39, when the mast 2050 is in the folded "travel" position, all of the mast segments 2060, 2120, 2130 are substantially entirely received over the platform 3000. If the mast segments 2060, 2120, 2130 are sized relative to the platform 3000 such that they extend beyond the end of the platform 3000 when in the folded travel position, the user should consult the relevant motor vehicle code to ensure that appropriate flags, markers, etc. are attached to the protruding mast segments if required. The user will also appreciate that the mast post 2054 may be provided in various lengths depending upon the length of the mast 2050 desired. If the platform 3000 is to be towed on highways, however, the mast post 2054 should be sized such that when the mast 2050 is in the folded position, the height from the highway (distance "T" in FIG. 38) does not exceed the maximum allowed height as established in the applicable motor vehicle code and related laws. For example, in one embodiment, the distance "T" is approximately 9'.

The reader will appreciate that a variety of different pieces of equipment may be supported on the platform 3000. For example, in the embodiment depicted in FIGS. 38 and 39, a power generator 4020 is attached to the platform 3000. The generator 4020 may be powered by propane, gasoline, etc. and provide electrical power for the air conditioners, electrical components, etc. housed within the equipment modules and also power the hydraulic cylinder 4002 used to extend and retract the mast 2050. Other forms of power generator or power storage means such as fuel cells, solar panels, batteries etc. may also be mounted to the platform 3000.

The extendable and retractable mast 2050 has been disclosed herein as comprising three mast segments that are hinged to an upstanding mast post in articulated fashion. It is conceivable that other numbers of mast segments may be employed without departing from the spirit and scope of the present invention. The articulated mast embodiments of the present invention are generally more stable and able to handle greater wind loads and pass lightening strikes when extended when compared to similarly sized telescoping antennas and masts. The portable platform and mast arrangements in combination with the various shielded enclosures of the present invention provide the ability protect communication equipment and other devices that are susceptible to lightning strike damage in remote locations.

Accordingly, the present invention provides solutions to the aforementioned problems and others associated with protecting electrical components from damage caused by lightning strikes or externally generated magnetic fields resulting from adjacent equipment or sabotage. The present invention also provides a means for protecting a plurality of electrical components located at a remote site from lightning damage, corrosion, insect and vermin damage, etc. The present invention also provides articulated masts that can be easily grounded and can generally withstand the elements better than prior antenna arrangements of comparable size. It will be understood, however, that various changes in the details, materials and arrangements of parts which have been herein described and illustrated in order to explain the nature of the invention may be made by those skilled in the art within the principle and scope of the invention as expressed in the claims appended hereto or hereafter added.

Whereas particular embodiments of the invention have been described herein for the purpose of illustrating the invention and not for the purpose of limiting the same, it will be appreciated by those of ordinary skill in the art that numerous variations of the details, materials and arrangement of parts may be made within the principle and scope of the invention without departing from the spirit invention. The preceding description, therefore, is not meant to limit the scope of the invention. Rather the scope of the invention is to be determined only by the claims and their equivalents.

What is claimed is:

1. A communications assembly, comprising:
   an electrically groundable platform;
   a shell supported on said platform and being electrically grounded thereto, said shell having a plurality of exterior wall portions fabricated from electrically conductive material;
   an enclosure having a common exterior wall portion with said shell and being attached thereto, said common exterior wall portion being lined with a magnetic shield material;
   at least one power supply cable entering said enclosure through said common exterior wall portion and said magnetic shield material; and
   an articulated communications mast comprising:
      a base member supported on said platform; and
      at least two rigid mast segments pivotally interconnected in series and being supported by said base member, and wherein at least two of said pivotally interconnected mast segments are selectively pivotable relative to each other between positions wherein said at least two pivotally interconnected mast segments are coaxially aligned with each other and other positions wherein said at least two pivotably mast segments are not coaxially aligned relative to each other.

2. The communications assembly of claim 1 wherein said shell is attached to said electrically groundable platform by at least one shock absorbing mount and at least one grounding conductor.

3. The communications assembly of claim 2 wherein at least one shock-absorbing mount comprises:
   a support base coupled to said platform, said support base having an attachment member protruding therefrom for attachment to said shell; and
   a flexible member between said support base and said shell.

4. The communications assembly of claim 3 further comprising a leg corresponding to each said shock absorbing mount and coupled to said attachment member such that said flexible member is between said leg and said support base, said leg being coupled to said shell.

5. The communications assembly of claim 4 wherein each said leg is pivotably coupled to said shell.

6. The communications assembly of claim 1 wherein said electrically groundable platform comprises:
   an electrically conductive frame;
   a plurality of wheels mounted to said electrically conductive frame; and
   at least one electrically conductive outrigger assembly coupled to said electrically conductive frame and selectively movable between a grounding position and a non-grounding position.

7. The communications assembly of claim 6 wherein said at least one said outrigger assembly is selectively laterally extendable and retractable relative to said electrically conductive frame.

8. The communications assembly of claim 7 wherein said outrigger assembly comprises:
   a vertical support housing having a selectively extendable and retractable support leg therein; and
   a lateral support member telescopingly received in a corresponding portion of said electrically conductive frame and coupled to said vertical support member such that said vertically support member can be selectively laterally extended and retracted relative to said electrically conductive frame.

9. The communications assembly of claim 8 wherein said selectively extendable and retractable support leg may be selectively extended and retracted relative to the vertical support housing by a crank assembly.

10. The communications assembly of claim 6 wherein said electrically conductive frame supports at least one floor panel thereon.

11. The communications assembly of claim 10 wherein at least one said floor panel is fabricated from wood.

12. The communications assembly of claim 1 wherein said articulated mast is electrically grounded to said platform.

13. The communications assembly of claim 1 further comprising power generating means on said platform.

14. The communications assembly of claim 13 wherein said power generating means at least comprises at least one battery.

15. The communications assembly of claim 13 wherein said power generating means at least comprises a generator, at least one solar panel or at least one fuel cell.

16. The communications assembly of claim 15 wherein said generator is propane powered.

17. The communications assembly of claim 15 wherein said generator is gasoline powered.

18. The communications assembly of claim 1 wherein an antenna conductor is supported on said articulated communications mast, said antenna conductor entering said enclosure through said common exterior wall portion and said magnetic shield material.

19. An articulated mast for supporting a weight of at least one object vertically above a surface, said articulated mast comprising:
an upstanding load bearing base member configured to be supported on a surface;
a first rigid, load bearing mast segment having one end thereof pivotally coupled to said base member by a first joint assembly configured to distribute a load experienced by said first mast segment to said base member, said first joint assembly including at least one first load distribution member attached to an end of said base member, said at least one first load distribution member having a first perimeter that is at least as large as a perimeter of one end of said first rigid mast segment, said first rigid mast segment being selectively movable back and forth between an initial folded position and an extended position wherein said first mast segment is coaxially aligned with a portion of said base member; and
a second rigid, load bearing mast segment having a second end pivotally interconnected to another end of said first rigid mast segment by a second joint assembly configured to distribute other load experienced by said second mast segment to said first rigid mast segment, said second joint assembly including at least one second load distribution member attached to said another end of said first rigid mast segment, said at least one second load distribution member having a second perimeter that is at least as large as a perimeter of said one end of said second rigid mast segment and wherein said first and second rigid mast segments are selectively pivotable relative to each other back and forth between an initial folded position wherein said second rigid-mast segment is adjacent to said first rigid mast segment and a second extended position wherein said second rigid mast segment is coaxially aligned with said first rigid mast segment to transfer the weight of the at least one object to said upstanding base member.

20. The articulated mast of claim 19 further comprising means for pivoting said first mast segment between said position wherein said first mast segment is coaxially aligned with said portion of said base member and other positions wherein said first mast segment is not coaxially aligned with said base member.

21. The articulated mast of claim 20 wherein said means for pivoting comprises a device selected from the group of devices consisting of a hydraulic cylinder, a pneumatic cylinder, and a stepper motor.

22. An articulated mast, comprising:
a base member;
a first rigid mast segment pivotally coupled to said base member and being selectively movable between a position wherein said first mast segment is coaxially aligned with a portion of said base member and other positions wherein said first mast segment is not coaxially aligned with said base member;
a second rigid mast segment pivotally interconnected to said first rigid mast segment wherein said first and second rigid mast segments are selectively pivotable relative to each other between positions wherein said first and second rigid mast segments are coaxially aligned with each other and other positions wherein said first and second rigid mast segments are not coaxially aligned relative to each other;
an apparatus for housing electrically powered components supported on said base member, said apparatus comprising:
an electrically groundable platform having a plurality of legs attached thereto;
a shell supported on said electrically groundable platform and being electrically grounded thereto, said shell having a plurality of exterior wall portions and housing the electrically powered components therein, said shell fabricated from electrically conductive material;
an enclosure having a common exterior wall portion with said shell and being attached thereto, said common exterior wall portion being lined with a magnetic shield material; and
at least one power supply cable entering said enclosure through said common exterior wall portion and said magnetic shield material.

23. The articulated mast of claim 22 wherein said legs comprise leg assemblies that are selectively extendable and retractable.

24. The articulated mast of claim 23 wherein at least one said leg is selectively laterally extendable and retractable relative to said electrically groundable platform.

25. The articulated mast of claim 24 wherein each said leg assembly comprises:
a vertical support housing having a selectively extendable and retractable support leg therein; and
a lateral support member telescopingly received in a corresponding portion of said electrically groundable platform and coupled to said vertical support member such that said vertically support member can be selectively laterally extended and retracted relative to said electrically groundable platform.

26. The articulated mast of claim 25 wherein said selectively extendable and retractable support leg may be selectively extended and retracted relative to the vertical support housing by a crank assembly.

27. The articulated mast of claim 22 wherein said electrically groundable platform comprises an electrically conductive frame.

28. The articulated mast of claim 22 wherein said electrically conductive frame supports at least one floor panel thereon.

29. The articulated mast of claim 28 wherein at least one said floor panel is fabricated from wood.

30. An articulated communications mast, comprising:
a plurality of rigid mast segments wherein at least two said mast segments are interconnected in series and are selectively movable relative to each other between positions wherein said at least two mast segments are coaxially aligned with each other in serial fashion and other positions wherein said at least two mast segments are not coaxially aligned relative to each other;
at least one communication signal device supported by at least one of said mast segments; and
at least one conductor operably coupling said communication signal device to electronic equipment housed within a shell, said at least one conductor passing into a magnetic shield enclosure coupled to said shell.

31. The articulated communications mast of claim 30 wherein at least one of said at least one communication signal devices comprises an antenna.

32. The articulated communications mast of claim 30 wherein one of said plurality of said mast segments is attached to a base member.

33. The articulated communications mast of claim 30 wherein said plurality of mast segments are movable from a position wherein said mast segments extend vertically from said base member in a coaxially aligned end-to-end orientation to said position wherein said at least two mast segments are not coaxially aligned in a folded position.

34. The articulated communications mast of claim 30 wherein said plurality of mast segments are supported on a platform and are movable from a position wherein said mast segments extend vertically from said platform in a coaxially aligned end-to-end orientation to said position wherein said at least two mast segments are not coaxially aligned in a folded position.

35. The articulated communications mast of claim 34 wherein when said mast segments are in said folded position, none of the mast segments extend laterally beyond a perimeter of said platform.

36. The articulated mast of claim 34 wherein said platform is electrically grounded.

37. The articulated mast of claim 36 wherein said platform is mounted on wheels and has at least two selectively extendable outriggers operably coupled thereto.

38. The articulated communications mast of claim 30 wherein at least two said mast segments are movably interconnected by an actuator for moving said at least two mast segments between said position wherein said at least two mast segments are coaxially aligned with each other and said other positions wherein said at least two mast segments are not coaxially aligned relative to each other.

39. The articulated communications mast of claim 38 wherein said actuator is selected from the group of actuators comprising: a hydraulic cylinder, a pneumatic cylinder, and a lead screw/stepper motor.

40. An articulated communications mast, comprising:
   an upstanding rigid load bearing base member configured to be supported on a surface;
   a first load bearing mast segment having a first end coupled to said base member by a first joint assembly including at least one first load distribution member attached to an end of said base member, said at least one first load distribution member having a first perimeter that is at least as large as a perimeter of one end of said first mast segment;
   a second load bearing mast segment having a first end movably coupled to a second end of said first mast segment by a second joint assembly including at least one second load distribution member attached to said second end of said first mast segment wherein said at least one second load distribution member has a second perimeter that is at least as large as a perimeter of said second end of said first mast segment;
   a third load bearing mast segment having a first end movably coupled to a second end of said second mast segment by a third joint assembly including at least one third load distribution member attached to said second end of said second mast segment wherein said at least one third load distribution member has a third perimeter that is at least as large as a perimeter of said second end of said second mast segment, said first, second and third mast segments being selectively movable relative to each other back and forth between positions wherein said first, second and third mast segments are coaxially aligned with each other in serial fashion and other positions wherein said first second and third mast segments are not coaxially aligned relative to each other; and
   at least one communication signal device supported by at least one of said first, second and third mast segments, such that a weight thereof gets transmitted to said upstanding rigid base member when said first, second and third mast segments are coaxially aligned with said upstanding base member.

41. The articulated communications mast of claim 40 wherein said base member comprises a mast post and wherein said first end of said first mast segment is movably attached to an end of said mast post.

42. The articulated communications mast of claim 40 wherein said base member is supported on an apparatus for housing electrically powered components comprising:
   an electrically groundable portable platform;
   a shell supported on said portable platform and being electrically grounded thereto, said shell having a plurality of exterior wall portions and housing the electrically powered components therein, said shell fabricated from electrically conductive material;
   an enclosure having a common exterior wall portion with said shell and being attached thereto, said common exterior wall portion being lined with a magnetic shield material; and
   at least one power supply cable entering said enclosure through said common exterior wall portion and said magnetic shield material.

43. The articulated communications mast of claim 42 wherein said shell is attached to said portable groundable platform by at least one shock absorbing mount and at least one grounding conductor.

44. The articulated communications mast of claim 43 wherein at least one shock-absorbing mount comprises:
   a support base coupled to said portable platform, said support base having an attachment member protruding therefrom for attachment to said shell; and
   a flexible member between said support base and said shell.

45. The articulated communications mast of claim 44 further comprising a leg corresponding to each said shock absorbing mount and coupled to said attachment member such that said flexible member is between said leg and said support base, said leg being coupled to said shell.

46. The articulated communications mast of claim 45 wherein each said leg is pivotably coupled to said shell.

47. The articulated communications mast of claim 42 wherein said portable platform comprises:
   an electrically conductive frame;
   a plurality of wheels mounted to said electrically conductive frame; and
   at least one electrically conductive outrigger assembly coupled to said electrically conductive frame and selectively movable between a grounding position and a non-grounding position.

48. The articulated communications mast of claim 47 wherein said at least one said outrigger assembly is selectively laterally extendable and retractable relative to said electrically conductive frame.

49. The articulated communications mast of claim 48 wherein said outrigger assembly comprises:
   a vertical support housing having a selectively extendable and retractable support leg therein; and
   a lateral support member telescopingly received in a corresponding portion of said electrically conductive frame and coupled to said vertical support member such that said vertically support member can be selectively laterally extended and retracted relative to said electrically conductive frame.

50. The articulated communications mast of claim 49 wherein said selectively extendable and retractable support leg may be selectively extended and retracted relative to the vertical support housing by a crank assembly.

51. The articulated communications mast of claim 47 wherein said electrically conductive frame supports at least one floor panel thereon.

52. The articulated communications mast of claim 51 wherein at least one said floor panel is fabricated from wood.

53. The articulated communications mast of claim 47 wherein said articulated mast is electrically grounded to said portable platform.

54. The articulated communications mast of claim 47 further comprising power generating means on said portable platform.

55. The articulated communications mast of claim 47 wherein an antenna conductor is supported on said articulated mast, said antenna conductor entering said enclosure through said common exterior wall portion and said magnetic shield material.

56. An articulated mast, comprising:
a mast post;
a first hinge block having a mast socket therein for receiving an end of said mast post therein, said first hinge block further comprising a first hinge assembly mounting portion adjacent said mast socket;
a first rigid mast segment;
a second hinge block having a first socket therein sized to receive an end of said first rigid mast segment therein, said second hinge block further comprising a second hinge assembly mounting portion adjacent said first socket;
a hinge assembly mounted to said first and second hinge assembly mounting portions to enable said first rigid mast segment to be selectively movable between a position wherein said first rigid mast segment is coaxially aligned with a portion of said mast post and other positions wherein said first rigid mast segment is not coaxially aligned with said mast post and such that when said first rigid mast segment is coaxially aligned with said mast post, an end of said first hinge block is in confronting relationship with an end of said second hinge block; and
a second rigid mast segment pivotally interconnected to said first rigid mast segment wherein said first and second rigid mast segments are selectively pivotable relative to each other between positions wherein said first and second rigid mast segments are coaxially aligned with each other and other positions wherein said first and second rigid mast segments are not coaxially aligned relative to each other.

57. The articulated mast of claim 56 further comprising means for pivoting said first mast segment between said position wherein said first mast segment is coaxially aligned with said portion of said base member and other positions wherein said first mast segment is not coaxially aligned with said mast post.

58. The articulated mast of claim 57 wherein said means for pivoting comprises a device selected from the group of devices consisting of a hydraulic cylinder, a pneumatic cylinder, and a stepper motor.

59. The articulated mast of claim 56 further comprising first releasable retaining means for selectively retaining said end of said first hinge block in confronting relationship with said end of said second hinge block.

60. The articulated mast of claim 59 wherein said first releasable retaining means comprises apparatus selected from the group consisting of bolts, pins and clamps.

61. The articulated mast of claim 56 wherein said first and second hinge blocks are fabricated or cast metal.

62. The articulated mast of claim 56 wherein said first and second hinge blocks are fabricated from metal and are of welded construction.

63. An articulated communications mast, comprising:
a base member supported on an apparatus for housing electrically powered components comprising:
an electrically groundable portable platform;
a shell supported on said portable platform and being electrically grounded thereto, said shell having a plurality of exterior wall portions and housing the electrically powered components therein, said shell fabricated from electrically conductive material;
an enclosure having a common exterior wall portion with said shell and being attached thereto, said common exterior wall portion being lined with a magnetic shield material; and
at least one power supply cable entering said enclosure through said common exterior wall portion and said magnetic shield material, said articulated communications mast further comprising:
a first mast segment having a first end coupled to said base member;
a second mast segment having a first end movably coupled to a second end of said first mast segment;
a third mast segment having a first end movably coupled to a second end of said second mast segment, said first, second and third mast segments being selectively movable relative to each other between positions wherein said first, second and third mast segments are coaxially aligned with each other in serial fashion and other positions wherein said first second and third mast segments are not coaxially aligned relative to each other; and
at least one communication signal device supported by at least one of said first, second and third mast segments.

64. An articulated mast for supporting a weight of at least one object vertically above a surface, said articulated mast comprising:
an upstanding load bearing mast post configured to be supported on a surface;
a first hinge block having a mast socket for receiving an end of said mast post therein, said first hinge block having a first hinge assembly mounting portion;
a second hinge block having a first socket therein and a second hinge assembly mounting portion thereon adjacent said first socket;
a hinge assembly mounted to said first and second hinge assembly mounting portions;
a first rigid load bearing mast segment extending from said first socket in said second hinge block such that said first mast segment is selectively movable back and forth between an initial folded position and an extended position wherein said first mast segment is coaxially aligned with a portion of said mast post; and
a second rigid, load bearing mast segment pivotally interconnected to said first rigid mast segment wherein said first and second rigid mast segments are selectively pivotable relative to each other back and forth between an initial folded position wherein said second rigid-mast segment is adjacent to said first rigid mast segment and a second extended position wherein said second rigid mast segment is coaxially aligned with said first rigid mast segment to transfer the weight of the at least one object to said upstanding base member.

65. The articulated mast of claim 64 further comprising means for pivoting said first mast segment between said position wherein said first mast segment is coaxially aligned with said portion of said mast post and other positions wherein said first mast segment is not coaxially aligned with said mast post.

66. The articulated mast of claim 65 wherein said means for pivoting comprises a device selected from the group of devices consisting of a hydraulic cylinder, a pneumatic cylinder, and a stepper motor.

67. The articulated mast of claim 64 further comprising first releasable retaining means for selectively retaining said end of said first hinge block in confronting relationship with said end of said second hinge block.

68. The articulated mast of claim 67 wherein said first releasable retaining means comprises apparatus selected from the group consisting of bolts, pins and clamps.

69. The articulated mast of claim 64 wherein said first and second hinge blocks are fabricated from cast metal.

70. The articulated mast of claim 64 wherein said first and second hinge blocks are fabricated from metal and are of welded construction.

71. The articulated mast of claim 64 wherein said second mast segment is pivotally coupled to said end of said first mast segment by a joint assembly comprising:
 a hinge block coupled to the end of said first mast segment; and
 another hinge block pivotally hinged to said hinge block and coupled to an end of said second mast segment.

72. The articulated mast of claim 64 further comprising a third mast segment pivotally coupled to an end of said second mast segment.

73. The articulated mast of claim 72 wherein said third mast segment is pivotally coupled to said second mast segment by a third joint assembly comprising:
 a fifth hinge block coupled to another end of said second mast segment; and
 a sixth hinge block pivotally hinged to said second hinge block and coupled to an end of said third mast segment.

74. The articulated mast of claim 73 wherein said second mast segment is selectively pivotable relative to said first mast segment from a position wherein said second mast segment is adjacent to said first mast segment and another position wherein said second mast segment is coaxially aligned with said first mast segment.

75. The articulated mast of claim 74 wherein said third mast segment is selectively pivotable between a position wherein said third mast segment is adjacent said second mast segment and another position wherein said third mast segment is coaxially aligned with said second mast segment.

76. The articulated mast of claim 72 wherein said second mast segment is selectively pivotable relative to said first mast segment from a position wherein said second mast segment is coaxially aligned with said first mast segment and another position wherein said second mast segment is adjacent said third mast segment.

77. The articulated mast of claim 76 wherein said third mast segment is selectively pivotable between a position wherein said third mast segment is coaxially aligned with said second mast segment and another position wherein said third mast segment is between said first mast segment and said second mast segment.

78. The articulated mast of claim 72 further comprising an antenna supported by said third mast segment.

* * * * *